(12) United States Patent
Ohtani et al.

(10) Patent No.: US 6,421,286 B1
(45) Date of Patent: Jul. 16, 2002

(54) SEMICONDUCTOR INTEGRATED CIRCUIT DEVICE CAPABLE OF SELF-ANALYZING REDUNDANCY REPLACEMENT ADAPTING TO CAPACITIES OF PLURAL MEMORY CIRCUITS INTEGRATED THEREIN

(75) Inventors: Jun Ohtani; Tsukasa Ooishi; Hideto Hidaka; Tomoya Kawagoe, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/978,819

(22) Filed: Oct. 18, 2001

(30) Foreign Application Priority Data

Feb. 14, 2001 (JP) ........................................ 2001-037267
May 22, 2001 (JP) ........................................ 2001-152147

(51) Int. Cl.$^7$ ................................................. G11C 7/00
(52) U.S. Cl. .................. 365/200; 365/201; 365/189.01; 365/189.07
(58) Field of Search ............................. 365/200, 201, 365/189.01, 189.07

(56) References Cited

U.S. PATENT DOCUMENTS

| | | | |
|---|---|---|---|
| 4,942,556 A | * | 7/1990 | Sasaki et al. ............... 365/200 |
| 5,764,577 A | * | 6/1998 | Johnston et al. ............ 365/200 |
| 5,841,711 A | * | 11/1998 | Watanabe .................. 365/200 |
| 6,243,307 B1 | | 6/2001 | Kawagoe .................... 365/201 |
| 6,297,997 B1 | * | 10/2001 | Ohtani et al. ............... 365/201 |
| 6,310,807 B1 | * | 10/2001 | Ooishi et al. ............... 365/200 |

FOREIGN PATENT DOCUMENTS

| | | |
|---|---|---|
| JP | 8-63996 | 3/1996 |
| JP | 11-16390 | 1/1999 |
| JP | 2001-6387 | 1/2001 |

OTHER PUBLICATIONS

Tomoya Kawagoe, et al., A Built–In Self–Repair Analyzer (CRESTA) for embedded DRAM's, International Test Conference 2000, pp. 567–574.
United States Patent Application No. 09/793,612, Filed Feb. 27, 2001, Attorney Docket No. 57454–018.

* cited by examiner

Primary Examiner—Richard Elms
Assistant Examiner—Tuan T. Nguyen
(74) Attorney, Agent, or Firm—McDermott, Will & Emery

(57) ABSTRACT

Built-in self-test circuit and built-in redundancy analysis circuit are provided commonly to plural DRAM cores. Built-in redundancy analysis circuit determines a defective address to be replaced with one of plural spare memory cell rows and plural spare memory cell columns according to an address signal and a detection result of a defective memory cell from built-in self-test circuit. Built-in redundancy analysis circuit controls an effective service area of an address storage circuit into which a defective address is stored according to a capacity of a DRAM core to be tested.

16 Claims, 42 Drawing Sheets

FIG.5

| DEFECTIVE BIT | 1 | 2 | 3 | 4 | 5 | 6 | 7 | 8 | DETERMINATION |
|---|---|---|---|---|---|---|---|---|---|
| RRCC | Ra | Ra | Rb | Rb | Ca | Cb | × | — | N.G. |
| RCRC | Ra | Ra | Ca | Rb | Cb | × | — | — | N.G. |
| RCCR | Ra | Ra | Ca | Cb | Rb | Rb | Ca | Cb | O.K. |
| CCRR | Ca | Cb | Ra | Ra | Rb | Rb | × | — | N.G. |
| CRCR | Ca | Ra | Cb | Rb | × | — | — | — | N.G. |
| CRRC | Ca | Ra | Rb | Rb | Cb | × | — | — | N.G. |

SAVING SOLUTION

☒ CONTACT HOLE
▨ FIRST LAYER POLYSILICON
▧ SECOND LAYER POLYSILICON
▱ ACTIVE LAYER
▨ FIRST LAYER METAL WIRING
▨ SECOND LAYER METAL WIRING

☒ CONTACT HOLE
▨ FIRST LAYER POLYSILICON
▧ SECOND LAYER POLYSILICON
▱ ACTIVE LAYER
▨ FIRST LAYER METAL WIRING
▨ SECOND LAYER METAL WIRING

SEMICONDUCTOR INTEGRATED CIRCUIT DEVICE CAPABLE OF SELF-ANALYZING REDUNDANCY REPLACEMENT ADAPTING TO CAPACITIES OF PLURAL MEMORY CIRCUITS INTEGRATED THEREIN

BACKGROUND OF THE INVENTION

1. Field of the Invention

The present invention relates to a semiconductor integrated circuit device, and particularly, to a configuration of a semiconductor integrated circuit device integrated with a test circuit for performing a test thereon.

2. Description of the Background Art

Most of semiconductor memory devices have spare memory cells and in a case where a defective memory cell exists in a part of normal memory cells, the defective memory cell can be replaced with a spare memory cell to save a defective chip.

On the other hand, in a field where especially high speed data processing such as image processing is requested, a semiconductor memory device and a logic circuit for performing an operation on data stored in the semiconductor memory device have been integrated on the same chip. This is because, in this configuration, a circuit portion of a semiconductor memory device, for example a dynamic random access memory (the dynamic random access memory is hereinafter referred to as a DRAM and the circuit portion thereof is hereinafter referred to as a DRAM core) and a logic circuit are connected by a bus with a large width therebetween and both circuits are arranged adjacent to each other, thereby, enabling data supplying/receiving to be performed at high speed to realize higher speed operation.

FIG. 43 is a schematic block diagram for describing a test operation on a semiconductor integrated circuit device 8000 integrated with a DRAM core 8010 and a logic circuit 8020.

Referring to FIG. 43, in a semiconductor integrated circuit device 8000, there is further provided a tester interface section 8030 supplying/receiving of data between DRAM core 8010 and an external tester 8100 in order that a test for detecting a defective bit in a DRAM core is performed with external tester 8100.

It is assumed that DRAM core 8010 and tester interface section 8030 integrated on semiconductor integrated circuit device 8000 are connected therebetween, for example, by an internal data bus having a 256 bit width. On the other hand, tester interface section 8030 and external tester 8100 are connected therebetween, for example, by an external data bus having an 8 bit width.

While in the interior of the chip, it is easy to increase a bus width of the internal data bus, that is the number of I/O, on the other hand a width of the external bus cannot be increased unlimitedly since the width relates to the number of pads and therefore, the number of pins for connecting semiconductor integrated circuit device 8000 with an external circuit.

Therefore, in a case where an analysis on a detective bit in DRAM core 8010 is performed with an external tester, it is required that the test is performed through an external data bus having a small width, having resulted in a problem of increase in a test time.

External tester 8100 sequentially performs writes of test data into memory cells in DRAM core 8010 through such a tester interface section 8030. Furthermore, external tester 8100 sequentially performs reads of data from DRAM core 8000 through tester interface section 8030 to test the presence or absence of a defective bit based on a comparison result between read data and an expected value of the read data.

Therefore, in order to perform the test on DRAM core 8010 at high speed, external tester 8100 is also required to be adapted to an operating speed of DRAM core 8010 operating at high speed, thereby also having lead to a problem of increase in a cost of the external tester, itself. In external tester 8100, a redundancy analysis is performed on what replacement process with combinations of redundant memory cell columns and redundant memory cell rows provided in DRAM core 8010 can realize saving on a detective bit that has been detected as described.

FIG. 44 is a schematic block diagram for describing a configuration of a semiconductor integrated circuit device 8200 integrated with a built-in self-test/redundancy saving analysis section 8230 in order to solve the problem in a test operation on DRAM core 8010 of semiconductor integrated circuit device 8000 in FIG. 43. A built-in self-test is hereinafter also abbreviated as "BIST".

Semiconductor integrated circuit device 8200 includes: a DRAM core 8210, a logic circuit 8220 for performing a logic operation on data stored in DRAM core 8210; and built-in self-test/redundancy saving analysis section 8230 for detecting defective bits in DRAM core 8210 to analyze on what replacement process with combinations of redundant memory cell rows and redundant memory cell columns in DRAM core 8210 should be applied A configuration of such a built-in self-test/redundancy saving analysis section 8230 is disclosed in, for example, Japanese Patent Laying-Open No. 2001-6387 or in a document, T. Kawagoe, J. Ohtani, M. Niiro, T. Ooishi, M. Hamada and H. Hidaka, "A Built-In Self-Repair Analyzer (CRESTA) for embedded DRAMs", International Test Conference 2000 Proceedings, pp. 567–574.

Therefore, if built-in self-test/redundancy saving analysis section 8230 as shown in FIG. 44 is integrated on semiconductor integrated circuit device 8200, DRAM core 8210 and built-in self-test/redundancy saving analysis section 8230 can be connected therebetween by an internal data bus with a comparatively large bit width, for example a 256 bit I/O. Hence, Problems can be avoided of increase in test time and a cost required for an external tester device as described in FIG. 43.

For example, in a case where plural DRAM cores with different memory capacities are integrated on one chip, however, there arises a problem to be further solved as described below:

FIG. 45 is a schematic diagram for describing a configuration of a semiconductor integrated circuit device 8400 integrated with plural DRAM cores on one chip.

A first DRAM core 8410 and a second DRAM core 8440 are integrated on semiconductor integrated circuit device 8400. Provided to first DRAM core 8410 are: a logic circuit 8420 for supplying/receiving data with first DRAM core 8410 and performing a logic operation; and built-in self-test/redundancy saving analysis section 8430 for detecting a defective bit in first DRAM core 8410 and performing analysis for redundancy saving on first DRAM core 8410.

On the other hand, provided to second DRAM core 8440 are: a logic circuit 8450 for supplying/receiving data with second DRAM core 8440 and performing a logic operation; and a built-in self-testing/redundancy saving analysis section 8460 for detecting a defective bit in second DRAM core 8440 and performing analysis for redundancy saving on second DRAM core 8440.

Herein, it is assumed that a memory capacity of DRAM core 8440 is lager than that of DRAM core 8410.

Therefore, it is assumed that, for example, while DRAM core 8410 and built-in self-test/redundancy saving analysis section 8430 are connected therebetween by a 256 bit internal data bus. DRAM core 8440 and built-in self-test/redundancy saving analysis section 8460 are connected therebetween by an internal data bus with a width of 2048 bits.

Furthermore, in general, DRAM core 8410 and DRAM core 8440 are different from each other in the number of redundant memory cell rows and the number of redundant memory cell columns.

Based on such differences in memory capacity and configuration of redundant memory cells, a necessity arises that provided to DRAM core 8410 and DRAM core 8440 are built-in self-test/redundancy saving analysis section 8430 and built-in self-test/redundancy saving analysis section 8460, respectively, which are different from each other.

When, in such a manner, built-in self-test/redundancy saving analysis sections are provided to respective DRAM cores, there arise problems that an area penalty increases, thereby inviting increase in chip area.

SUMMARY OF THE INVENTION

It is an object of the present invention to provide a semiconductor integrated circuit integrated with a test circuit capable of flexibly adapting to not only a case where a change occurs in memory capacity of a DRAM core but a case where a change also occurs in the number of redundant memory cell rows and the number of redundant memory cell columns provided to a DRAM core.

The present invention will be summarized such that the present invention is directed to a semiconductor integrated circuit device, being provided with plural memory circuits and a redundancy replacement test circuit.

Each of the plural memory circuits includes a normal memory cell array having plural normal memory cells therein and a spare memory cell array having plural spare memory cell rows and plural spare memory cell columns therein.

The redundancy replacement test circuit is provided commonly to the plural memory circuits to determine a defective address to be repaired by replacement. The redundancy replacement test circuit includes a self-test circuit and a redundancy analysis circuit.

The self-test circuit generates address signals for sequentially selecting memory cells to detect a defective memory cell based on results of comparison between data read out from the memory cells and expected value data.

The redundancy analysis circuit determines a defective address on which replacement is to be performed with one of plural spare memory cell rows and plural spare memory cell columns according to an address signal from the self-test circuit and a detection result on the defective memory cell. The redundancy analysis circuit has an address storage circuit, a drive circuit and a determination circuit. The address storage circuit stores a defective address corresponding to a defective memory cell. The drive circuit limits an effective memory space of the address storage circuit according to a capacity of a memory circuit to be tested among the plural memory circuits and performs data storage into the address storage circuit. The determination circuit determines which of spare memory cell rows and spare memory columns the defective cell is replaced with according to a defective address stored in the address storage circuit. The address storage circuit selectively stores the defective address different from any of already stored detective row addresses and defective column addresses among sequentially detected defective addresses.

The address storage circuit preferably includes plural CAM cells (Content Addressable Memory Cells) arranged in matrix.

Furthermore, the determination circuit preferably comprises a plurality of replacement determination sections provided correspondingly to respective sequences of replacement steps. Each of the sequences of replacement steps corresponds to a sequence in which defective memory cell rows and defective memory cell columns are sequentially replaced with spare memory cell rows and spare memory cell columns in the memory circuit including the maximum number of spare memory cell rows and spare memory cell columns among the plurality of memory circuits.

Each of the plurality of replacement determination sections has a replacement sequence determination circuit and a determination step limit circuit. The replacement sequence determination circuit determines whether repair of defective memory cells is completed before reaching a final step among the sequence of replacement steps. The determination step limit circuit selectively sets one of the replacement steps as the final step according to the number of the spare memory cell rows and the spare memory cell columns belonging to the memory circuit to be tested among the plurality of memory circuits.

Alternatively, the semiconductor integrated circuit device further includes plural select circuits provided correspondingly to respective plural memory circuits and connected in series to each other. Write data to a memory circuit to be tested among the plural memory circuit is transmitted from a self-test circuit by a shifting operation sequentially passing through the plural select circuits.

Alternatively, the redundancy replacement test circuit further preferably includes: a first internal address generation circuit for generating an internal address for a test operation according to a capacity of a memory cell array of a memory circuit to be tested among the plural memory circuits. Each memory circuit further includes: a second internal address generation circuit generating an internal address for a test operation on a memory circuit in synchronism with the first internal address generation circuit based on an initial value given from said redundancy replacement circuit.

Therefore, an advantage of the present invention is that on a semiconductor integrated circuit device itself, there can be integrated a test circuit having a redundancy analysis function capable of performing detection of a defective memory cell and redundancy analysis on a comparatively small circuit scale even in a case where memory capacities of plural semiconductor memory circuits formed on the same chip are of respective values different from each other.

Another advantage of the present invention is that on a semiconductor integrated circuit device itself according to any of claims 3 and 7, there can be integrated a test circuit having a redundancy analysis function capable of performing detection of a defective memory cell and redundancy analysis on a comparatively small circuit scale even in a case where configurations of redundancy memory cells formed in respective plural semiconductor memory circuits integrated on the same chip are different from each other.

Still another advantage of the present invention is that a circuit configuration for supplying/receiving of data between a self-test circuit and a memory circuit to be tested can be simplified, thereby enabling a chip area to decrease.

Yet another advantage of the present invention is that since an addresses for a test is generated by each of a memory cell and a redundancy replacement test circuit, no necessity arise for transfer of an address from the redundancy replacement test circuit to the memory cell during the test, thereby enabling a test time to decrease.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a table showing a relationship between a replacement sequence with redundant rows and redundant columns, and a replacement possibility for redundancy saving in a case where defective bits are detected in a sequence shown in FIG. 4;

DESCRIPTION O THE PREFERRED EMBODIMENTS

First Embodiment

Configuration of Semiconductor Integrated Circuit Device 1000

Figure 1:
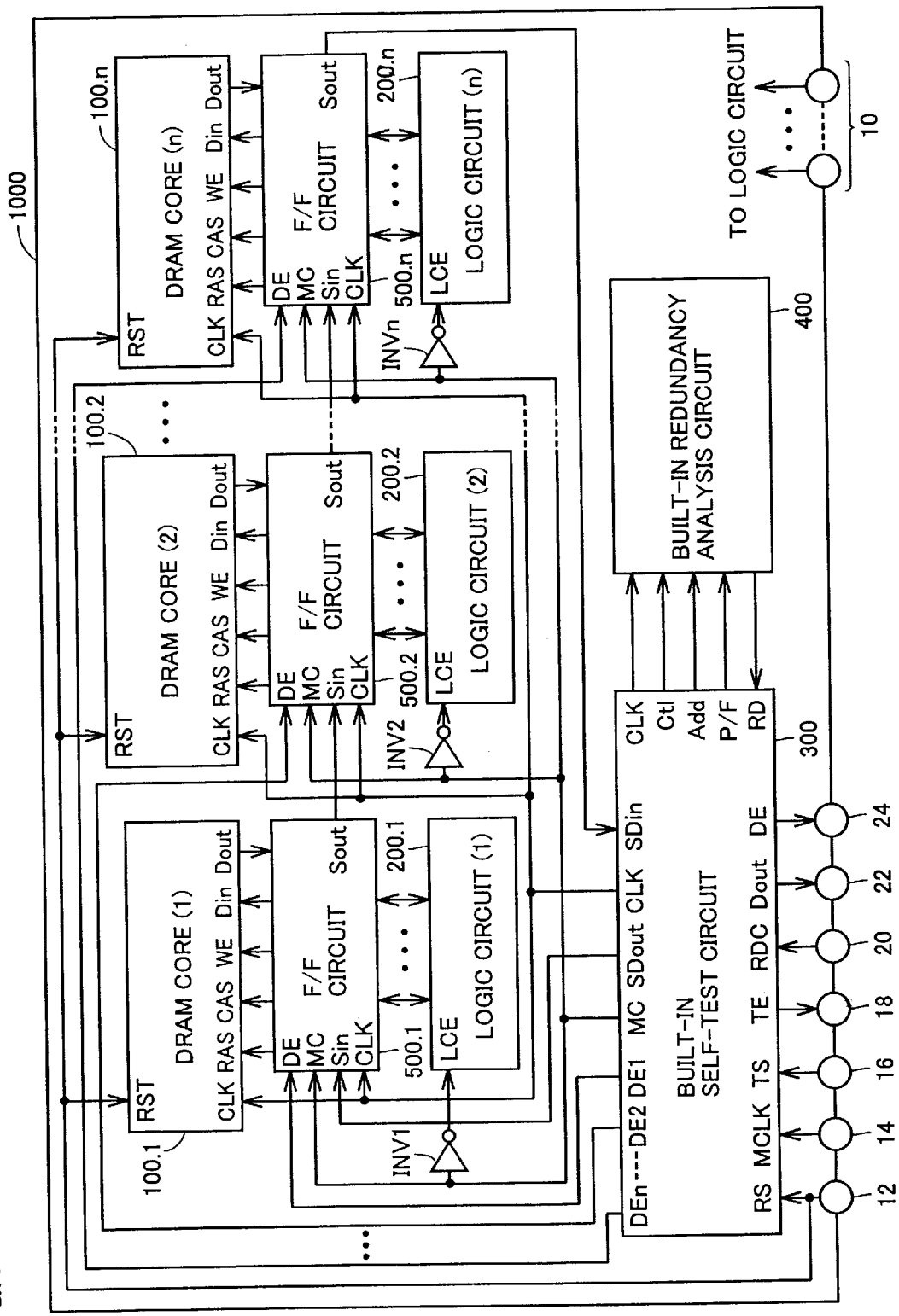
FIG. 1 is a schematic block diagram for describing a configuration of a semiconductor integrated circuit device 1000 relating to the present invention.

FIG. 1 is a schematic block diagram for describing a configuration of a semiconductor integrated circuit device 1000 relating to the present invention.

Referring to FIG. 1, a semiconductor integrated circuit 1000 includes: n (n is a natural number) DRM cores 100.1 to 100.n; logic circuits 200.1 to 200.n for performing data supplying/receiving to/from DRAM cores 100.1 to 100.n to perform a logic operation; a built-in self-test circuit 300 for performing a built-in self-test on each of DRAM cores 100.1 to 100.n; and a built-in redundancy analysis circuit 400 for analyzing and determining what redundancy saving should be performed on a defective bit detected in each of the DRAM cores 100.1 to 100.n based on a test result in built-in self-test circuit 300, wherein the analysis for redundancy saving means an analysis performed on how, in each of the DRAM cores, a normal memory cell row and a normal cell column in each of which a defective bit exists are replaced with plural redundancy memory rows and plural redundancy columns in order to save the normal memory cell row and the normal cell column.

Given to built-in self-test circuit 300 are a reset signal RST from an external terminal 12, a master clock MCLK from an external terminal 14, and a test start instruction signal TS from an external terminal 16. Furthermore, given to built-in self-test circuit 300 are a data read command RDC from an external terminal 20 for instructing a read operation of data indicating a redundancy analysis result after a redundancy analysis ends. The "data indicating a redundancy analysis result" means, to be concrete, data indicating whether or not redundancy saving is possible, data indicating which address redundancy replacement should be performed on when redundancy analysis is possible and other data.

On the other hand, from the built-in self-test circuit, a test end signal TE indicating that a test ends is given to the external terminal 18, data indicating a redundancy analysis result is given to an external terminal 22 and a data enable signal DE indicating that data showing a redundancy analysis result is outputted to an external terminal 24.

On the other hand, a data holding circuit, holding data, performing data shift serially, and to which data can be inputted in parallel, for example a flip-flop circuit 500.1, is provided between DRAM core 100.1 and logic circuit 200.1, and controls data supplying/receiving between DRAM core 100.1 and logic circuit 200.1.

The flip-flop circuits 500.2 to 500.n are provided between another DRAM core 100.2 and another logic circuit 200.2; and finally between DRAM core 100.n and logic circuit 200.n, respectively.

Data enable signal DE1 to DEn are outputted from built-in self-test circuit 300 in order to control data input/output on DRAM cores 100.1 to 100.n. Signals DE1 to DEn are given to flip-flop circuits 500.1 to 500.n, respectively.

Flip-flop circuits 500.1 to 500.n are connected serially to each other and serially transmit a signal SDout given from built-in self-test circuit 300 to hold the signal in a test operation. After thus held data is given to DRAM cores 100.1 to 100.n from flip-flop circuits 500.1 to 500.n and the test operation has been performed, data corresponding to a test result is again held in flip-flop circuits 500.1 to 500.n. As described later, generally, DRAM cores 100.1 to 100.n are sequentially selected one by one and selected one DRAM core is an object for a test.

By doing so, data corresponding to the test result held in flip-flop circuits 500.1 to 500.n is subjected to a serial shift operation according to control from built-in self-test circuit 300 and the data is again given to built-in self-test circuit 300 as data SDin.

To describe in more detailed manner, a mode command MC for specifying a test operation mode or an ordinary operation mode is given to flip-flop circuits 500.1 to 500.n from built-in self-test circuit 300.

When mode command MC is in an active state ("H" level), the test operation mode is selected and data that has been given to flip-flop circuits 500.1 to 500.n from built-in self-test circuit 300 is given to DRAM cores 100.1 to 100.n. Furthermore, data that has been given to flip-flop circuits 500.1 to 500.n from DRAM cores 100.1 to 100.n is transmitted serially to built-in self-test circuit 300.

In a period when command MC is in an active state, signals obtained by inverting mode command MC in inverters INV1 to INVn are given to respective logic circuits 200.1 to 200.n to cause logic circuits 200.1 to 200.n to be in an inactive state.

On the other hand, in a period when mode command MC is in an inactive state ("L" level), that is in the ordinary operation period, data from corresponding logic circuits 200.1 to 200.n is given to respective DRAM cores 100.1 to 100.n through flip-flop circuits 500.1 to 500.n. Furthermore, data outputted from DRAM cores 100.1 to 100.n is given to respective corresponding logic circuits 200.1 to 200.n through flip-flop circuits 500.1 to 500.n. In the ordinary operation, logic circuits 200.1 to 200.n perform data supplying/receiving to/from the outside through a terminal group 10.

A clock signal CLK generated based on a master clock signal MCLK is given to flip-flop circuits 500.1 to 500.n from built-in self-test circuit 300 to perform timing control in the data shift operation and the data supplying/receiving operation.

Clock signal CLK is also given to DRAM cores 100.1 to 100.n to control timing in command supplying/receiving and timing in data inputting/outputting.

Built-in redundancy analysis circuit 400 receives clock signal CLK from built-in self-test circuit 300 to operates in synchronism with clock signal CLK. Given to built-in redundancy analysis circuit 400 from built-in self-test circuit 300 are a control signal Ctl for controlling a redundancy analysis operation as described later, an address signal Add for specifying a memory cell in a DRAM core engaged in a built-in self-test, and a pass/fail signal P/F indicating whether a memory cell corresponding to address signal Add is a good cell or a defective cell as a result of the built-in self-test.

Furthermore, data RD corresponding to a redundancy analysis result is given to built-in self-test circuit 300 from built-in redundancy analysis circuit 400 as described later.

Data RD, herein, includes data indicating whether or not redundancy saving is possible, data indicating an address at which redundancy saving is performed, and so on.

Configuration of DRAM

Figure 2:
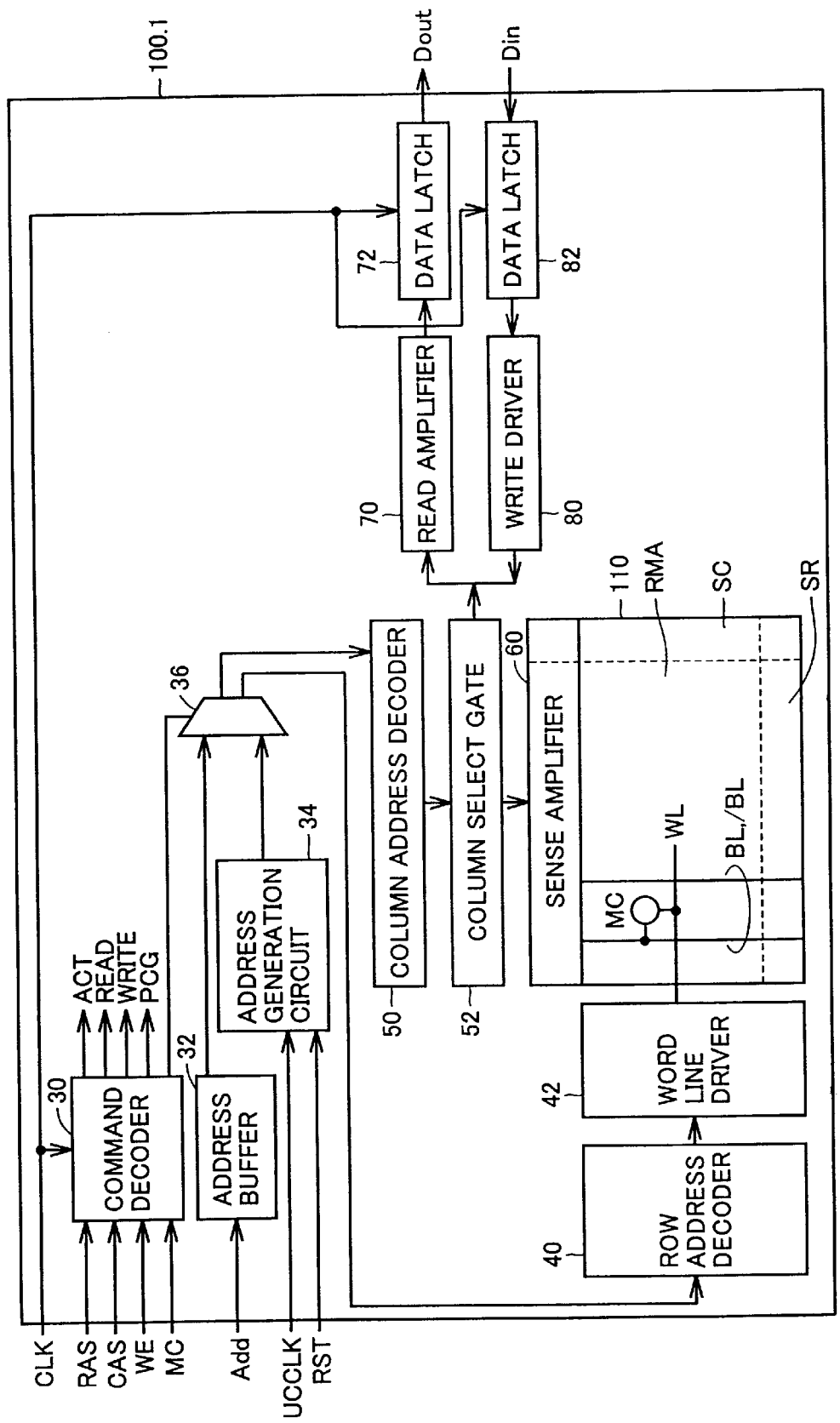
FIG. 2 is a schematic block diagram for describing a configuration of a DRAM core 100.1 shown in FIG. 1.

FIG. 2 is a schematic block diagram for describing a configuration of DRAM core 100.1 shown in FIG. 1.

Configurations of the other DRAM cores 100.2 to 100.n are also basically similar to DRAM core 100.1 with the exception of a memory capacity, the number of redundant memory cell rows and the number of redundancy cell columns.

Referring to FIG. 2, DRAM core 100.1 includes: a command decoder 30 receiving a row address strobe signal RAS, a column address strobe signal CAS, a write enable signal WE, a mode command MC and so on, given through flip-flop circuit 500.1 to generate internal signals; an address buffer circuit 32, in the ordinary operation, receiving address signals A0 to Ai (i is an natural number) given from logic circuit 200.1 through flip-flop circuit 500.1 to generate corresponding internal address signals; an address generating circuit 34 generating an internal address signal for specifying an address at which test data is written in a test operation; and a switch circuit 36 receiving an output from address buffer circuit 32 and an output from address generation circuit 34 to selectively output the received outputs being controlled by command decoder 30.

Command decoder 30 herein generates an ACT signal for activating a select operation on a memory cell, a signal READ specifying a read operation, a signal WRITE for specifying a write operation, a signal PCG for specifying a precharge operation and an internal signal for controlling the switch circuit 36. Controlled according to the internal control signals are operations of circuits associated with a read operation, circuits associated with a write operation and circuits associated with a precharge operation. Moreover, address generation circuit 34 generates an internal address signal based on a count clock signal UCCLK from built-in self-test circuit 300 and is reset in response to a reset signal RST.

The internal address signal means internal row address signals RA0 to 9 and /RA0 to 9, complementary to each other, generated from row address signal RA0 to 9 and internal column address signals CA0 to 9 and /CA0 to 9, complementary to each other, generated from a column address signal CA0 to 9.

DRAM core 100.1 further includes: a memory cell array 110 having plural memory cells MC arranged in a matrix. A memory cell MC is constructed of a capacitor (not shown) for holding data and an access transistor GM (not shown) having a gate connected to a word line corresponding to each row. In memory cell array 110, word line WL is provided to each row of memory cells and bit lines BL and /BL are provided to each column of the memory cells.

Moreover, memory cell array 110 shown in FIG. 2 includes: a normal memory cell array RMA; a redundancy memory cell row (spare row) SR and a redundancy memory cell column (spare column) SC. For example, it is assumed that spare row SR includes two spare rows SR1 and SR2 and spare column SC includes two spare column SC1 and SC2. However, the number of spare rows and spare columns are different according to a DRAM core.

[Operation of DRAM Core in Ordinary Operation Mode]

In the ordinary operation, as described above, switch circuit 36 outputs an internal row address signal and an internal column address signal from address buffer circuit 32, without any change therein, to a row address decoder 40; and a column address decoder 50 and a spare column decoder 52, respectively.

Row address decoder 40 includes a normal row address decoder 40R (not shown) generating a signal for selecting a memory cell row in the normal memory cell array; and a spare row address decoder 40S (not shown) ceasing operation of normal row address decoder 40R to generate a signal for selecting a redundancy memory cell in spare row SR instead when an internal address signal corresponds to a defective row address programmed previously in a non-volatile manner. Similar to this, column address decoder 50 includes a normal column address decoder 50R (not shown) generating a signal for selecting a memory cell column row in the normal memory cell array; and a spare column address decoder 50S (not shown) ceasing operation of normal column address decoder 50R to generate a signal for selecting a redundancy memory cell column in spare row SC instead when an internal address signal corresponds to a defective column address programmed previously in a non-volatile manner.

A word line driver circuit 42 causes a potential level of a word line selected according to a signal from row address decoder 40 to an active level.

Furthermore, column select gate 52 gives data from selected memory cell column among read data read out from a memory cell MC belonging to a selected memory cell row (word line) through the bit lines BL and /BL and amplified by a sense amplifier 60 to a read amplifier 70 in the read operation. The read-out data amplified by the read amplifier 70 is stored and held in a data latch 72, and thereafter, given to flip-flop circuit 500.1 as data Dout in synchronism with clock signal CLK.

On the other hand, in the write operation, write data given from flip-flop circuit 500.1 as data Din is stored and held in a data latch 82 in synchronism with clock signal CLK and thereafter, amplified by a write driver circuit 80 to be given to a column select gate 52 by a write driver circuit 80. Column select gate 52 gives write data to bit lines BL and /BL of a selected memory cell column to perform data write to a memory cell selected by activation of a word line.

[Operation of DRAM Core in Test Mode]

Moreover, switch circuit 36 gives internal address signals generated in address generation circuit 34 according to clock signal UCCLK to row address decoder 40 and column address decoder 50, respectively, wherein internal signals from address buffer circuit 32 does not participate in the operation. Furthermore, write data inputted to data latch 82 is not a signal from logic circuit 200.1 but test write data DT generated in built-in self-test circuit 300.

After such a write operation in the test operation ends, a read-out address signal is given to DRAM core 100.1 from built-in self-test circuit 300 to perform read of data having been sequentially written. Built-in self-test circuit 300 sequentially detects defective memory cell positions in normal memory cell array RAM according to comparison results between read-out data and expected value data Ext. DT. Built-in redundancy analysis circuit 400 determines on what replacement process with combinations between spare row SR and spare column SC plural defective row addresses and plural defective column addresses corresponding to such plural defective memory cells can be saved by.

When such a read operation in the test operation ends, spare row decoder 40S and spare column decoder 50S store detective row addresses and defective column addresses to be replaced, in a non-volatile manner according to determination of built-in redundancy analysis circuit 400. Hence, built-in self-test circuit 300 outputs such addresses at which replacement should be performed to the outside after the test operation ends. In this case, a configuration may be adopted in which an external tester issues an instruction to a repair device according to the replacement addresses outputted to the outside and the repair device performs trimming of fuse elements of spare row decoder 40S and spare column decoder 50S. Alternatively, spare row decoder 40S and spare column decoder 50S may be configured so as to include electrically write-enable, read-enable non-volatile memory elements for replacement addresses instructed from built-in self-test circuit 300.

After such a redundancy analysis performed by built-in self-test circuit 300 and built-in redundancy analysis circuit 400 ends, the process advances into an ordinary read operation and an ordinary write operation.

[Ordinary Operation after Redundancy Replacement on DRAM Core]

In an ordinary read operation and an ordinary write operation after redundancy replacement, word line driver 42 selectively activates a corresponding word line WL according to an output from row decoder 40 having decoded an internal row address from the address buffer circuit 32. At this time, spare row decoder 40S activates a word line VWL of spare row SR and issues an instruction not to perform a select operation to normal row address decoder 40R when a defective row address stored in a non-volatile manner and an internal row address from the address buffer coincide with each other.

On the other hand, column address decoder 50 decodes an internal column address from address buffer circuit 32 to activate a column select signal. At this time, spare column decoder 50S activates a column select signal corresponding to spare column SC and instructs normal column address decoder 50R not to perform a select operation when an internal column address signal from address buffer circuit 32 coincides with a defective column address stored in a non-volatile manner.

The column select signal is given to column select gate 52 through a column select line (not shown). Column select gate 52 selectively connects sense amplifier 60 amplifying data on bit lines BL and /BL and read amplifier 70 according to a column select signal.

[Configuration of Built-in Self-Test Circuit]

Figure 3:
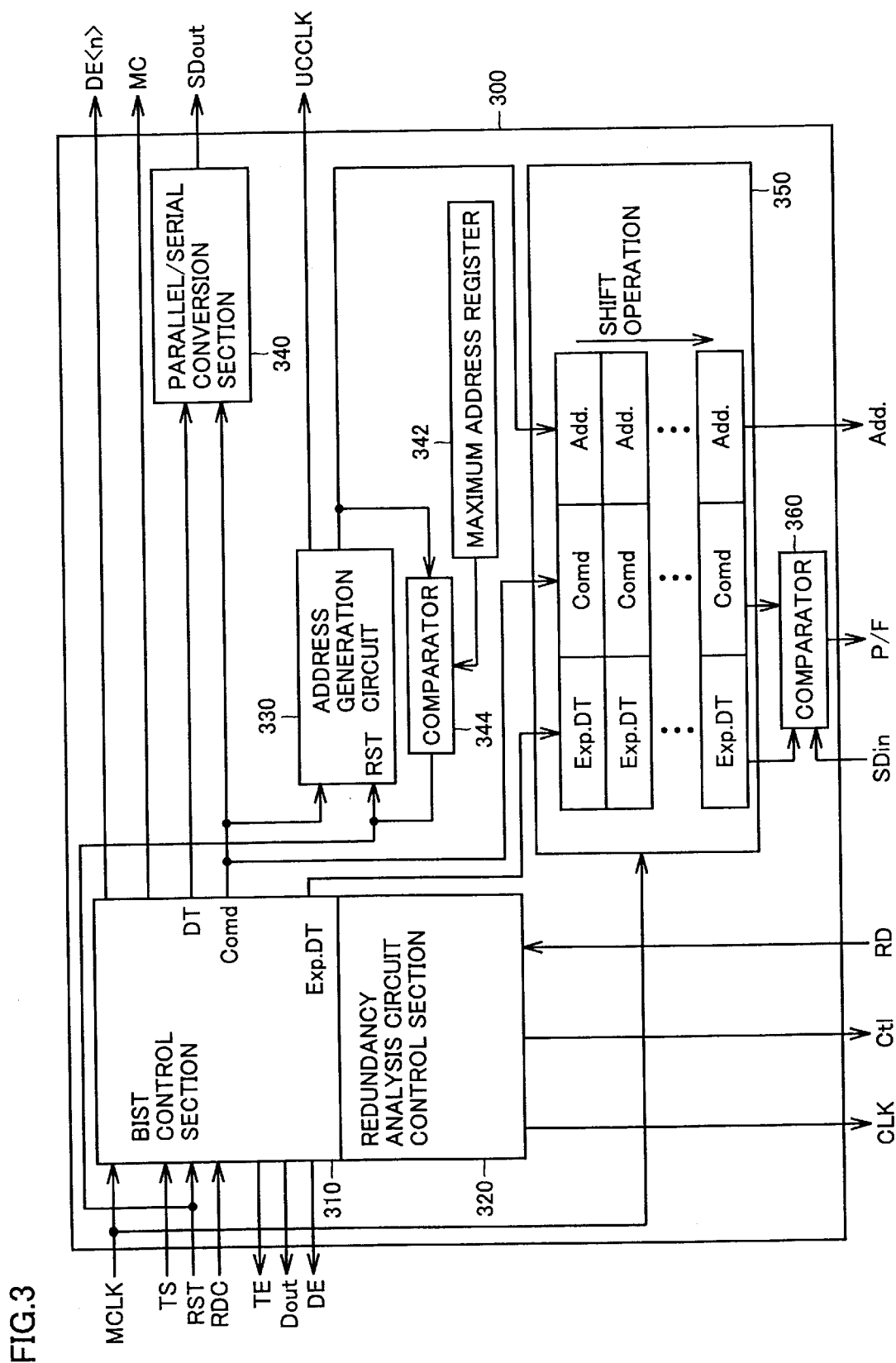
FIG. 3 is a schematic diagram for describing a configuration of a built-in self-test circuit 300 shown in FIG. 1.

FIG. 3 is a schematic diagram for describing a configuration of built-in self-test circuit 300 shown in FIG. 1.

Built-in self-test circuit 300 includes: a BIST control section 310 for controlling a built-in self-test operation; a built-in redundancy analysis control section 320 for controlling operation of built-in redundancy analysis circuit 400; an address generation circuit 330 generating an internal address for performing a built-in self-test according to clock signal UCCLK given from BIST control section 310; a parallel-serial conversion section 640 for receiving a test data DT generated in BIST control section 310 and a command signal for a test operation to convert parallel data to serial data and output the serial data to flip-flop circuit 500.1; a maximum address register 342 for holding the maximum address of a DRAM core, which becomes an object for a built-in self-test according to control from BIST control section 310; and a comparator 344 for resetting operation of address generation circuit 330 according to a comparison result between an internal address signal generated in address generating circuit 330 and the maximum address held in maximum address register 342.

Mode command MC and signals DE1 to DEn (collectively expressed as DE <n>) are outputted from BIST control circuit to flip flop circuits 500.1 to 500.n.

Clock signal UCCLK is outputted from address generation circuit 330, which signal is also given to address generation circuit 34 in each of DRAM cores 100.1 to 100.n. Therefore, an address generated by address generation circuit 330 and an address generated by address generation circuit 34 correspond to the same address.

Built-in self-test address circuit 300 further includes an address-data shift latch circuit 350 receiving a command outputted to a DRAM core, which becomes an object for the test, in a read operation in the-test operation, and an expected value data Exp. DT for write data from BIST control section 310 and further receiving an address at which a read operation corresponding to the command and the expected value data is performed from address generation circuit 330 to store the command, the expected value data and the address, relating the data to each other, and cause a sequential shift operation on the data according to cock signal CLK; and a comparator 360 serially receiving scan data Sout of flip-flop circuit 500.n as SDin, and outputting a comparison result of expected value data Ext. DT from BIST control section 310 with scan data Sout as a pass/fail signal P/F when command data indicates that read of data from a DRAM core, which is an object for the test, is performed. Note that at the same time as when pass/fail signal P/F is outputted from comparator 360, address signal Add is also outputted to built-in redundancy analysis circuit 400 from address-data shift latch circuit 350. Therefore, neither pass/fail signal P/F nor address signal Add is outputted from built-in self-test signal 300 when the command data does not indicate that read of data from a DRAM core, which is an object for the test, is performed.

Built-in self-test control section 310 receives master clock signal MCLK to generate clock signal CLK and start a test operation according to test start signal TS, while on the other hand, finishing the test operation according to reset signal RST. In company with finish of the test operation, a test end signal TE is outputted from built-in self-test control section 310.

Furthermore, when being given a data read command from internal terminal 20, built-in self-test control section 310 outputs data indicating a redundancy analysis result given from built-in redundancy analysis section 400 and data enable signal DE indicating that the data of analysis result has been outputted, as described later.

[Outline of Operation of Built-in Redundancy Analysis Circuit 400]

Simple description will be given, below, of an outline of a process performed by built-in redundancy analysis circuit 400 prior to description of a configuration of built-in redundancy analysis circuit 400.

Figure 4:
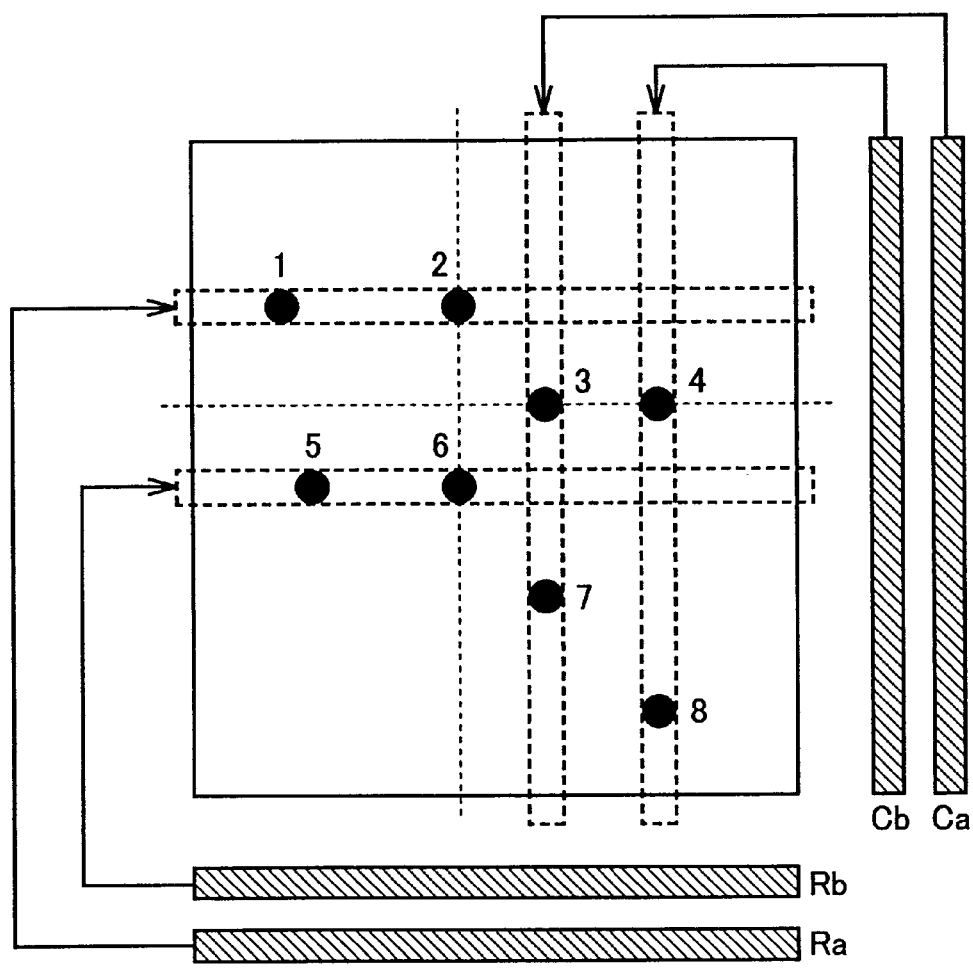
FIG. 4 is a conceptual diagram for describing detection of defective bits and a replacement operation with redundant memory cell rows and redundant memory cell columns.

FIG. 4 is a conceptual diagram for describing detection of defective bits and a replacement operation with redundant memory cell rows and redundant memory cell columns in a DRAM core having the largest memory capacity among the DRAM cores shown in FIG. 1, for example in DRAM 100.2.

FIG. 4 shows arrangement of defective bits detected as a result of comparison of data written to and read out sequentially from memory cells in normal memory cell array 140 in DRAM core 100.2 according to address signals generated by address generating circuit 34 in DRAM core 100.2 with expected values. It is assumed that defective bits, indicated by black circles in FIG. 4, are detected in ascending order by number attached to black circles.

Short description will be summed up of a processing procedure of replacement of defective bits as shown in FIG. 4 with spare row SR and spare column SC below:

Memory cells corresponding to defective bits in FIG. 4 are hereinafter referred to as defective memory cells DBM1 to DBM8 according to the order in which the defective cells are detected.

At this time, a case is considered where replacement process is performed at defective addresses corresponding to the defective memory cells with two spare rows SR1 and SR2 and two spare columns SC1 and SC2. The case is divided into two cases where all of the defective memory cells are saved and where all of the defective memory cells are not saved, depending on what order normal memory cell rows and normal memory cell columns corresponding to defective memory cells are replaced with in the spare rows and the spare columns.

For example, in a case where defective memory cells DBM1 and DBM2 (with a common row address) are replaced with a spare row Ra, defective memory cells DBM5 and DBM6 (with a common row address) are replaced with a spare row Rb in second place, while defective memory cells DBM3 and DBM7 (with a common column address) are replaced with a spare column Ca in the first place and defective memory cells DBM4 and DBM8 (with a common column address) with a spare column memory cell Cb in the second place, all of defective memory cells DBM1 to DBM8 can be replaced with the two spare rows and the two spare columns.

However, for example, in a case where a replacement process goes sequentially in the following way: defective memory cell DBM1 is first replaced with spare column Ca in the first place, defective memory cell DBM2 is second replaced with spare column Cb in the second place; and thereafter, defective memory cells DBM3 and DBM4 detected subsequently are replaced with spare row Ra in the fist place, and defective memory cells DBM5 and DBM6 detected subsequently are replaced with spare row Rb in the second place, all of the defective memory cells cannot be saved by replacement with the two spare rows and the two spare columns.

As described above, in processing where defective memory cells are sequentially detected and in parallel, the defective memory cells are replaced with spare rows or spare columns, there arise two cases where all of defective memory cells are saved and where all of defective memory cells are not saved, depending on not only a distribution of defective memory cells in a normal memory cell array, but also what order replacement process is performed in with spare rows and spare columns.

The number of cases in combination based on what order defective memory cells detected sequentially are replaced in with two spare rows and two spare columns available is 6 as described below, according to which step of a 4 step sequence, as a position in the order, in replacement process replacement is performed in with a spare row or a spare column.

Definitions in the following description are such that a case where replacement with a spare row is indicated by R and a case where replacement with a spare column is indicated by C.

The cases are:

case 1 is R→R→C→C,
case 2 is R→C→R→C,
case 3 is R→C→C→R,
case 4 is C→C→R→R,
case 5 is C→R→C→R, and
case 6 is C→R→R→C.

That is, if it is determined which step of the 4 steps, as a position in the order, in replacement process replacement is performed in with a spare row, such combinations are determined, wherein a total number of such combinations are $_{(2+2)}C_2 = 4!/(2! \cdot 2!) = 6$, which is the number of combinations in a case where two objects are taken out from a total of 4 objects (including two spare rows and two spare columns). Herein, k! in which k is a natural number indicates a factorial of a natural number k.

In more of general, when m spare rows and n spare columns are totally available as objects from which combinations are considered, a total number of such combinations are $_{(m+n)}Cn = _{(m+n)}Cm = (m+n)!/(m! \times n!)$.

In a case where all of defective memory cells can be replaced and saved with two spare rows and two spare columns, there are available sequences in replacement process in which perfect saving is possible in the above described sequences without fail.

FIG. 5 is a table showing a relationship between a replacement sequence with redundant rows and redundant columns, and a replacement possibility for redundancy saving in a case where defective bits are detected in a sequence shown in FIG. 4.

A more detailed version of the description in FIG. 4 will be given as a concrete procedure below:

In FIG. 5, replacement with a redundant row is indicated by "R" and replacement with a redundant column is indicated by "C". That is, sequences of replacement are 6 ways of "RRCC" to "CRRC".

For example, a case is considered where replacements of defective bits go in the sequence of "RRCC".

In this case, the first "R" of the sequence "RRCC" indicates that a row address is to be replaced. Therefore, when defective bit 1 is detected, a replacement with a redundant row Ra is required. By doing so, a row address of defective bit 1 is stored into built in redundancy analysis section 400. Subsequent to this, when defect 2 is detected, the defect 2 has been saved by the redundant row Ra since a row address of the defective bit 2 is the same as that of the defect bit 1. Hence, no new redundancy replacement is required.

In contrast, when defective bit 3 is detected, a row address of the defective bit 3 is different from those of the row addresses of the defective bits 1 and 2; so the defective bit 3 has to be replaced with the next redundant memory cell Rb. By doing so, a row address of the defective bit 3 is stored into built-in redundancy analysis section 400. At this stage, replacement steps up to "RR" of all the sequence "RRCC" has been performed.

In succession, when defective bit 4 is detected, no new replacement is performed either since a row address of the defective bit 4 is the same as that of the defective bit 3, which has been detected.

In contrast, when defective bit 5 is detected, a row address and column address of the defective bit 5 are different from any of addresses of detective bits that have been detected; therefore, replacement with a redundant column Ca has to be performed on the defective bit 5. With this replacement, a column address of the defective bit 5 is stored into built-in redundancy analysis section 400. At this stage, replacement steps up to "RRC" of all the step sequence "RRCC" have been performed.

Subsequent to this, when defective bit 6 is detected, a column address of the defective bit 6 is different from any of row addresses and column addresses of defective bits that have been stored in built-in redundancy analysis section 400; therefore, replacement with the next redundant memory cell column Cb has to be performed thereon. In this step, a column address of the defective bit 6 is stored into built-in redundancy analysis section 400. With the above described procedure implemented, all of the replacement steps of the sequence "RRCC" ends.

When another defective bit 7 is detected, however, an address of the defective bit 7 is different from any of row addresses and column addresses of defective bits that have been detected and stored in built-in redundancy analysis section 400. Hence, the defective bit 7 has to be essentially replaced with a redundancy memory cell, but allocation of replacement steps with all the redundant memory cell rows and redundant memory cell columns has been completed, so it is determined that in a case where the replacement process in the "RRCC" sequence is performed, all the defective bits cannot be saved.

As described above, in case where all the defective bits can be replaced with two redundant memory cell rows and two redundant memory cell columns, there must be at least one sequence of replacement steps by which all the defective bits can be saved among the above described 6 ways of combinations in allocation of replacement steps, which is hereinafter called a "saving solution".

When a step sequence "RCCR" in replacement is adopted according to procedures similar to the sequence "RRCC", it is understood that all the defective bits can be saved.

In built-in redundancy analysis circuit 400 shown in FIG. 1, wherein replacement saving is performed with two redundant memory cell rows and two redundant memory cell column, the configuration is such that determinations are performed in parallel on all of the above described 6 ways of combinations with respect to whether or not redundancy saving is possible. Therefore, a determination result on whether or not a saving solution is available is obtained at the time when detection of all the defective bits ends.

As shown in FIG. 1, however, included in semiconductor integrated circuit device 1000 are plural DRAM cores each having a different memory capacity, and accordingly, the numbers of redundant memory cell rows and redundant memory cell columns different from the others.

In this case, there is a requirement for a different process in built-in redundancy analysis circuit 400.

Figures 6A, 6B, 6C:
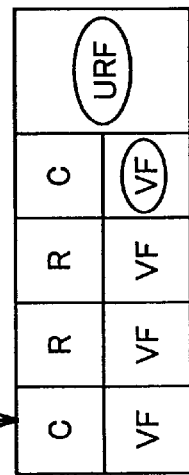
FIGS. 6A to 6C are representations for describing a concept of a test operation on DRAM cores with respective memory capacities different from each other.

FIGS. 6A to 6C are representations for describing a concept of a test operation on DRAM cores with respective memory capacities different from each other.

For example, in a case where there are available two redundant memory cell rows and one redundant memory cell column, and if only the first to third steps are extracted and considered of each of the three sequences "RRCC," "RCRC" and "CRRC" among the above described 6 ways of combinations, a process corresponding to such a redundancy configuration is obtained.

In other words, in a case where there are available two redundant memory cell rows and two redundant memory cell columns, and further if a defective bit is detected after the last step of the 6 combinations ends, redundancy saving in such combinations is determined to be impossible.

FIG. 6A is a representation showing a concept of a process performed in a case where two redundancy memory cell rows and one redundancy memory cell column are available. In this case, when a defective bit is further detected after the third steps of each of the above described three combinations ends, it is determined that all the defective bits cannot be saved with any of the three combinations.

Therefore, as described below, in the present invention, a configuration is adopted that a step of the 4 step sequence, as a position in the order, in replacement process in which step replacement has been ended and determination is performed on whether or not redundancy saving is possible is variable, according to control signal Ctl given to built-in redundancy analysis circuit 400 from built-in self-test circuit 300.

FIG. 6B shows a procedure for redundancy replacement in a case where one redundant memory cell row and two redundant memory cell columns are available. In this case, if a defective bit to be saved is further detected after the third step of each of the combination sequences of "RCCR", "CCRR" and "CRCR" ends, it is determined that redundancy saving is impossible.

FIG. 6C shows a procedure in a case where one redundant memory cell and one redundant memory cell column are available.

In FIG. 6C, in a case where when the second step in each of the sequences of "RCRC" and "CRCR" is completed, a defective bit to be saved is further detected, it is determined that redundancy saving is impossible.

[Configuration of Built-in Redundancy Analysis Circuit 400]

Figure 7:
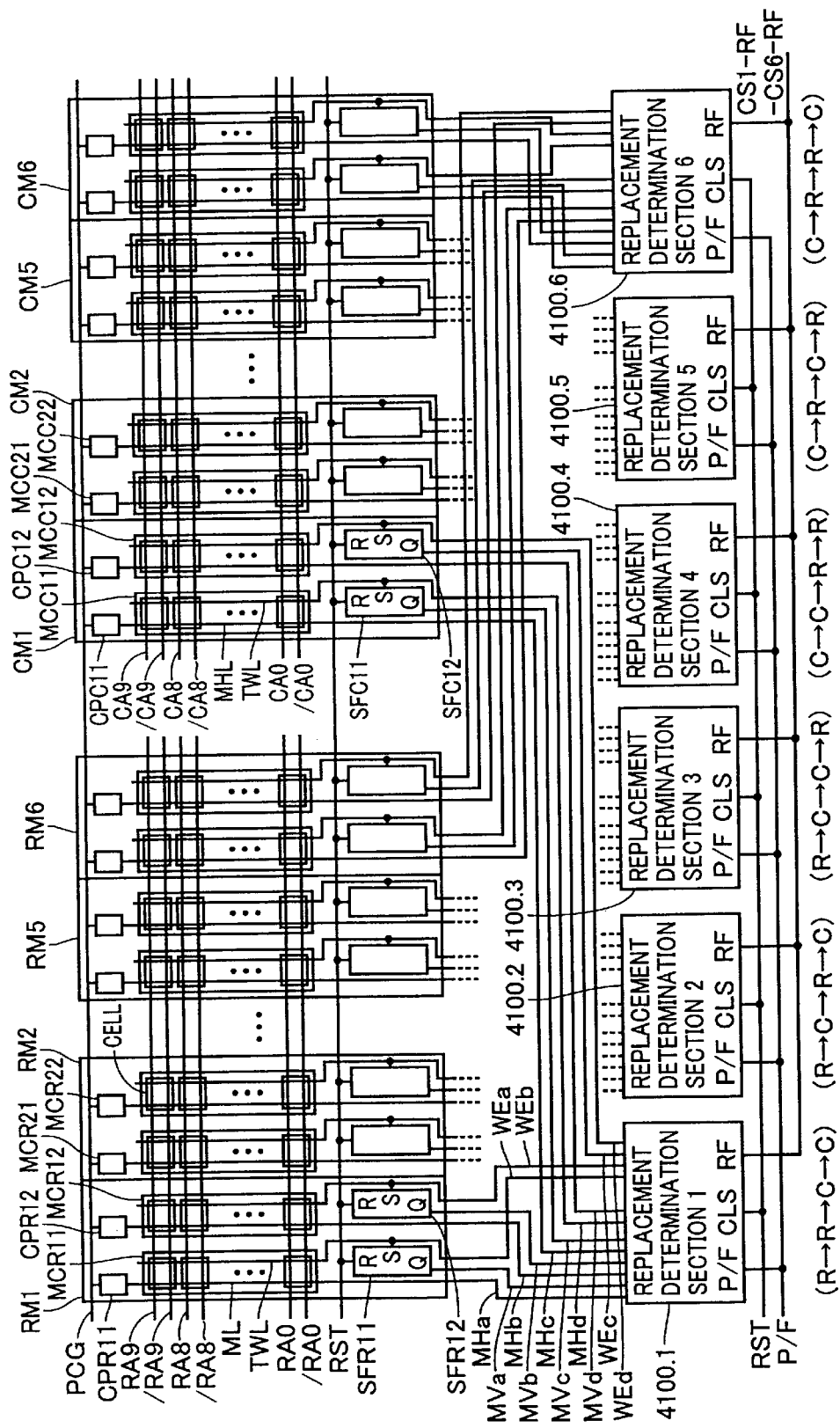
FIG. 7 is a schematic block diagram showing an extracted part of an address replacement determination unit ARD.

FIG. 7 is a schematic block diagram showing an extracted part of an address replacement determination unit ARD performing determination on whether or not redundancy saving as described in FIGS. 5 and 6 is possible in built-in redundancy analysis circuit 400.

In address replacement judgment unit ARD shown in FIGS. 7, 6A to 6C sections processing in parallel are available such that the above described 6 ways of combinations can be in parallel determined.

Referring to FIG. 7, address replacement determination unit ARD includes: first to sixth replacement determination sections 4100.1 to 4100.6 for determining whether or not saving is possible by replacement of defective bits when replacement processing on the defective bits is performed corresponding to each of the above describe six cases from case 1 to case 6.

Address replacement determination unit ARD further includes: row address storage sections RM1 to RM6 each storing two spare rows and row addresses at which replacement are performed; and column address storage sections CM1 to CM6 for storing two column addresses and column addresses at which replacement are performed, both corresponding to first replacement judgment section 4100.1 to sixth replacement determination section 4100.6.

For example, in the above described case 1, that is, row address storage section RM1 and column address storage section CM1 are provided corresponding to first replacement determination section 4100.1 provided adapting to processing in which replacement with a spare column is continuously performed two times straight after replacement with a spare row is performed two times in succession.

Row address storage section RM1 includes: a storage cell row MCR11 for storing a row address to be replaced with first spare row Ra; and a storage cell column MCR12 for storing a row address to be replaced with second spare row Rb.

On the other hand, column address storage section CM1 includes: a storage cell column MCC11 for storing a column address to be replaced with first spare column Ca; and a storage cell column MCC12 for storing a column address to be replaced with second spare column Cb.

Since first replacement determination section 4100.1 corresponds to the above described case 1; therefore, first replacement determination section 4100.1 sequentially determines whether or not an internal address signal is written into a storage cell column at an each time when pass/fail signal P/F activates storage cell columns MCR11 and MCR12 in corresponding row address storage section RM1, and storage cell columns MCC11 and MCC12 in corresponding column address storage section CM1 in the sequence thereof.

Precharge circuits CPR11, CPR12, CPC11 and CPC12 are provided correspondingly to respective storage cell columns MCR11, MCR12, MCC11 and MCC12. Precharge circuits CPR11 to CPC12 precharge coincidence determination lines ML provided to respective corresponding columns MCR11 to MCC12 to "H" level according to signal PCG.

Storage cell columns MCR11 and MCR12 are provided correspondingly to ten pairs of internal row address signals including a pair of signals RA0 and /RA0 . . . , a pair of signals RA9 and /RA9, and include CAM cells for storing levels of the internal row address signals.

In a similar manner, storage cell columns MCC11 and MCC12 are provided correspondingly to ten pairs of internal column address signals including a pair of signals CA0 and /CA0 . . . , a pair of signals CA9 and /CA9, and include CAM cells for storing levels of the internal column address signals.

Each of CAM cells in row address storage section RM1 and column address storage section CM1 stores a level of a corresponding internal row address signal or a corresponding internal column address signal in response to transition of a write activation line TWL to an active level ("H" level) according to an instruction from corresponding replacement determination section 4100.1.

On one hand, a coincidence determination line ML precharged in advance to "H" level maintains "H" level when a level of an address signal stored already in a corresponding storage cell column coincides with a level of internal row address signal RA0 and /RA0 to RA9 and /RA9 or internal column address signal CA0 and /CA0 to CA9 and /CA9 given to address replacement determination unit ARD at the time when the coincidence determination line ML is precharged. On the other hand, when no coincidence arises, a level of the coincidence detection line ML goes to "L."

Furthermore, flip-flop circuits SFR11, SFR12, SFC11 and SFC12 are provided correspondingly to respective storage cell columns MCR11, MCR12, MCC11 and MCC12. Levels of flip-flop circuits SFR11 to SFC12 are reset by reset signal RST prior to the start of a test operation and is set in response to transition of write select line TWL of a corresponding storage cell column to an active state ("H" level).

Second replacement determination section 4100.2 corresponds to case 2, and includes: a row address storage section RM2 and a column address storage section CM2 provided corresponding to processing of replacement with spare rows and replacement with spare columns performed alternately, respectively. Second replacement determination section 4100.2 sequentially determines whether or not a corresponding internal address signal is written into a storage cell column at an each time when pass/fail signal P/F activates storage cell columns MCC21 and MCC22 in corresponding row address storage section RM2, and storage cell columns MCR22 and MCC22 in corresponding column address storage section CM2 in the sequence thereof. The other configuration is similar to the configuration of the first replacement determination section 3100.1.

Third to sixth replacement judgment sections 4100.3 to 4100.6 have configurations similar to the configuration of the replacement judgment section 4100.1 each with the exception that a corresponding storage cell column and a sequence in which write is performed into storage cell columns is different according to case 3, . . . or case 6. Therefore, description thereof is not repeated.

Description will be given of an outline of operation of replacement determination section 4100.1 in the above configuration, below.

That is, for example, first replacement determination section 4100 first precharges a coincidence detection line ML of each of storage cell columns MCR11, MCR12, MCC11 and the MCC12 to "H" level at the time when pass/fail signal P/F becomes active. When a first defective bit is detected after the precharge, all of the coincidence lines ML go to "L" level. In response to this, first replacement determination section 4100.1 drives write select line TWL of storage cell column MCR11 into an active state. Thereby, a level of flip-flop circuit SFR11 corresponding to storage cell column MCR11 is set and it is held as data that write of an address signal to storage cell column MCR11 has been performed.

Subsequent to this, when pass/fail signal P/F becomes again active, each CAM cell performs comparison between an internal row address held in storage cell column MCR11 and an internal row address at this point in level and a level of coincidence detection line ML of storage cell column MCR11 is driven according to a comparison result thereof. In response to this, first replacement determination section 3100.1 performs no activation of storage cell column MCR12 when an internal row address held already in storage cell column MCR11 and an internal row address corresponding to a defective memory cell detected newly coincide with each other.

To the contrary to this, when the internal row address stored already in storage cell column MCR11 and the internal row address corresponding to a defective bit detected newly does not coincide with each other, first replacement determination section 4100.1 drives write select line TWL of storage cell column MCR12 to be, in the second place, activated into an active state.

Then, not only is the internal row address corresponding to a defective bit detected newly written to storage cell column MCR12 in the second place, but a level of flip-flop circuit SFR12 corresponding to storage cell column MCR12 is also caused to be in a set state.

Thereafter, in a similar manner, each time when defective bits are sequentially detected, storage cell columns are sequentially activated according to the step sequence of case 1 to which first replacement determination section 4100.1 corresponds if an internal row address or internal column address held already in a storage cell column does not coincide with an internal row address or internal column address corresponding to a defective memory cell detected newly, each time when the defective memory cell is sequentially detected,.

On the other hand, first replacement determination section 4100.1 does not perform activation of a storage cell column corresponding to a next turn if an internal row address or internal column address held already in a storage cell column coincides with an internal row address or internal column address corresponding to a defective memory cell detected newly.

Finally, when normal memory cells are inspected in a built-in test, and further if an internal row address and an internal column address of each of all defective memory cells detected sequentially coincide with an internal row address and an internal column address stored already in row address storage section MR1 and the column address storage section CM1, it is determined that all of defective memory cells can be saved through replacement of the defective memory cells with spare rows or spare columns in the sequence corresponding to first replacement determination section 4100.1. The determination result is given to built-in self-test circuit 300 from address replacement determination unit ARD as a repair fail signal RF1.

As described above, configurations similar to that including first replacement determination section 4100.1, row address storage section RM1 and column address storage section CM1, corresponding thereto are provided correspondingly to second replacement determination section 4100.2 to sixth replacement determination section 4100.6, respectively. In addition to this, second replacement determination section 4100.2 to the sixth replacement determination section 4100.6 correspond to cases 2 to 6, respectively, and accordingly, the replacement determination sections sequentially activate storage cell columns of row address storage sections and storage cell columns of column address storage sections according to the respective corresponding sequences.

Therefore, if saving of defective memory cells in normal memory cell array 100R can be performed with spare rows and spare columns, at least one of repair fail signals RF1 to RF6 from first replacement determination section 4100.1 to sixth replacement determination section 4100.6 maintains an inactive state ("L" level) even at the time when the last defective memory cell is detected.

After the test operation ends, an internal row address and an internal column address held in a row address storage section and a column address storage section corresponding to a replacement determination section whose repair fail signal is in an inactive state are read out through built-in self-test circuit 300. A row address and a column address to be replaced can be programmed in spare row address decoder 40S and spare column address decoder 50S according to the internal row address signal and the internal column address signal read out in this way.

Figure 8:
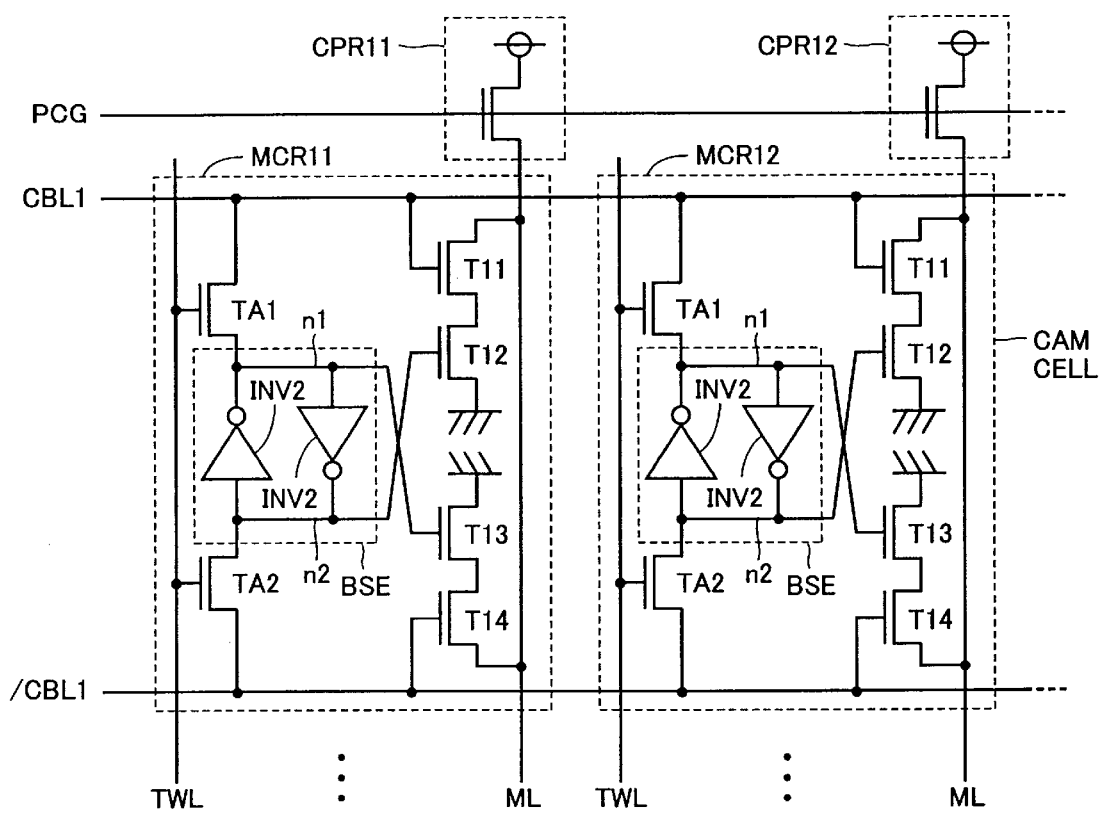
FIG. 8 is a circuit diagram showing a configuration of CAM cells in memory cell columns MCR11 and MCR12.

FIG. 8 is a circuit diagram showing a configuration of CAM cells in memory cell columns MCR11 and MCR12 shown in FIG. 7. Configurations of CAM cells in the other storage cell columns are similar to that of MCR11 and MCR12 shown in FIG. 8.

A CAM cell includes: an address bit line CBL1 for transmitting internal address signal RA9 (generally, an internal row address signal RAi or an internal column address signal CAi, wherein i is a natural number); a storage element BSE constituted of two inverters INV1 and INV2; an N channel access transistor TA1 for connecting a storage node n1 of storage element BSE and address bit line CBL1 according to a level of a signal line TWL; an address bit line /CBL1 for transmitting address signal RA9 and complementary internal address /RA9 (generally, an internal row address signal /RAi or an internal column address signal /CAi); an N channel access transistor TA2 for connecting a storage node n2 of storage element BSE and address bit line /CBL1 according to a level of signal line TWL; N channel transistors T11 and T12 connected in series between coincidence detection line ML and ground potential; and transistors T13 and T14 connected in series between coincidence detection line ML and ground potential.

The gate of transistor T11 is connected to address bit line CBL1 and the gate of transistor T12 is connected to storage node n2 of storage element BSE.

The gate of transistor T13 is connected to storage node n1 of storage element BSE and the gate of transistor T14 is connected to address bit line /CBL1.

That is, storage element BSE is connected to address bit lines CBL1 and /CBL1 according to activation of write select line TWL. On the other hand, when data held in storage element BSE and internal address signal on address bit line CBL1 or /CBL1 do not coincide with each other, coincidence detection line ML is discharged by connection of coincidence detection line ML to ground potential through a route including transistors T11 and T12 or transistors T13 and T14.

Figure 9:
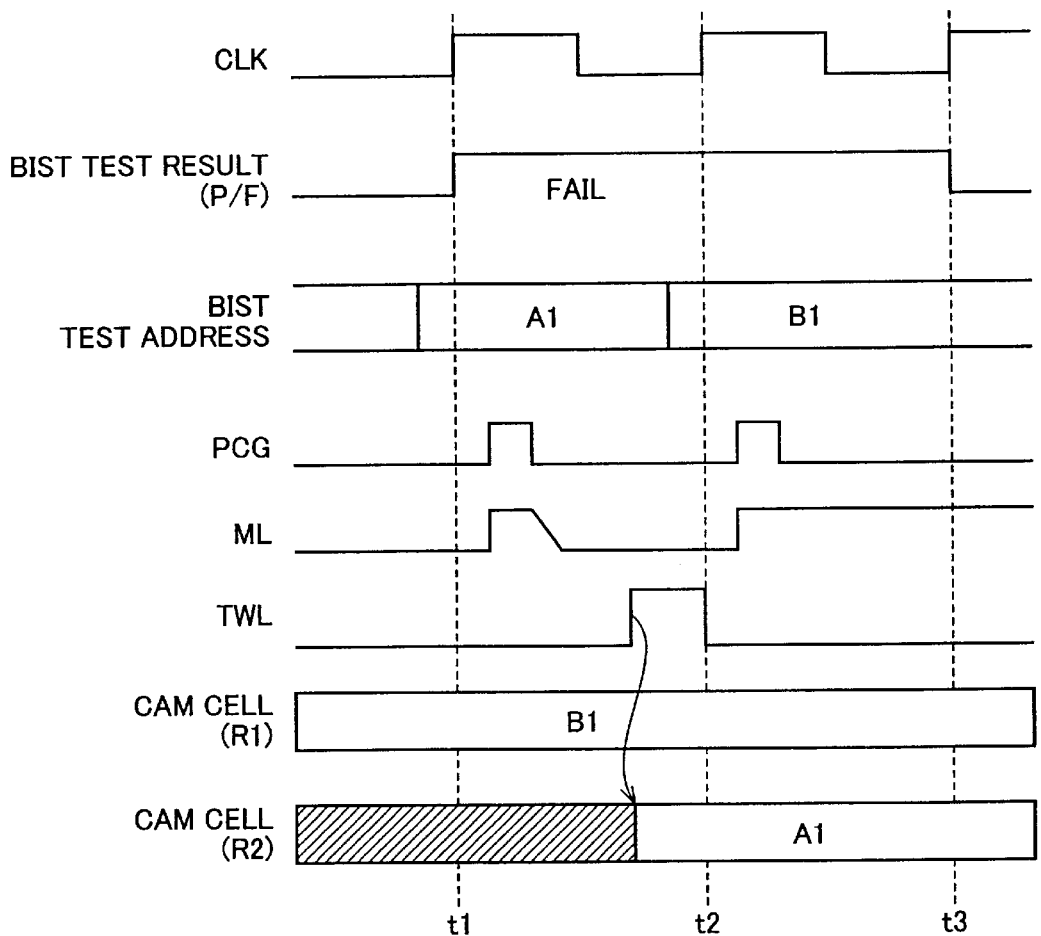
FIG. 9 is a timing chart for describing operation of a CAM cell.

FIG. 9 is a timing chart for describing operation of a CAM cell described in FIGS. 7 and 8.

In FIG. 9, there are shown operations of storage cell columns MCR11 and MCR12 extracted among a CAM cell shown in FIG. 7.

Furthermore, in FIG. 9, it is assumed that storage cell column MCR11 has a row address B1 stored therein in a previous operation.

At a rise edge of clock signal CLK at a time point t1, an address A1 at which built-in self-test is performed and pass/fail signal P/F expressing a result of a built-in self-test are given to a CAM cell from built-in self-test circuit 300. Herein, it is assumed that pass/fail signal P/F is at "H" level showing a defective bit at time point t1, corresponding to that a bit tested at row address A1 is a defective bit as a result of the built-in self-test.

Subsequent to this, precharge signal PCG is at "H" level as a pulse and a level on coincidence detection line ML of storage cell column MCR11 is precharged to "H" level.

After deactivation of precharge signal PCG, a level on coincidence detection line ML of storage cell column MCR11 goes to "L" level since address B1 stored already in a memory cell column and address A1 corresponding to a defective bit detected this time does not coincide with each other.

In response to this, word line TWL of storage cell column MCR12 is activated to "H" level and address A1 is stored into storage cell column MCR12.

In succession, a level of word line TWL comes to be in an inactive state in response to activation of clock signal CLK at time point t2. It is assumed that at this time, B1 is given as an address of a test object to built-in redundancy analysis circuit 400 from built-in self-test circuit 300, a memory cell for a test object is also a defective bit and pass/fail signal P/F is at "H" level.

In response to that precharge signal PCG comes to be at "H" level again, coincidence detection line ML of storage cell column MCR11 goes to "H" level again.

In this case, address B1 given from built-in self-test circuit 300 is the same as that stored already in storage cell column MCR11; therefore, a level of coincidence detection line ML corresponding to storage cell column MCR11 also maintains "H" level after precharge signal PCG goes to "L" level.

Hence, no write operation to a CAM cell for address signal B1 is performed.

In a similar manner, when newly detected is a defective bit having a row address and column address different from respective addresses of each of defective bits detected previously, write of an address to a corresponding memory cell column is performed according to a corresponding replacement sequence, for example the sequence of R→R→C→C.

Operations of CAM cells in the other storage cell columns are similar to the above described.

Figure 10:
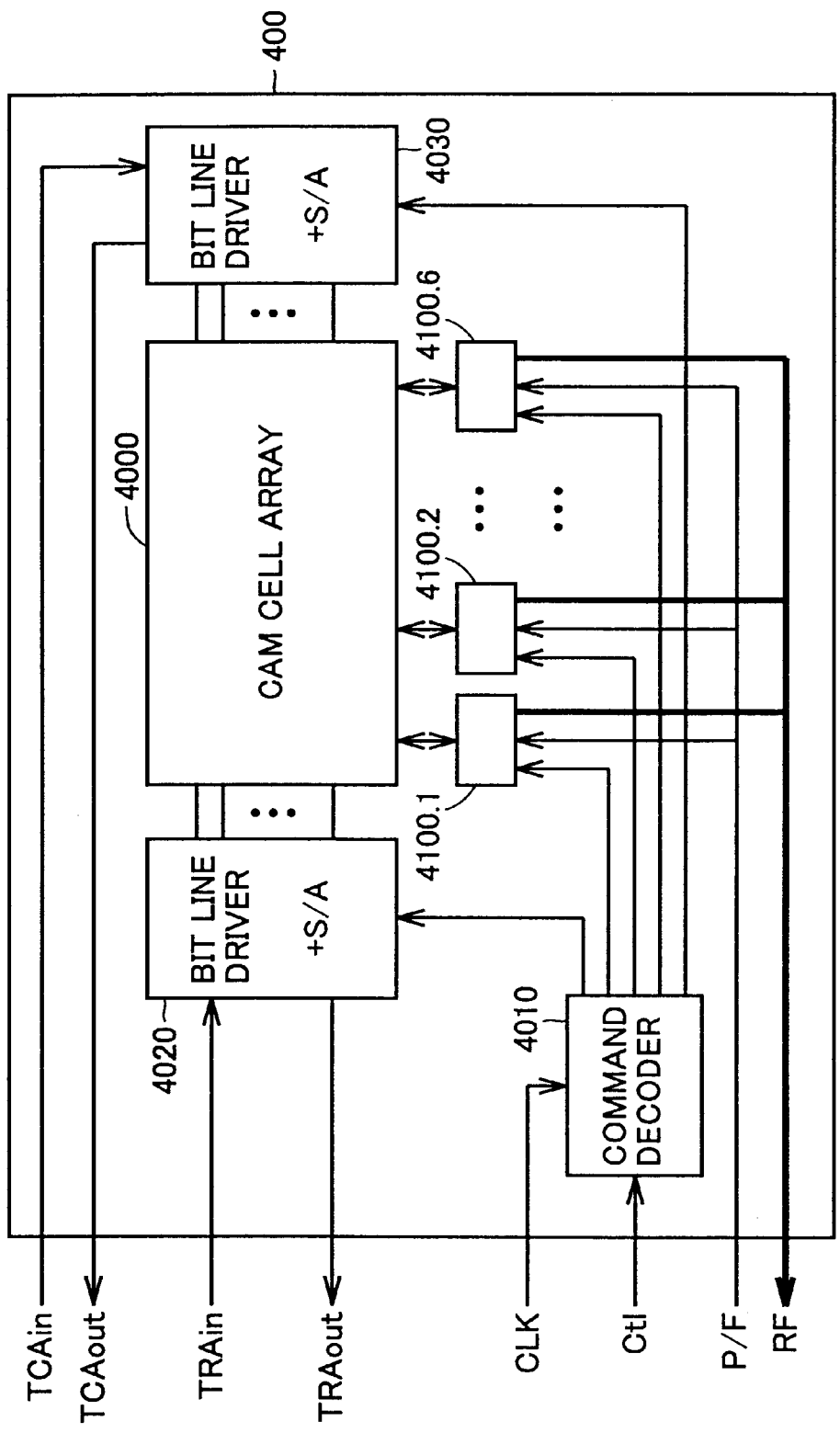
FIG. 10 is a schematic block diagram for describing an overall configuration of a built-in redundancy analysis circuit 400 shown in FIG. 1.

FIG. 10 is a schematic block diagram for describing an overall configuration of built-in redundancy circuit 400 shown in FIG. 1.

In the above description, the configuration is taken up in which determination on possibility of saving by redundancy replacement is performed with the maximum number of spare rows and the maximum number of spare columns (in the above description, two spare rows and two spare columns are available as the maximum numbers). In the following description, a configuration will be taken up in which determination on saving possibility by redundancy replacement is performed with less than the maximum number of spare rows and less than the maximum number of spare columns.

Built-in redundancy analysis circuit 400 includes: a CAM cell array 4000 for storing an address of a normal memory cell at which redundancy replacement is performed; a command decoder 4010 receiving control signal Ctl from built-in self-test circuit 300 in synchronism with clock signal CLK from built-in self-test circuit 300; a bit line driver+ sense amplifier circuit (hereinafter referred to as a bit line drier+S/A circuit) 4020 operating according to setting in a manner consistent with control from command decoder 4010, receiving a row address signal TRAin of a normal memory cell, which is a test object, given from built-in self-test circuit 300 to drive and amplify a bit line potential of CAM cell array 4000, and output a row address stored as a signal TRAout to built-in self-test circuit 300 in a read operation from CAM cell array 4000; a bit line drier+S/A circuit 4030 operating according to setting in a manner consistent with control from command decoder 4010, receiving a column address signal TCAin of a normal memory cell, which is a test object, given from built-in self-test circuit 300 to drive and amplify a bit line potential of CAM cell array 4000 to give the data as a signal TCAout to built-in self-test circuit 300 in a read operation; and replacement determination sections 4100.1 to 4100.6 provided correspondingly to respective combinations possible in replacement sequence with spare rows and spare columns, for controlling data write to CAM cell array 4000 and determining whether or not redundancy saving is possible with a corresponding combination in replacement sequence of spare rows and spare columns.

Each of replacement determination sections 4100.1 to 4100.6 operates according to setting in a manner consistent with control from command decoder 4010 as described later to receive pass/fail signal P/F from built-in self-test circuit 300 and then, perform activation of a word line of CAM cell array 4000 on which write of an address signal is performed in a next turn according to a corresponding combination in replacement sequence of spare rows and spare columns.

When a test by built-in self-test circuit 300 ends, outputted from replacement determination sections 4100.1 to 4100.6 are respective signals RF1 to RF6 (hereinafter referred to as signal RF, collectively) each indicating a result of determination on whether or not replacement saving is possible according to a corresponding combination in replacement sequence of spare rows and spare columns.

Note that while in FIG. 10, the configuration of built-in redundancy analysis circuit 400 is shown in which the maximum number of spare rows is 2 and the maximum number of spare columns is 2, a configuration may be allowed in which when the maximum numbers of spare rows and spare columns provided in each of the DRAM cores are different from those of the others, replacement determination sections may be provided in number of combinations in replacement sequence possible with the maximum numbers of spare rows and spare columns.

[Configuration for Adapting to Change in Memory Capacity of DRAM Core]

Description will be given of a configuration capable of adapting to even a case where a memory capacity of a DRAM core, which is an analysis object for built-in analysis circuit 400, changes and thereby, the number of bits of each of a row address signal and a column address signal also change.

Figure 11:
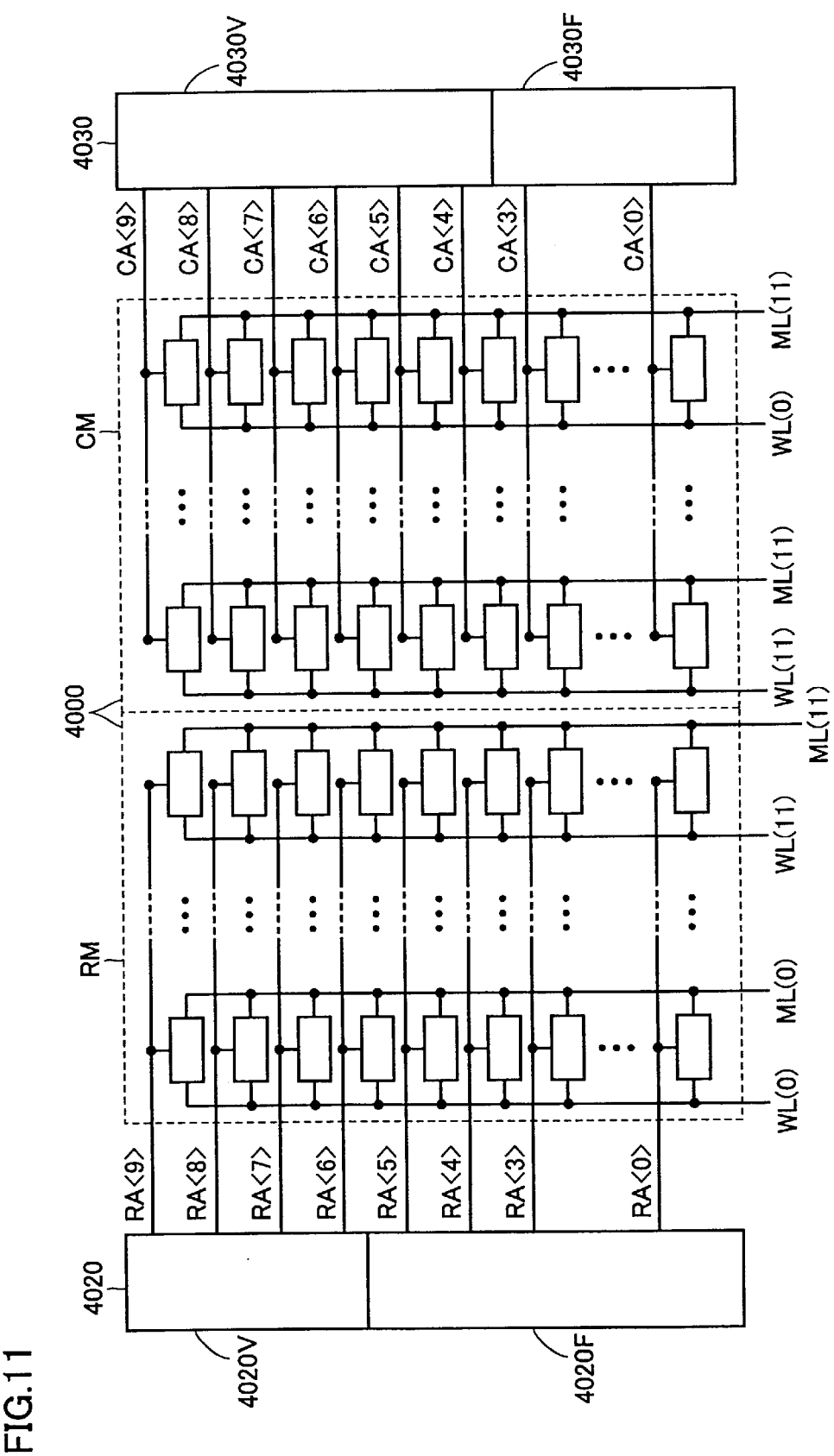
FIG. 11 is a schematic diagram showing a CAM cell array 4000 and bit line driver+S/A circuits 4020 and 4030 extracted.

FIG. 11 is a schematic diagram showing CAM cell array 4000 and bit line driver+S/A circuits 4020 and 4030 shown in and extracted from FIG. 10.

As described in FIG. 7 as well, CAM cell array 4000 includes: CAM cell array RM for storing a row address of a defective bit to be saved through replacement; and CAM cell array CM for storing a column address to be saved through replacement.

CAM cell array RM has a configuration in which 12 storage cell columns in the row direction are included and row addresses RA <0> to RA <9> are given to respective bit lines of CAM cell array RM.

In a similar manner, CAM cell array CM has a configuration in which 12 storage cell columns in the row direction are included and column addresses CA <0> to CA <9> are given to respective bit lines of CAM cell array CM.

Note that in FIG. 1, for simplification of illustration, a complementary bit line pair is depicted with a single line. Therefore, for example, in FIG. 11, the signal RA <0> is actually given to each of CAM cells together with a signal /RA <0> complementary thereto through a bit line pair consisting of two bit lines.

In CAM cell array RM, word lines TWL(0) to TWL(11) and coincidence detection lines ML(0) to ML(11) are provided in the row direction.

In CAM cell array CM as well, word lines TWL(0) to TWL(11) and coincidence detection lines ML(0) to ML(11) are provided in the row direction in a similar manner. Word lines TWL(0) to TWL(11) are hereinafter referred to as word lines TWL collectively and coincidence detection lines ML(0) to ML(11) are hereinafter referred to as coincidence detection lines ML collectively.

CAM cell array 4000 shown in FIG. 11 has a capacity corresponding to the numbers of bits of a row address signal and column address signal of a DRAM core having the maximum memory capacity among DRAM cores 100.1 to 100.n. Therefore, in a case where the DRAM core having the maximum memory capacity, for example DRAM core 100.2 is subjected to redundancy analysis, storage operations for a defective row address and a defective column address are performed using all the memory cells of CAM cell array 4000.

In contrast to this, it is assumed that in a DRAM core having the minimum memory capacity, for example, a row address has the number of bits corresponding to row address signals RA <0> to RA <6> and a column address has the number of bits corresponding to column address signals CA <0> to CA <3>. In this case, a storage operation for defective memory cell row addresses and defective memory cell column addresses has only to be performed using part of the capacity of CAM cell array 4000.

As described above, however, since coincidence detection line ML(0) to ML(11) are connected to all of CAM cells existing in the row direction (the direction of a word line), there is a fear that levels of coincidence detection lines ML(0) to ML(11) and so on are driven according to states of CAM cells corresponding to address signals RA <7> to RA <9> even in a case where only address signals RA <0> to RA <6> are operative as effective addresses.

Therefore, in a case where only bit lines corresponding to address signals RA <0> to RA <6> are made to be effective and write of an address signal is performed to CAM cell array RM, mask operations are necessary to be applied to write operations onto bit lines corresponding to address signals RA <7> to RA <9>.

Considering such a requirement, as described later, a configuration is adopted in which by bit line driver+S/A circuit 4020, potential levels of bit lines corresponding to address signals RA <0> to RA <6> are at all times driven according to address signals given from built-in self-test circuit 300, while, in connection with potential levels of bit lines corresponding to address signals RA <7> to RA <9>, bit lines selected according to control from command decoder 4010 are given address signals from built-in self-test circuit 300 and on the other hand, potential levels of non-selected bit lines are fixedly held.

Hence, bit line driver+S/A circuit 4020 includes: a driver/sense amplifier section 4020F for transmitting address signals from built-in self-test circuit 300 to bit lines corresponding to address signals RA <0> to RA <6> at all times in a write operation; and a driver/sense amplifier section 4020V driving a bit line potential selectively according to setting from command decoder 4010.

In a similar manner, bit line driver+S/A circuit 4030 also includes: a driver/sense amplifier section 4030F for transmitting address signals from built-in self-test circuit 300 to respective bit lines corresponding to address signals CA <0> to CA <3> at all times in a write operation; and driver/sense amplifier section 4030V driving a bit line potential selectively according to setting from command decoder 4010.

Figure 12:
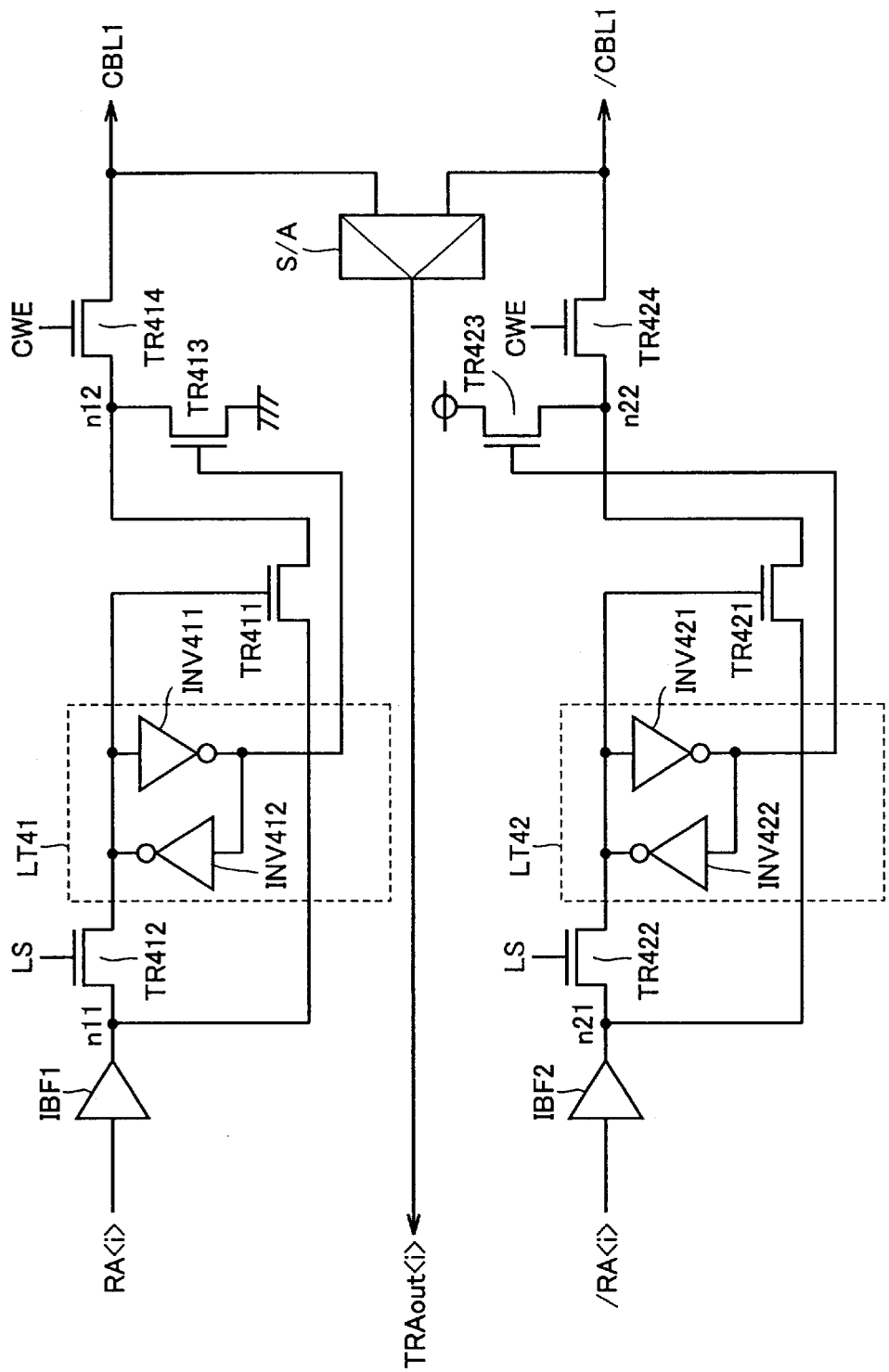
FIG. 12 is a circuit diagram for describing a circuit configuration included in a driver/sense amplifier section 4020V in bit line driver+S/A circuit 4020.

FIG. 12 is a circuit diagram describing a circuit configuration included in driver/sense amplifier section 4020V of bit line driver+S/A circuit 4020 shown in FIG. 11, for driving potential levels of corresponding bit line pair CBL1 and /CBL1 in CAM cell array 4000 and for amplifying data from a CAM cell read out onto bit line pair CBL1 and /CBL1 to output the amplified data as a read address.

Referring to FIG. 12, an input buffer IBF1 receives a column address signal RA <i> to output a result of buffering to an internal node nil. An N channel MOS transistor TR411 is provided between internal node n11 and an internal node 12. An N channel MOS transistor TR412 and a latch circuit LT41 are provided between internal node n1 and the gate of transistor TR411. The gate of transistor 412 receives control signal LS from command decoder 4010. Latch circuit LT41 includes: an inverter INV411 receiving a signal from input buffer IBF1 given through transistor TR412 to invert the signal; and an inverter INV412 receiving an output of inverter INV411 to invert the output and give it to the gate of transistor TR411.

A transistor TR413 is provided between node n12 and ground potential and the gate of transistor TR413 receives an output of inverter INV411.

A transistor TR414 is provided between node n12 and bit line CBL1 and the gate of transistor TR414 receives a signal CWE given from command decoder 4010 for specifying a write timing of data onto bit line CBL1.

Furthermore, an input buffer IBF2 receives a column address signal /RA <i> complementary to column signal RA <i> to output a result of buffering to an internal node n21. An N channel MOS transistor TR421 is provided between internal node n21 and an internal node 22. An N channel MOS transistor TR422 and a latch circuit LT42 are provided between internal node n21 and the gate of transistor TR421. The gate of transistor 422 receives a control signal LS from command decoder 4010. Latch circuit LT42 includes: an inverter INV421 receiving a signal from the input buffer IBF2 given through transistor TR422 to invert the signal; and an inverter INV422 receiving an output of inverter 421 to invert the output and give it to the gate of transistor TR421.

A transistor TR423 is provided between node n22 and power source potential and the gate of transistor TR423 receives an output of inverter INV421.

An N channel transistor TR424 is provided between node n22 and bit line /CBL1 and the gate of transistor TR424 receives signal CWE given from command decoder 4010 for specifying a write timing of data onto bit line /CBL1.

A sense amplifier S/A amplifies a potential difference level generated between bit line pair CBL1 and /CBL1 to output a result of the amplification as the ith bit signal TRAout <i> among read addresses TRAout.

Configurations similar to the above described are also provided corresponding to other bit line pairs of driver/sense amplifier section 4020V. Furthermore, similar configurations are also provided to driver/sense amplifier section 4030V.

Data writes to latch circuits LT41 and LT42 are performed for mask operations according to activation of control signal LS.

Figure 13:
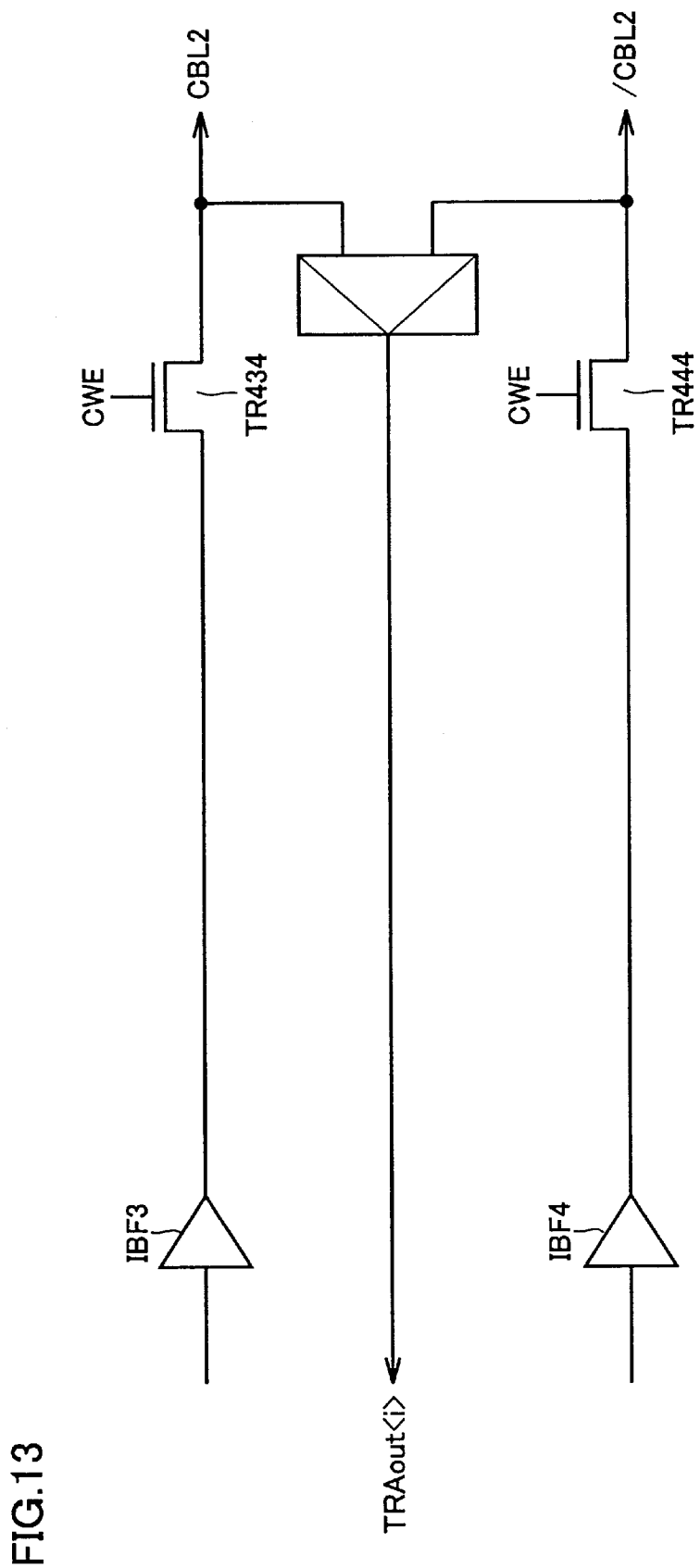
FIG. 13 is a circuit diagram for describing a circuit configuration included in a driver/sense amplifier section 4020F in bit line driver+S/A circuit 4020.

FIG. 13 is a schematic block diagram for describing a circuit configuration, included in driver/sense amplifier section 4020F in the ,configuration shown in FIG. 11, for driving potential levels of corresponding bit line pair CBL2 and /CBL2 in CAM cell array 4000, to amplify read data from the bit line pair and output the amplified data.

An input buffer IBF3 receives a row address signal RA <j> to drive a potential level of a bit line CBL2 through an N channel MOS transistor TR434. In a similar manner, a input buffer IBF4 receives an address signal /RA <j> complementary to row address signal RA <j> to drive a potential level of a bit line /CBL2 through a transistor 444.

The gates of transistors TR434 and TR444 receive control signal CWE.

Sense amplifier S/A amplifies a potential difference between bit lines CBL2 and /CBL2 to output a result of the amplification as the jth bit signal TRAout <j> among read addresses TRAout.

Next, simple description will be given of operation of the circuit shown in FIG. 12.

First of all, in a case where a setting operation of bit line driver+S/A circuit 4020 is performed according to control signal Ctl from built-in self-test circuit 300, signal LS outputted from command decoder 4010 enters an active state.

In response to this, command decoder 4010 further gives signals RA <i> and /RA <i> both of "H" levels to latch circuits LT41 and LT42 through respective input buffers IBF1 and IBF2 in a case where bit lines CBL1 and /CBL1 are put in a service state.

Since latch circuits LT41 and LT42 hold the potential levels, transistors TR411 and TR421 enter a conducting state, while transistors TR413 and TR423 enter a cut-off state.

Accordingly, for example, data given through input buffer IBF1 is given to node n12 through transistor TR411 and further given onto bit line CBL1 with signal CWE entering an active state ("H" level).

On the other hand, in a setting operation of bit line driver+S/A circuit 4020, in connection with bit lines caused to be put in a non-service state, command decoder 4010 raises control signal LS to "H" level, furthermore, causes signals RA <i> and /RA <i> to be both at "L" level and thereby, causes latch circuits LT41 and LT42 to hold the "L" level. By doing so, transistors TR411 and TR421 are put into a cut-off state, while transistors TR413 and TR423 are put into a conducting state.

Therefore, in connection with bit line pairs in a non-service state, "L" level and "H" level are given onto corresponding each pair, respectively, of bit line pairs regardless of output levels from input buffers IBF1 and IBF2 when signal CWE enters an active state ("H" level) in a write operation.

[Configuration for Adapting to Change in Numbers of Spare Rows and Spare Columns]

Figure 14:
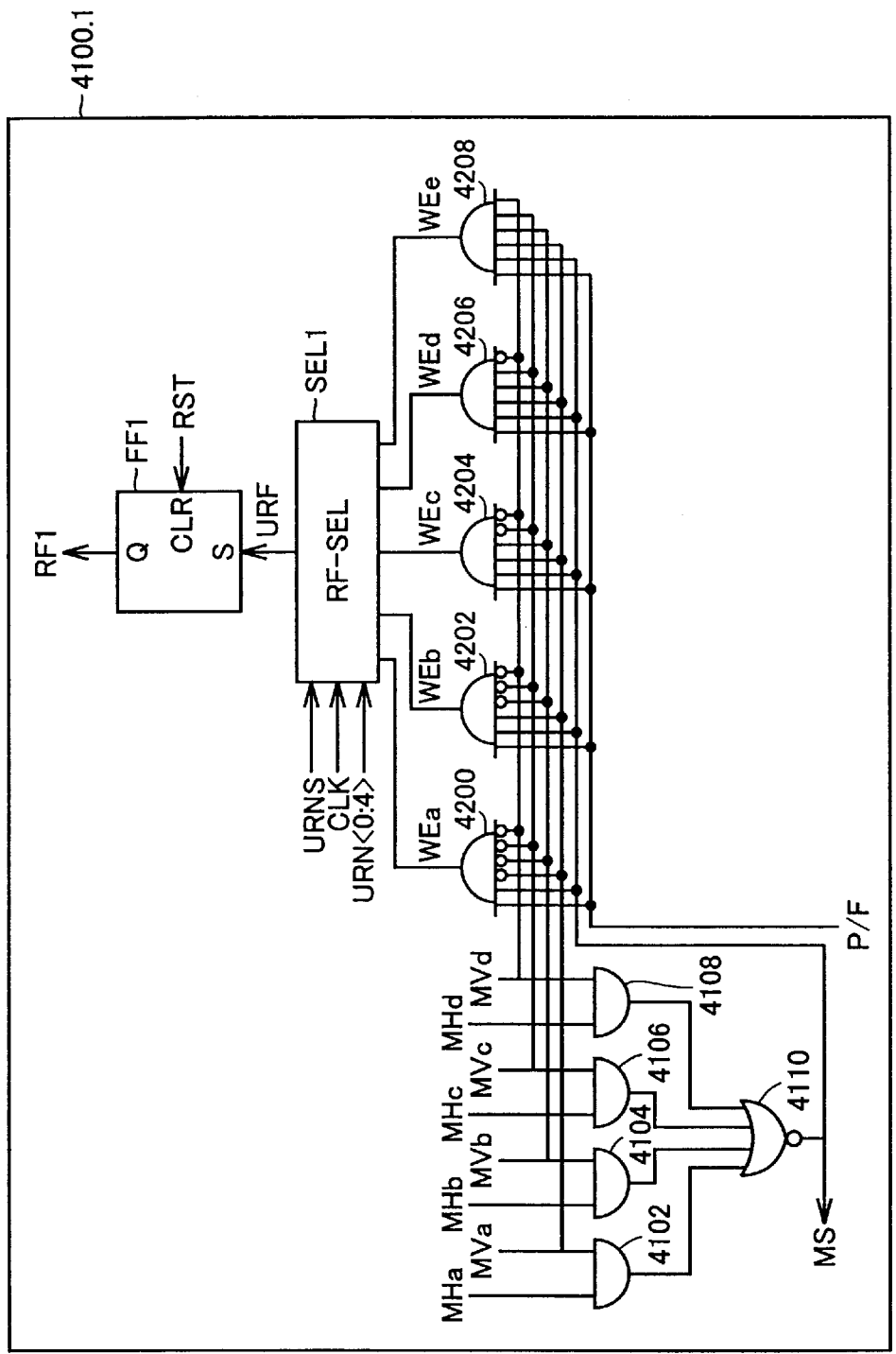
FIG. 14 is a schematic block diagram for describing a configuration of a replacement determination section 4100.1 shown in FIG. 10.

FIG. 14 is a schematic block diagram for describing a configuration of replacement determination section 4100.1 shown in FIG. 10.

FIG. 14 is a schematic block diagram for describing a first replacement determination section 4100.1.

Configurations of second replacement determination section 4100.2 to sixth replacement determination section 4100.6 are fundamentally similar to the configuration of first replacement determination section 4100.1 with the exception that only storage columns connected in each section are different.

First replacement determination section 4100.1 includes: an AND circuit 4102 to the input nodes of which coincidence detection line ML of storage cell column MCR11 and the output of flip flop circuit SFR11 are connected; an AND circuit 4104 to the input nodes of which coincidence detection line ML of storage cell column MCR12 and the output of flip flop circuit SFR12 are connected; an AND circuit 4106 to the input nodes of which coincidence detection line ML of storage cell column MCC11 and the output of flip flop circuit SFC11 are connected; an AND circuit 4108 to the input nodes of which coincidence detection line ML of storage cell column MCC12 and the output of flip flop circuit SFC12 are connected; and a 4-input NOR circuit 4110 receiving outputs of AND circuits 4102 to 4108 to output a signal MS.

Hereinafter, input nodes connected to coincidence detection lines among the input nodes of AND circuits 4102 to 4108 of first replacement determination section 4100.1 are referred to as nodes MHa, MHb, MHc and MHd and input nodes connected to the outputs of flip-flop circuits SFR11 to SFR12 are referred to as nodes MVa, MVb, MVc and MVd.

First replacement determination section 4100.1 further includes: a logic gate 4200 receiving an inverted signal of a level of node MVa, an inverted signal of a level of node MVb, an inverted signal of a level of MVc and an inverted signal of a level of MVd, a signal MS and pass/fail signal P/F to output a logical product of the signals as a write select signal WEa given to a write select line TWL of storage cell column MCR11; a logic gate 4202 receiving a signal of a level of node MVa, an inverted signal of a level of node MVb, an inverted signal of a level of node MVc and an inverted signal of a level of node MVd, signal MS and pass/fail signal P/F to output a logical product of the signals as a write select signal WEb given to write select line TWL of storage cell column MCR12; a logic gate 4204 receiving a signal of a level of node MVa, a signal of a level of node MVb, an inverted signal of a level of node MVc and an inverted signal of a level of node MVd, signal MS and pass/fail signal P/F to output a logical product of the signals as a write select signal WEc given to write select line TWL of storage cell column MCC11; and a logic gate 4206 receiving a signal of a level of node MVa, a signal of a level of node MVb, a signal of a level of node MVc and an inverted signal of a level of node MVd, signal MS and pass/fail signal P/F to output a logical product of the signals as a write select signal WEd given to write select line TWL of storage cell column MCC12.

First replacement determination section 4100.1 further includes: a 6-input AND circuit 4208 receiving a level of node MVa, a level of node MVb, a level of node MVc and a level of node MVd, signal MS and pass/fail signal P/F to output a logical product of the signals as a signal WEe; a select tq; circuit SE11 outputting a signal selected from among signals WEa to WEe as a signal URF according to control signals URNS and URN <0:4> from command decoder 4010; and a flip-flop circuit FF1 being reset according to reset signal RST, and being set according to signal URF to output repair fail signal RF1 for case 1.

Figure 15:
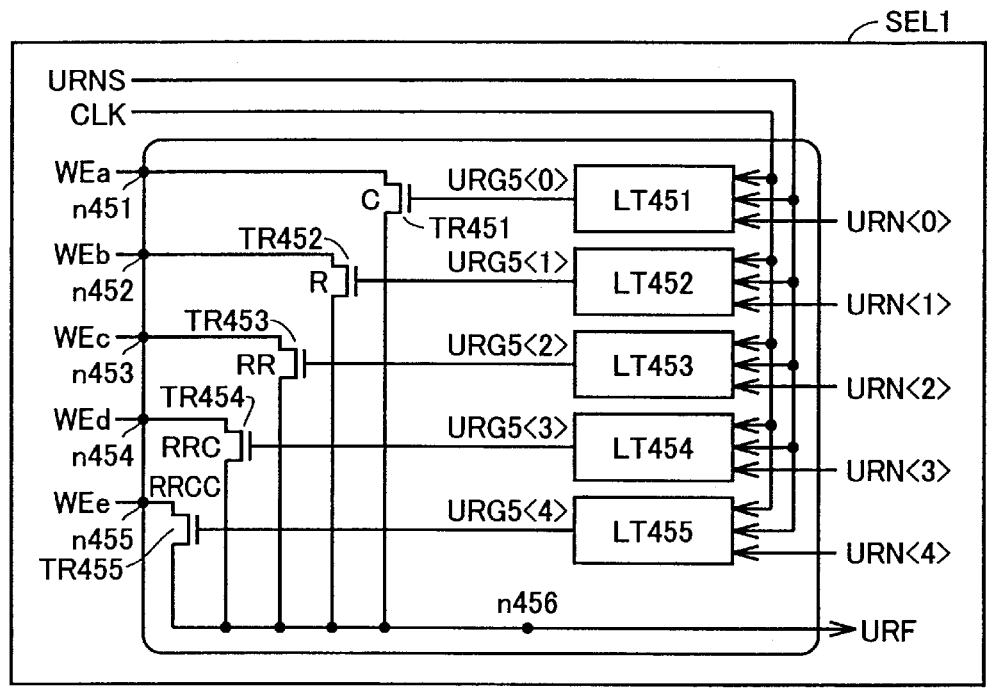
FIG. 15 is a schematic block diagram for describing a configuration of a select circuit SEL1 shown in FIG. 14.

FIG. 15 is a schematic block diagram for describing a configuration of a select circuit SEL1 shown in FIG. 14.

Referring to FIG. 15, select circuit SEL1 includes: an N channel MOS transistor TR451 provided between a node n451 receiving signal WEa and a node n456 outputting signal URF to flip-flop circuit FF1; an N channel MOS transistor TR452 provided between a node n452 receiving signal WEb and a node n456; an N channel MOS transistor TR453 provided between a node n453 receiving signal WEc and node n456; an N channel MOS transistor TR454 provided between a node n454 receiving signal WEd and node n456; an N channel MOS transistor 455 provided between a node n455 receiving signal WEe and node n456; and latch circuits LT451 to LT454, provided correspondingly to respective transistors TR451 to TR455, and holding levels of signals URN <0> to URN <4> given from command decoder 4010 at the time when being activated by control signal URNS and clock signal CLK from the command decoder 4010. Latch circuits LT451 to LT454 output signals URGS <0> to URGS <4> for controlling gate potentials of respective transistors TR451 to TR455.

Therefore, a configuration is adopted that a step of the corresponding replacement sequence, as a position in the order, of replacement determination section 4100.1 in which step replacement has been ended and determination is performed on whether or not redundancy saving is possible is switched, according to a level of signal URN <0> to URN <4>, as described in FIGS. 6A to 6C.

For example, in a case where signal URSG <4> is activated and the other signals URGS <0> to URGS <3> are in an inactive state, only transistor TR455 is in a conducting state and a level of signal WEe indicating whether or not redundancy saving has been performed in replacement of the sequence "RRCC" is given to flip-flop circuit FF1 as signal URF.

In contrast to this, in a case where signal URGS <3> is in an active state and the other signals URGS <0> to URGS <2> and signal URGS <4> are in an inactive state, only transistor TR454 is in a conducting state and a level of signal WEd is given to flip-flop circuit FF1 as signal URF. That is, in this case, a determination result on whether or not replacement is possible in a replacement sequence of "RRC" is given to flip-flop circuit FF1.

Figure 16:
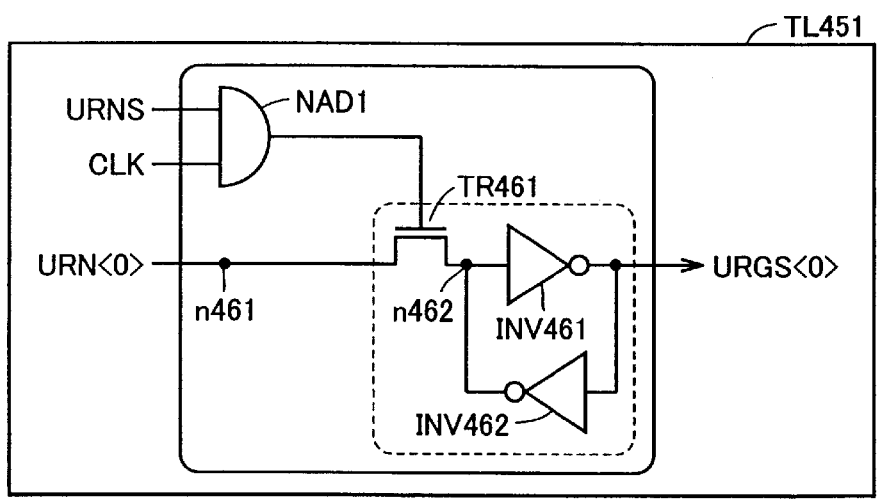
FIG. 16 is schematic block diagram for describing a configuration of a latch circuit LT451 shown in FIG. 15.

FIG. 16 is schematic block diagram for describing a configuration of latch circuit LT451 shown in FIG. 15. Configurations of the other latch circuits LT452 to LT455 are also similar to the configuration of latch circuit LT451 each with the exception that a receive signal and outputted signal are different from latch circuit LT451.

Latch circuit LT451 includes: a NAND circuit NAD1 receiving signal URNS and clock signal CLK; a transistor TR461 receiving an output of NAND circuit NAD1 and provided between a node n461 receiving signal URN <0> and a internal node n462; an inverter INV461 receiving a potential level of internal node n462 to output signal URSG <0>; and an inverter INV462 receiving an output of inverter INV461 and for driving a potential level of internal node n462.

Figure 17:
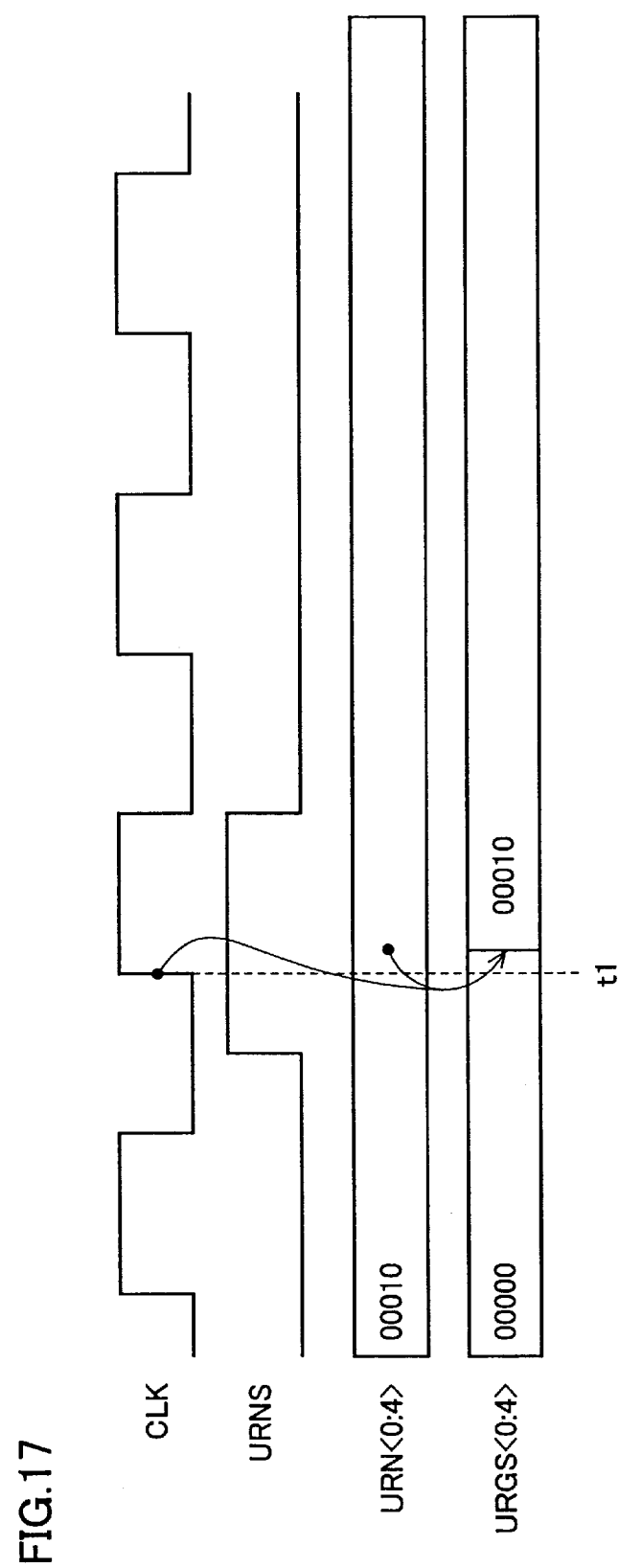
FIG. 17 is a timing chart for describing operation when select circuit SEL1 is set according to a control signal from a command decoder 4010.

FIG. 17 is a timing chart for describing operation when select circuit SEL1 shown in FIG. 15 is set according to a control signal from command decoder 4010.

It is assumed that at an activation edge of signal CLK at a time point t1, signal URNS given from command decoder 4010 is at "H" level in an active state.

It is further assumed that at this time, signal URN <0;4> (each of signals URN <0> to URN <4> is collectively referred to as signal URN <0:4>) given from command decoder 4010 is "00010".

Hence, in response to this, signal URGS <0;4> (each of signals URGS <0> to URGS <4> is collectively referred to as signal URGS <0;4>) outputted from latch circuits LT451 to LT455 is also set to "00010."

With signal URGS <0:4> applied, only transistor TR454 enters a conducting state and a level of an output of flip-flop circuit FF1 is set according to whether or not replacement is possible with sequence "RRC".

It is again assumed that similar configurations are provided in the other replacement determination section 4100.2 to 4100.6.

Figure 18:
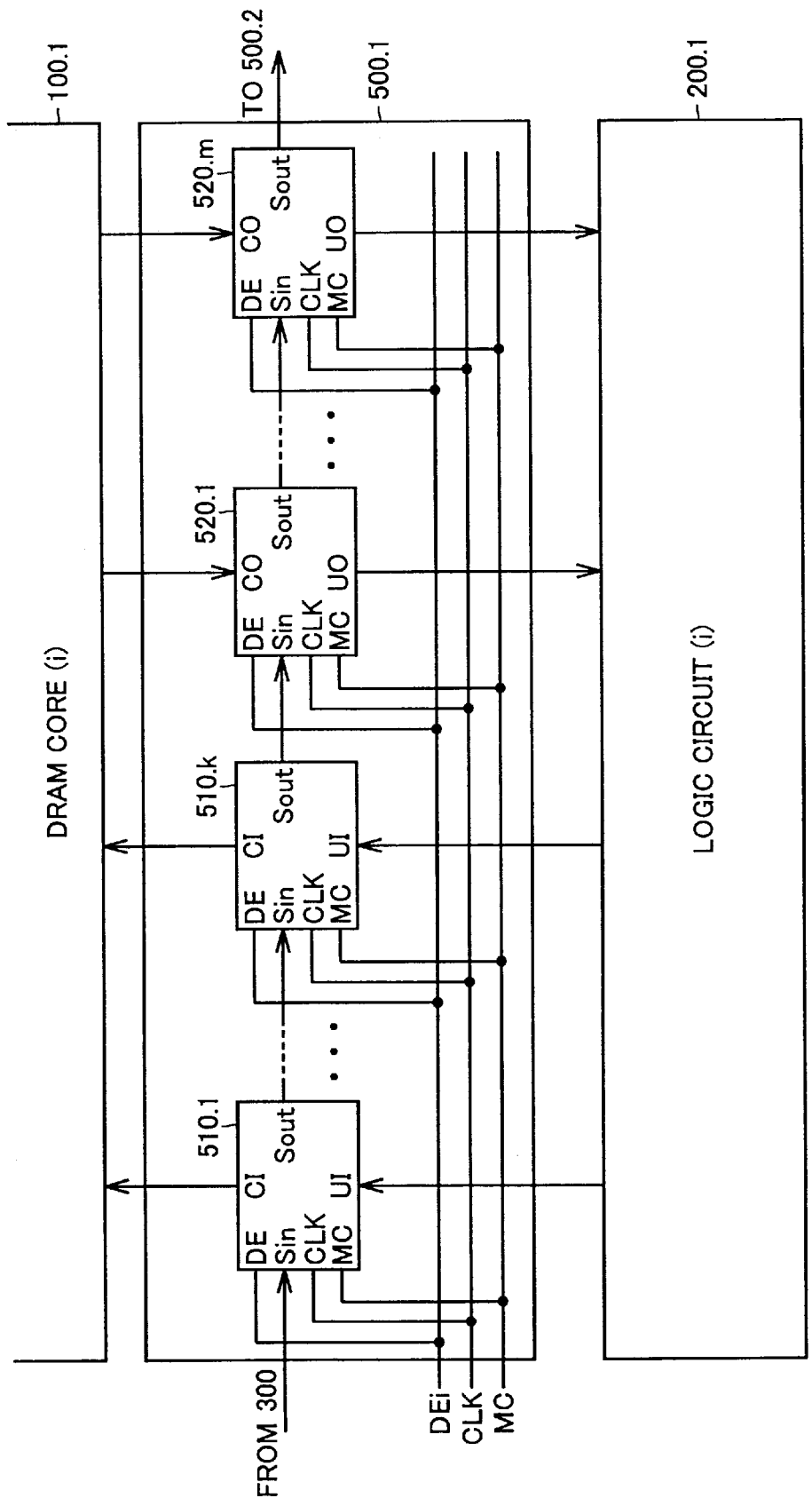
FIG. 18 is a schematic block diagram for describing a configuration of a flip-flop circuit 500.1 shown in FIG. 1.

FIG. 18 is a schematic block diagram for describing a configuration of flip-flop circuit 500.1 shown in FIG. 1.

Configurations of the other flip flop circuits 500.2 to 500.n are fundamentally similar to that of flip-flop circuit 500.1.

A signal inputted to corresponding DRAM core 100.1 from logic circuit 200.1 is transmitted through select circuits 510.1 to 510.k (k is a natural number). On the other hand, a signal given to logic circuit 200.1 from DRAM core 100.1 is transmitted through select circuits 520.1 to 520.m (m is a natural number).

Select circuits 510.1 to 510.k and 520.1 to 520.m are serially connected to each other and sequentially transmits signals from built-in self-test circuit 300 therethrough and select circuit 520.m transmits the signals given from built-in self-test circuit 300 to the next flip-flop circuit 500.2.

Herein, for example, select circuit 510.1 is controlled according to control signal DE1, clock signal CLK and mode command MC, wherein in an ordinary operation, select circuit 510.1 receives a signal from logic circuit 100.1 at a node U1 thereof to output data to DRAM core 100.1 from a node C1, while in a test operation, after inputting of a series of serial data to an input node Sin thereof from built-in self-test circuit 300 is completed, select circuit 510.1 outputs data held therein among the serial data to DRAM core 100.1 from node C1. This applies to the other select circuits 510.2 to 510.k in a similar manner.

On the other hand, select circuit 520.1 is also controlled by signal DE1, signal CLK and signal MC and in the ordinary operation, receives data from DRAM core 100.1 at a node CO thereof to output data to logic circuit 200.1 from a node UO thereof, while in the test operation, after receiving data from DRAM core 100.1 and holding the data, select circuit 520.1 outputs data held from a node Sout. In this manner, data outputted from node Sout of select circuit 520.1 is transmitted serially through flip-flop circuits 500.1 to 500.n and finally inputted to a node SDin of built-in self-test circuit 300. This applies to the other select circuits 520.2 to 520.m in a similar manner.

Figure 19:
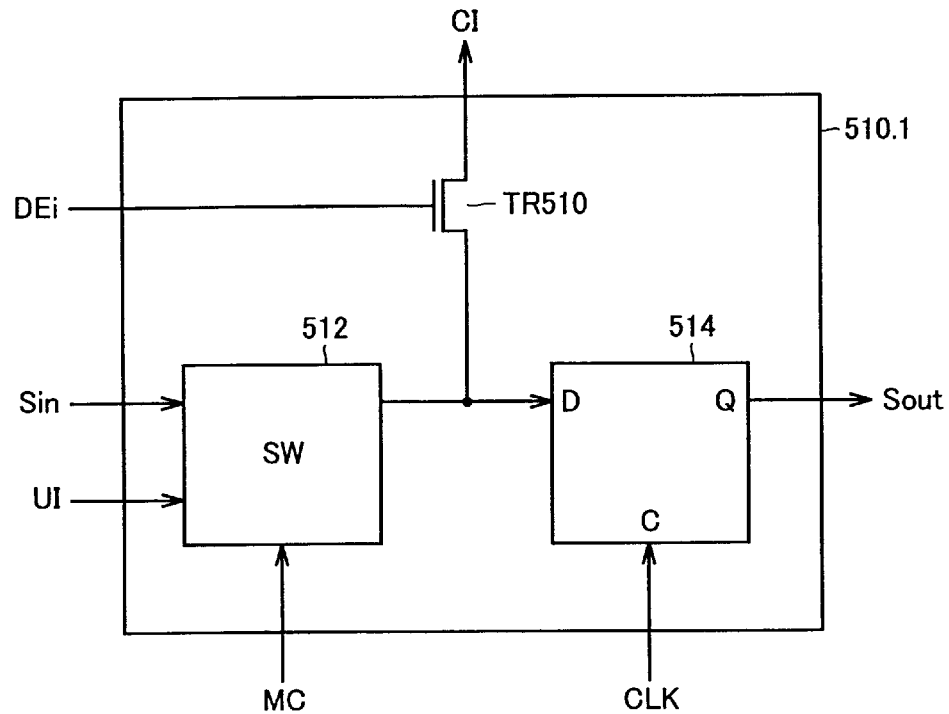
FIG. 19 is a schematic block diagram for describing a configuration of a select circuit 510.1.

FIG. 19 is a schematic block diagram for describing a configuration of select circuit 510.1 shown in FIG. 18. Configurations of the other select circuits 510.2 to 510.k are fundamentally similar to that of the select circuit 510.1.

Select circuit 510.1 includes: a switch circuit 512 receiving serial data from built-in self-test circuit 300 given to node Sin and a signal given from logic circuit 100.1 to node UI to select one of the serial data and the signal according to mode command MC and output the select one; a transistor TR510 provided between the output node of switch circuit 512 and node CI and being controlled by signal DE1 received at the gate thereof; and a D flip-flop circuit 514 operating with signal CLK as a clock signal and receiving an output from switch circuit 512 to hold it therein and output the holding data to node Sout.

Figure 20:
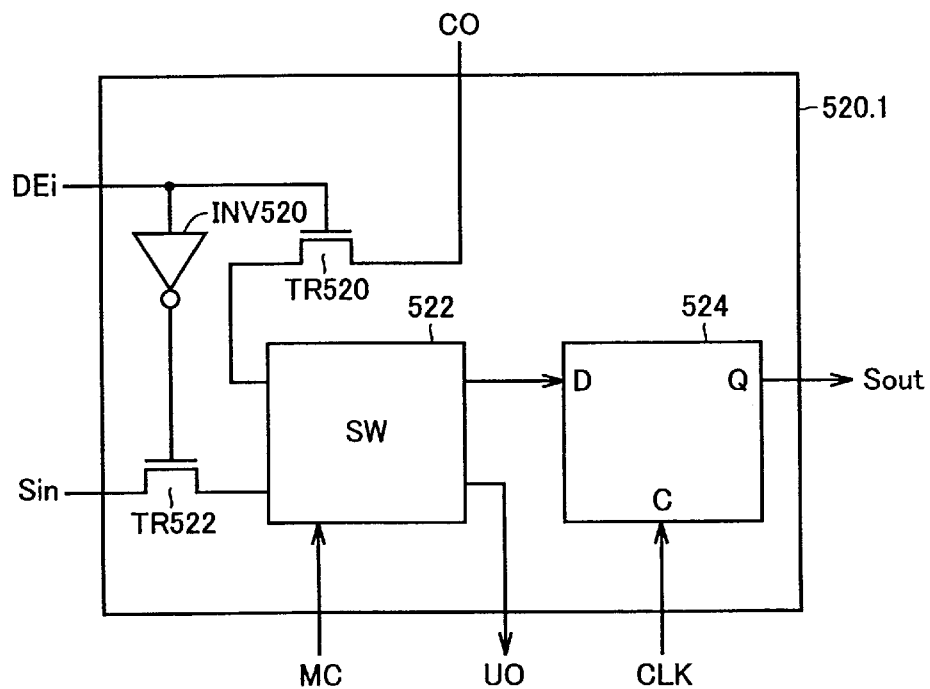
FIG. 20 is a schematic block diagram for describing a configuration of a select circuit 520.1.

FIG. 20 is a schematic block diagram for describing a configuration of select circuit 520.1 shown in FIG. 18. Configurations of the other select circuits 520.2 to 510.m are fundamentally similar to that of the select circuit 520.1.

Select circuit 520.1 includes: a switch circuit 522 controlled by mode command MC; a transistor TR520 provided between one input node of switch circuit 522 and node CO receiving data from DRAM core 100.1 and receiving signal DE at the gate thereof; a transistor TR522 provided between node Sin receiving serial data and the other input node of switch circuit 522 and receiving an output from inverter INV520 inverting signal DE1 at the gate thereof; and a D flip-flop circuit 524 receiving an output from switch circuit 522 in a test operation and operating with signal CLK as a clock to give serial data output to output node Sout.

Switch circuit 522 gives data given from transistor TR520 to output node UO according to mode command MC in the ordinary operation mode. Switch circuit 522 outputs data given through transistor TR520 to D flip-flop circuit 524 in a period when signal DE1 is active ("H" level) in the test operation mode specified by mode command MC, while outputting data given through transistor TR522 to D flip-flop circuit 524 in a period when signal DE1 is inactive ("L" level).

With such configurations of flip-flop circuits 500.1 to 500.n adopted, a circuit configuration for supplying/receiving data between built-in self-test circuit 300 and a DRAM core, which is a test object, can be simplified, thereby enabling reduction in chip area.

[Operations of Built-in Self-Test Circuit 300/Built-in Redundancy Analysis Circuit 400]

Figure 21:
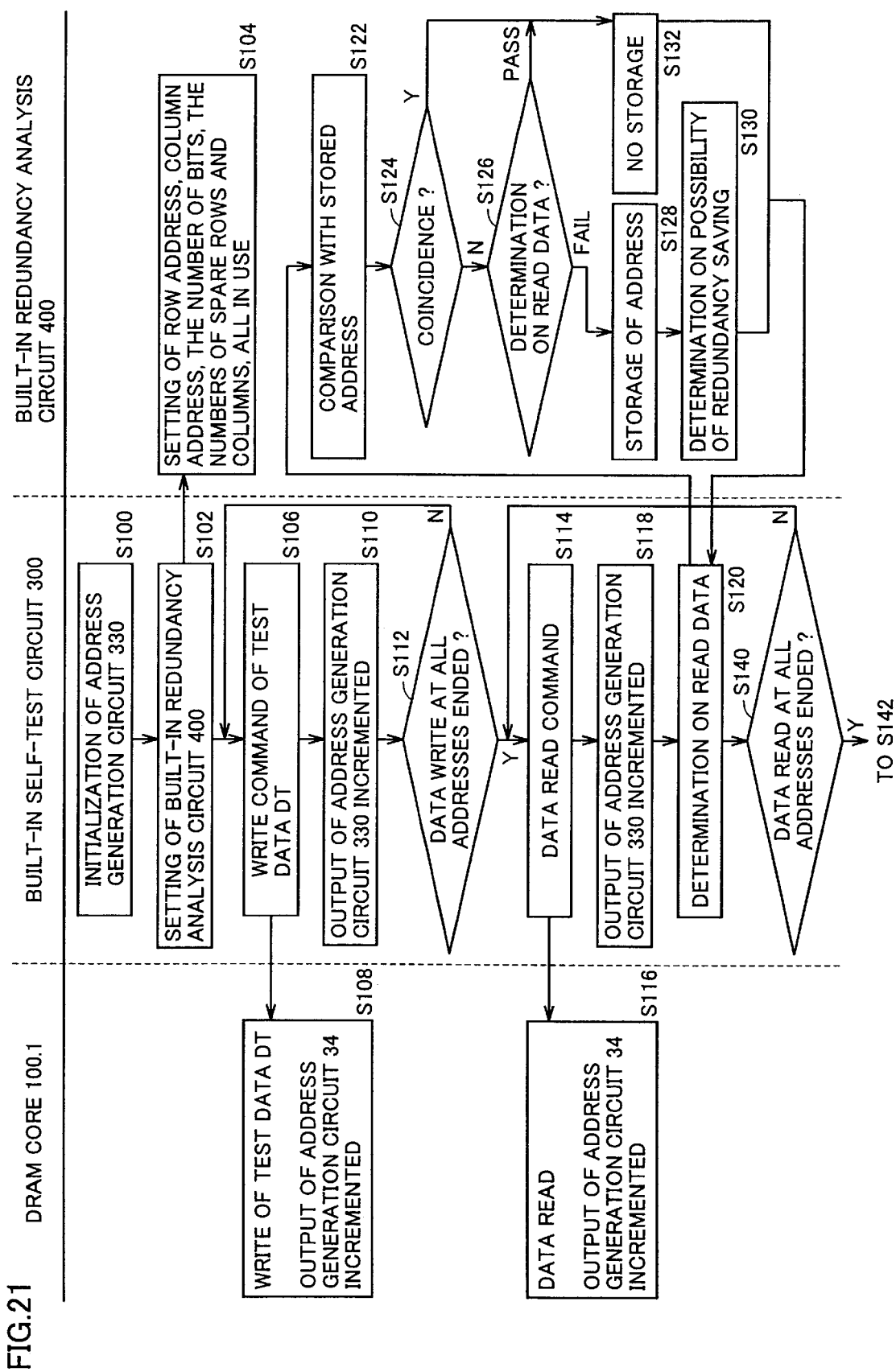
FIG. 21 is a first flow chart for describing operation of a built-in self-test circuit 300 and a built-in redundancy analysis circuit 400.
Figure 23:
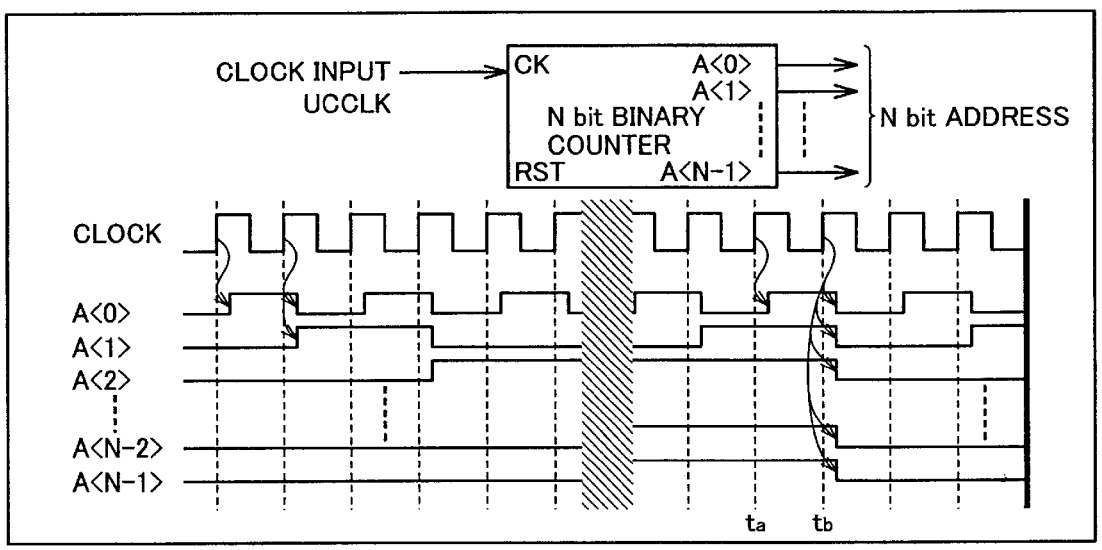
FIG. 23 is a timing chart for describing operation of an address generation circuit 34 shown in FIG. 2.

FIGS. 21 and 23 are flow charts for describing operations of built-in self-test circuit 300 and built-in redundancy analysis circuit 400, as described above.

First of all, referring to FIG. 21, built-in self-test circuit 300 not only performs initialization of an address value generated in address signal generation circuit 330 according to a memory capacity of a DRAM core, which is a test object, for example DRAM core 100.1, but also sets a value of the maximum address in the maximum address register 342 (step S100).

Subsequent to this, built-in self-test circuit 300 outputs a setting instruction for specifying a setting operation for a bit line used in bit line driver+S/A circuits 420 and 430 of built-in redundancy analysis circuit 400 and which replacement sequence determination on whether or not redundancy saving is possible in is performed in each of replacement determination circuits 4100.1 to 4100.6 (step S102). In response to this, performed in built-in redundancy analysis circuit 400 are setting operations for latch circuits LT41 and LT42 of bit line driver+S/A circuits 420 and 430 and setting operations for latch circuits LT451 to LT455 of select circuit SEL1 (step S104).

Then, built-in self-test circuit 300 gives serial test data to flip-flop circuits 500.1 to 500.n to instruct a write operation (step S106). In response to this, in DRAM core 100.1, write of test data is performed and an output of address generation circuit 34 is incremented (step S108). An output of address generation circuit 330 is also incremented in built-in self-test circuit 300 (step S110).

In succession, determination is performed on whether or not writes of test data have been completed at all of addresses (step S112). Such a write of test data is repeated till writes on all of the memory cells of DRAM core 100.1, which is a test object, are completed.

Subsequent to this, reset by reset signal RST are address generation circuit 330 of built-in self-test circuit 300 and address generation circuit 34 of DRAM core 100.1.

Furthermore, in built-in self-test circuit 300, serial data is given to flip-flop circuits 500.1 to 500.n to thereby give a read command to DRAM core 100.1, which is a test object (step S114). Data read is performed from DRAM core 100.1 and an output of address generation circuit 34 is incremented (step S116). In built-in self-test circuit 300 as well, an output of address generation circuit 330 is incremented (step S118).

Read data is read into built-in self-test circuit 300 by a shift operation. Comparison is performed on the read data in a comparator 360 and a determination result is outputted to built-in redundancy analysis circuit 400 as pass/fail signal P/F (step S120).

Comparison is performed between address data stored already in CAM cell array 4000 and an address of a defective bit detected newly in built-in redundancy analysis circuit 400 (step S122). If in coincidence (step S124), then any of a write operation of an address and so on is performed to CAM cell array 4000 (step S132).

In contrast to this, in case where not in coincidence (step S124) and further if a determination result on read data is not good (fail), an address is stored into CAM cell array 4000 (step S128) and determination is performed on whether or not replacement saving is possible in a corresponding replacement sequence (step S130) according to whether the determination result on read data is good (pass) or not good (fail) in each of replacement judgment sections 4100.1 to 4100.6.

On the other hand, further if a determination result on read data is good (step S124), any of a write operation of an address and so on is not performed to CAM cell array 4000 (step S132).

Then, determination is performed on whether or not data reads and determinations thereon are completed at all of addresses (step S140) and an operation from step S114 to step S140 is repeated till the operations on all the memory cells of the DRAM core, which is a test object, are completed.

Figure 22:
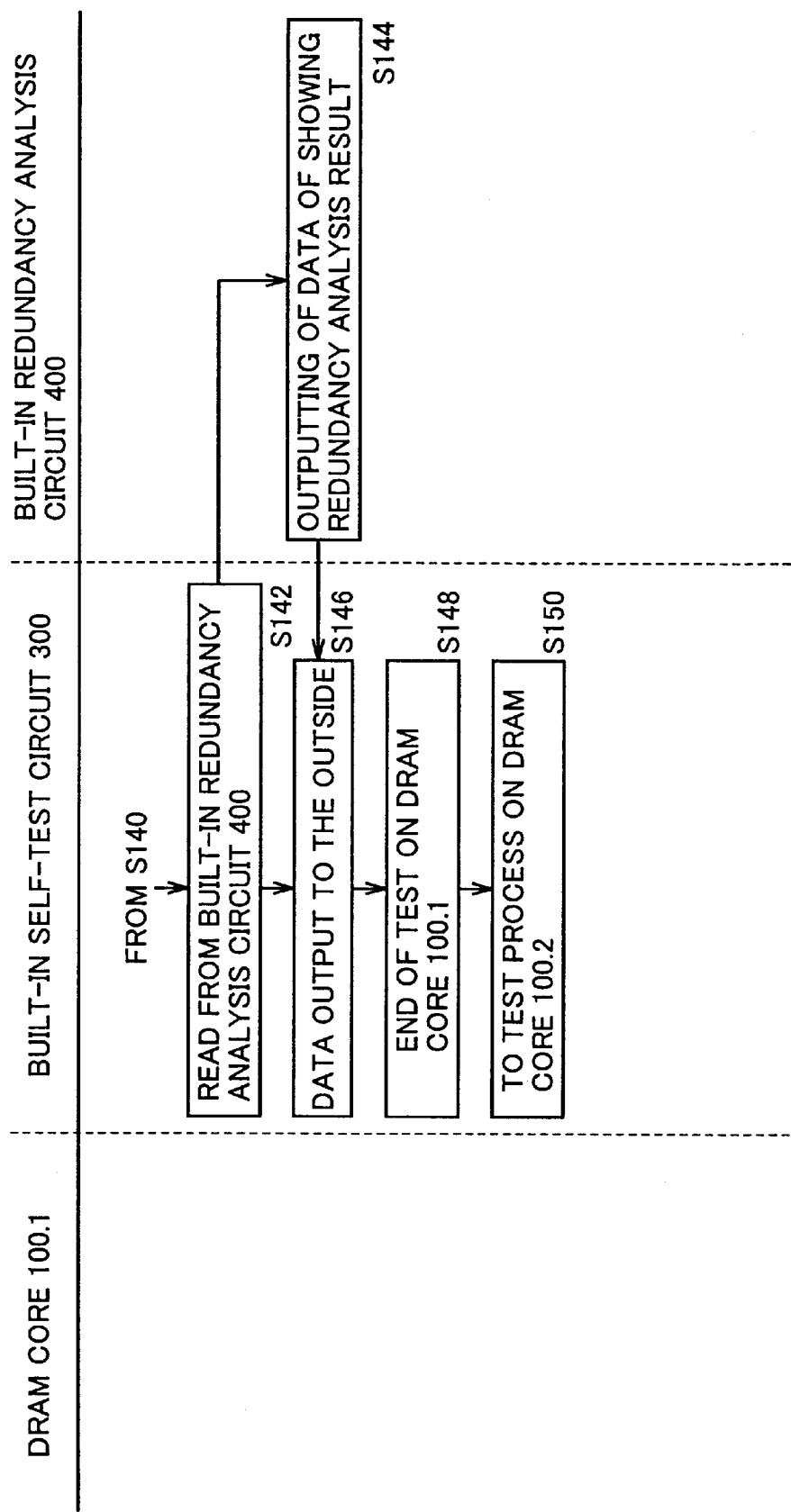
FIG. 22 is a second flow chart for describing operation of built-in self-test circuit 300 and built-in redundancy analysis circuit 400.

Referring to FIG. 22, subsequently, a data read command is given to built-in redundancy analysis circuit 400 from built-in self-test circuit 300 (step S42). Data showing a redundancy analysis result is outputted to built-in self-test circuit 300 from built-in redundancy analysis circuit 400 (step S144).

A read data command RDC is given to built-in self-test circuit 300 from the outside and data showing the redundancy determination result is outputted from terminal 22 as data Dout (step S146).

With the above process applied, the test on DRAM core 100.1 ends (step S148).

Subsequent to this, similar test operations are performed on each of the other DRAM cores 100.2 to 100.n (step S150).

With the above described configurations and operations adopted, flexible adaptation is enabled in cases where plural DRAM cores formed on the same ship have respective memory capacities different from each other and where the number of redundant memory cell rows and the number of redundant memory cell columns formed in each of the DRAM cores are different from those of the other DRAM cores, thereby enabling increase in chip area to be suppressed.

[Configurations of Address Generation Circuit 34 and Address Generation Circuit 330]

FIG. 23 is a timing chart for describing operation of address generation circuit 34 shown in FIG. 2.

Address generation circuit 34 includes binary counters corresponding to a row address and a column address, respectively. In FIG. 23, only operation of a binary counter corresponding to one of the addresses, for example a row address, is taken out and shown. The number of bits of an output of a binary counter is determined according to magnitudes in bit of a row address and a column address for a corresponding memory cell array.

A binary counter counts clock input UCCLK to generate address signals A <0> to A <N−1> incrementing the number of bits of an address signal by one for each count.

In FIG. 23, in response to an activation edge of clock signal UCCLK at a time point tb, an address count has reached the maximum number of address counts corresponding to N bits and all the bits of address signals A <0> to A<N−1> are reset.

Figure 24:
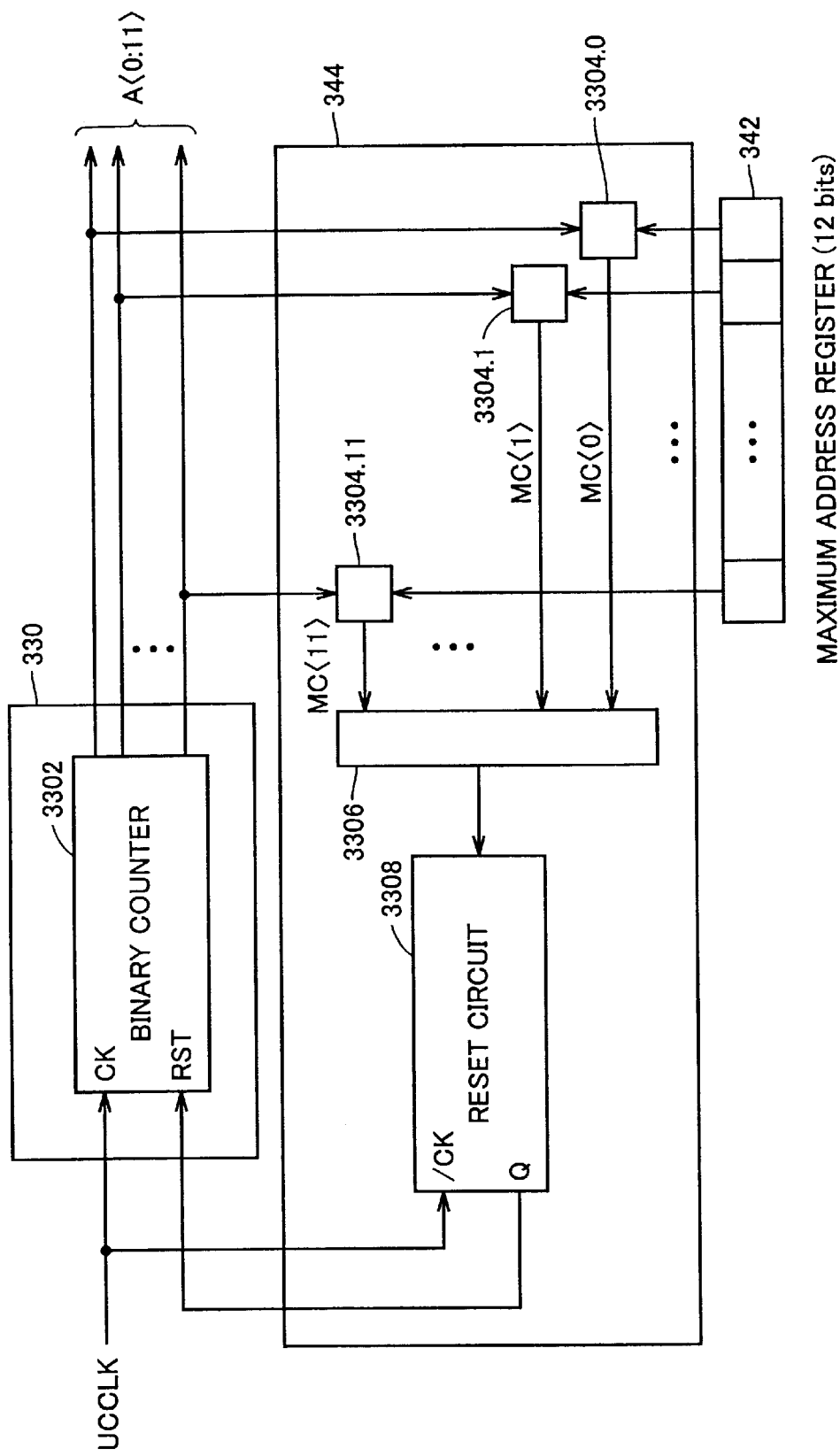
FIG. 24 is a schematic block diagram for describing a configuration of an address generation circuit 330, a comparator 344 and a maximum address register 342.

FIG. 24 is a schematic block diagram for describing a configuration of address generation circuit 330, comparator 344 and maximum address register 342 combined in built-in self-test circuit 300 shown in FIG. 3.

In FIG. 24, it should be understood that only a configuration corresponding to, for example, a row address is taken out and shown.

Address generation circuit 330 includes a binary counter 3302 adapted to a row address having the maximum number of bits among all of the row addresses of DRAM cores 100.1 to 100.n, wherein the binary counter is assumed to be a 12 bit binary counter for the sake of description.

Comparator 3404 includes: coincidence detection circuits 3304.0 to 3304.11 receiving respective outputs A <0> to A <11> from binary counter 3302 to perform comparison between an output and a value stored in maximum address register 342; an all coincidence information detection circuit 3306 receiving outputs from coincidence detection circuits 3304.0 to 3304.11 to detect that outputs of all coincidence detection circuits show coincidence of comparison results; and a reset circuit 3308 for resetting binary counter 3302 according to that all of outputs of coincidence detection circuits 3304.0 to 3304.11 show a coincidence state by all coincidence information detection circuit 3306.

Binary counter 3302 counts up clock signal UCCLK outputted from a clock generation unit in BIST control section 310.

On the other hand, a binary counter in address generation circuit 34 also counts up clock signal UCCLK.

Figure 25:
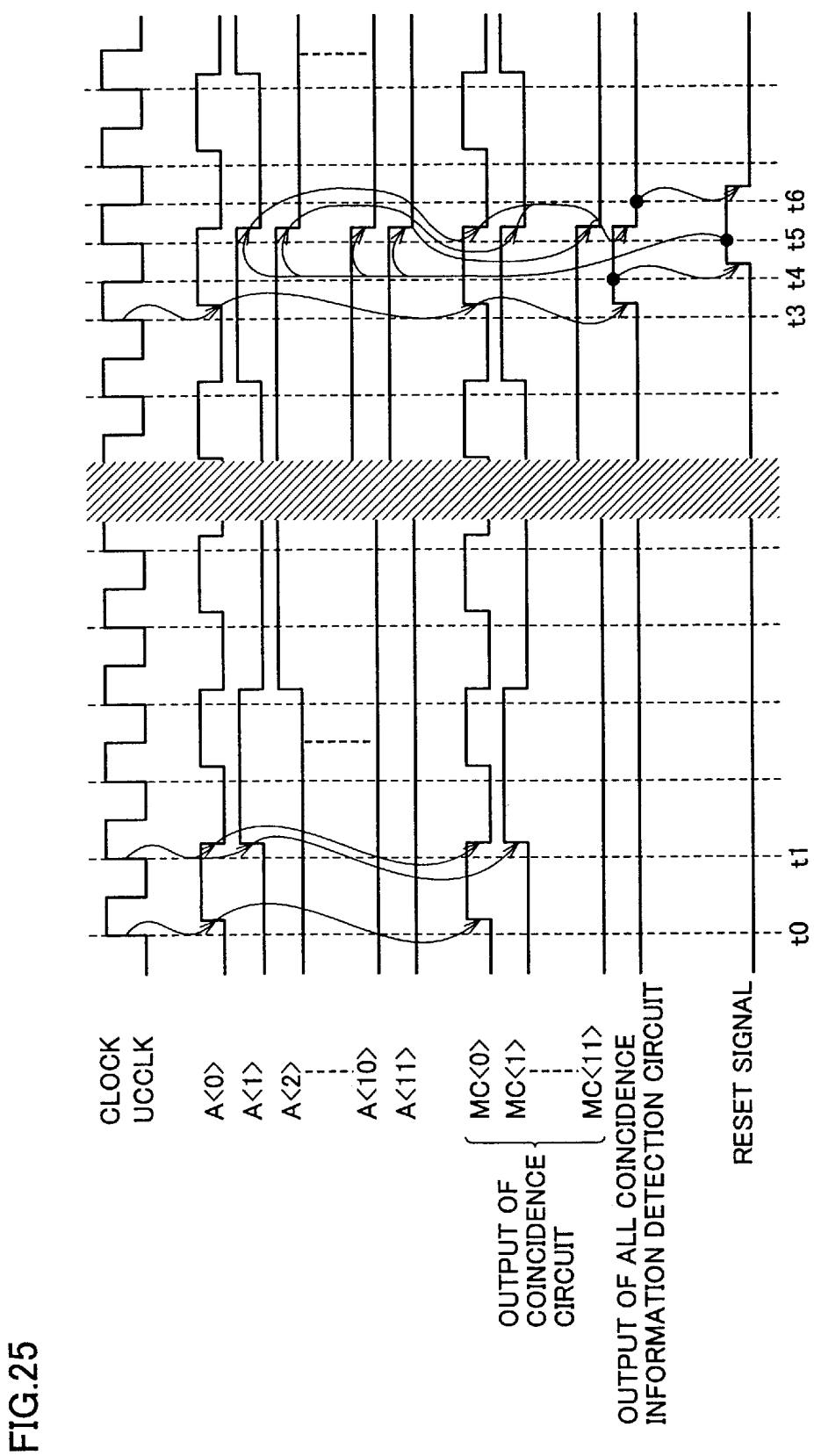
FIG. 25 is a timing chart for describing operation of address generating circuit 330 described in FIG. 24.

FIG. 25 is a timing chart for describing operation of address generation circuit 330 described in FIG. 24.

When a count operation of clock signal UCCLK starts at a time point t0, signal A <0> of the lowest bit goes to "H" level among address signals A <0> to A <11> of outputs of binary counter 3302. In response to this, output signal MC <0> of coincidence detection circuit 3304.6 also goes to "H" level.

Then, at a time point t1, address signal A <1> goes to "H" level in response to an activation edge of the second cycle of clock signal UCCLK and in response to transition of address signal A <1> to "H" level, output signal MC <1> of coincidence detection circuit 3304.1 goes to "H" level.

On the other hand, output signal MC <0> of coincidence detection circuit 3304.0 goes to "L" level.

Hereinafter, in a similar manner, levels of signals MC <0> to MC <11> also change according to comparison results between data held in maximum address register 342 and address signals A <0> to A <11>.

In response to an activation edge of clock signal UCCLK at a time point t3, address signal A <0> enters an active state and in response to this, signal MC <0> goes to "H" level. At the time, outputs of all of coincidence detection circuits 3304.0 to 3304.11 go to "H" level and an output of all coincidence information detection circuit 3306 goes to "H" level.

At a non-activation edge of clock signal UCCLK at a time point t4, in response to that an output level of all coincidence information detection circuit 3306 is at "H" level, reset signal RST from reset circuit 3308 goes to "H" level.

In response to this, output levels of binary counter 3302 are all reset and all of address signals A <0> to A <11> go to "L" level.

In an example shown in FIG. 25, since "1s" are stored in all the bits in the maximum address register 342 having a storage region of 12 bits, signals MC <0> to MC <11> all also go to "L" level in response to that the address signals A <0> to A <11> all go to "L" level. In response to this, an output of all coincidence information detection circuit 3306 goes to "L" level.

In response to that an output of all coincidence information detection circuit 3306 is at "L" level at a time point t6, an output of reset circuit 3308 also returns to "L" level. With this, a count operation of binary counter 3302 starts again at an activation edge of next clock signal UCCLK.

With the configuration as described above adopted, address generation circuit 330 provided in built-in self-test circuit 300 and address generation circuits 34 provided corresponding to respective DRAM cores 100.1 to 100.n generate address signals in synchronism with each other.

Accordingly, in the test operation, only a start address is required to be given by a shift operation to each of flip-flop circuits 500.1 to 500.n from built-in self-test circuit 300 at the start of the test operation. Thereafter, address generation circuits 34 provided to respective DRAM cores 100.1 to 100.n generate internal addresses for the test operation. Therefore, no necessity arises for giving an address to each of flip flop circuits 500.1 to 500.n by a shift operation each time a memory cell is selected, so the test operation can be performed at high speed.

Note that in a write operation in the test operation, if not only address signals but also test data itself written to respective DRAM cores 100.1 to 100.n are to be self-generated inside the DRAM cores 100.1 to 100.n, only an initial value has to be given from built-in self-test circuit 300 at the start of the test operation. Hence, in the test operation, no necessity arises for giving write data to each of flip flop circuits 500.1 to 500.n by a shift operation in each data write, so the test operation can be performed at higher speed.

Second Embodiment

Figure 26:
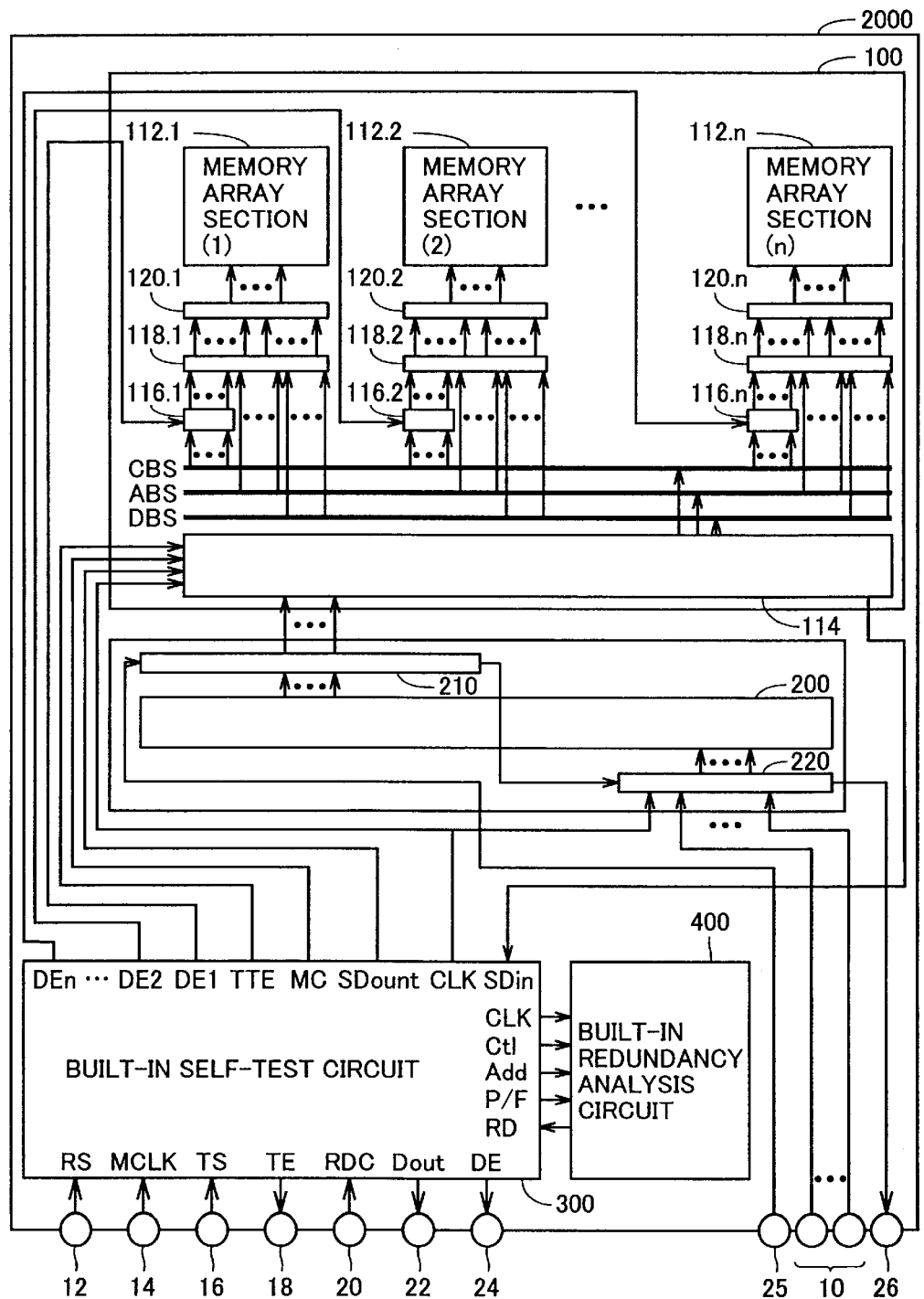
FIG. 26 is a schematic block diagram for describing a configuration of a semiconductor integrated circuit device 2000 of a second embodiment of the present invention.

FIG. 26 is a schematic block diagram for describing a configuration of a semiconductor integrated circuit device 2000 of a second embodiment of the present invention.

Semiconductor integrated circuit device 2000 is fundamentally similar to semiconductor integrated circuit device 1000 of the first embodiment shown in FIG. 1 with respect to configurations of built-in self-test circuit 300 and built-in redundancy analysis circuit 400.

As described later, however, built-in self-test circuit 300 in the second embodiment generates test enable signal TE in addition to functions of the first embodiment, and further, configurations of DRAM cores 100 in the second embodiment are different from those of the DRAM cores in the first embodiment.

Moreover, provided in the semiconductor integrated circuit device 2000 are flip flop circuits 210 and 220 capable of giving data by a shift operation or reading data by a shift operation in a data input section or data output section, respectively, of the logic circuit 200 such that data inputted or outputted to or from logic circuit 200 can be confirmed in the test operation.

Note that while in FIG. 26, there is shown one DRAM core 100 and one logic circuit 200 are provided in semiconductor integrated circuit device 2000, the present invention is not limited to such a case, but plural DRAM cores 100 and plural logic circuits 200 corresponding thereto, may be provided in semiconductor integrated circuit device 2000.

Referring to FIG. 26, DRAM core 100 includes: an interface section 114 receiving a control signal, an address signal and write data given from logic circuit 200 through flip-flop circuit 210; memory array sections 112.1 to 112.n for storing and holding data; an address bus ABC for transmitting an address signal to each of memory array sections 112.1 to 112.n from interface section 114; a command bus CBS for transmitting a control signal to each of memory array sections 112.1 to 112.n from interface section 114; and a data bus DBS for supplying/receiving data between interface section 114 and memory array sections 112.1 to 112.n.

DRAM core 100 further includes: switch circuits 116.1 to 116.n for opening/closing connection to the command data bus according to a signal given from the logic circuit in the ordinary operation, or according to activation signals DE1 to DEn given from built-in self-test circuit 300 in the test operation; local control circuits 118.1 to 118.n receiving the control signal from command data bus CBS through address bus ABS and switch circuits 116.1 to 116.n; flip-flop circuits 120.1 to 120.n for latching an address signal, a control signal and write data given from local control circuits 118.1 to 118.n to give corresponding memory array sections 112.1 to 112.n.

The control signal, the address signal and the write data are given to DRAM core 100 from logic circuit 200 through flip-flop circuit 210 capable of performing a shift operation and read data is given to logic circuit 200 from DRAM core 100 through flip-flop circuit 210. On the other hand, in the ordinary operation, data given from data input/output terminal 10 is given to logic circuit 200 through flip-flop circuit 220 capable of performing a shift operation and an output from logic circuit 200 is given to data input/output terminal 10 through flip-flop circuit 220.

In the test operation, when operation of logic circuit 200 is tested, an address signal, a control signal, write data and so on are given to flip-flop circuit 210 through a terminal 25, read data from DRAM core 100 is serially shifted and the read data is read out from a terminal 26 after the read data passes through flip-flop circuit 220. On the other hand, test data given to logic circuit 200 is also given to flip-flop circuit 220 by a serial shift operation from terminal 25 and the data in flip flop circuit 220 is read out from terminal 26 by a serial shift operation after an output of logic circuit 220 is outputted to flip-flop circuit 220.

Note that it should be understood that in FIG. 26, memory array sections 112.1 to 112.n each include circuits necessary for selection of a memory cell and inputting/outputting of data, such as row address decoder 40; word line driver 42, column address decoder 50; column select gate 52; read amplifier 70; write driver 80; and data latches 72 and 82.

Figure 27:
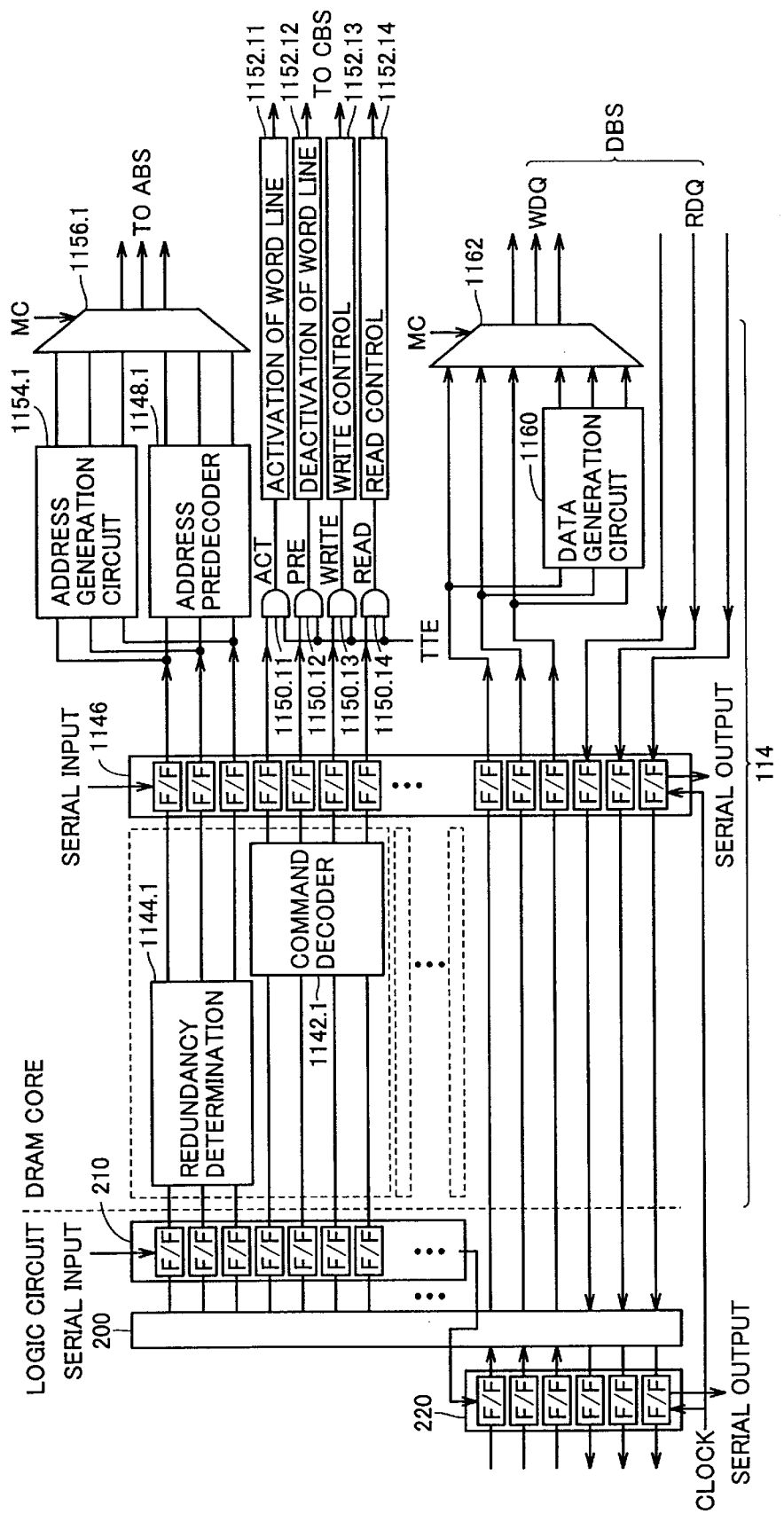
FIG. 27 is a schematic block diagram for describing a configuration of an interface section 114 of a DRAM core in the configuration shown in FIG. 26.

FIG. 27 is a schematic block diagram for describing a configuration of interface section 114 of a DRAM core in the configuration shown in FIG. 26.

As described in FIG. 26, in the test operation, test data (a control signal, an address signal, data corresponding to write data) is given from built-in self-test circuit 300 or from the outside of semiconductor integrated circuit device 2000 and data as a result of the operation is read out serially to built-in self-test circuit 300 or to the outside of semiconductor integrated circuit device 2000; and hereinafter, such a test is referred to as a "scan test," and a path along which data is serially transmitted is referred to as a "scan path."

Description will be given mainly of the scan test on DRAM core 100 below.

In the case of DRAM, dissimilar to the case of SRAM, activation of a word line is necessary to be continued during an operation cycle in a row related circuit. Moreover, in a case where a read operation is performed, a clock latency generally exists as a period after a read command is inputted till data is outputted.

Therefore, after test data (a test vector) to be serially transmitted is transferred onto a scan path, a process in which a word line is activated (hereinafter referred to as an ACT process) is first performed. At this time, a state in which the ACT process has been performed is required to be held in a latched state in latch circuits 120.1 to 120.n corresponding to memory array sections 112.1 to 112.n. Such a holding state is reset by inputting a precharge command.

A further process such as write or read of data, or the like is implemented in such a state where activation of a word line is maintained.

Referring to FIG. 27, in the ordinary operation, when an access request from logic circuit 200 is made, for example, to memory array section 112.1, in interface section 114 having received act command ACT, precharge command PRE, read command READ, write command WRITE and an address signal, a conversion process into an internal command is performed in command decoder 1142.1 provided correspondingly to memory array section 112.1.

On the other hand, with respect to an address, comparison is performed between a programmed defective address and a given address signal in redundancy determination section 1144.1 and there is performed conversion to an internal address after the redundancy replacement process is completed.

The internal command and the address subjected to such processes are latched to flip-flop circuit 1146.

At the next clock edge, from flip-flop circuit 1146, an address signal is given to an address predecoder 1148.1, and a control signal is given to driver circuits 1152.11 to 1152.14 through AND circuits 1150.11 to 1150.14.

Test enable signal TTE is given to one inputs of respective AND circuits 1150.11 to 1150.14 and an output of command decoder 1142.1 is given to the other inputs thereof through flip-flop circuit 1146.

Outputs of driver circuits 1152.11 to 1152.14 are given to command bus CBS.

An output of an address generation circuit 1154.1 provided correspondingly to memory array section 112.1 and counting a clock signal from built-in self-test circuit 300 in the test operation to self-generate a test address and an output of address predecoder 1148.1 are given to a switch circuit 1156.1; according to a mode command, an output of address generation circuit 1154.1 is selected in the test operation and an output of address predecoder is selected in the ordinary operation to be given address bus ABS. A configuration of address generation circuit 1154.1 is fundamentally similar to that of address generation circuit 34 with the exception that the number of bits of a generated address is different.

The configuration as described above is provided correspondingly to each of the other memory array sections 112.2 to 112.n.

Furthermore, as data WDQ written into memory array sections 112.1 to 112.n through data bus DBS, selected in the ordinary operation is data given from logic circuit 200 through flip-flop circuit 1146, while selected in the test operation is data generated in a data generation circuit 1160 based on an initial data given through the scan path, by a switch circuit 1162 controlled by mode command MC.

In a case where a scan test is performed, a test vector is serially. transferred to flip-flop circuit 1146 from built-in self-test circuit 300. During the serial transfer, test enable signal TTE given from built-in self-test circuit 300 is held at "L" level such that no data latched in a holding circuit of each of flip-flop circuit 1146 exerts any influence on operations of memory array sections 112.1 to 112.n. Thereby, data held in flip-flop circuit 1146 is not given to driver circuits 1152.11 to 1152.14, therefore, memory array sections 112.1 to 112.n are prevented from performing an abnormal operation during operation of a test vector.

Signal TTE is driven to "H" level after the transfer of the test vector, and in response to this, a control signal is transmitted to memory array sections 112.1 to 112.n from driver circuits 1152.11 to 1152.14 through command bus CBS and thereby, a selected memory array section operates.

At this time, each command is given selectively to memory array section 112.i by activation of signal DEi (i=1 to n) corresponding to a selected memory array section among switch circuits 116.1 to 116.n.

Figure 28:
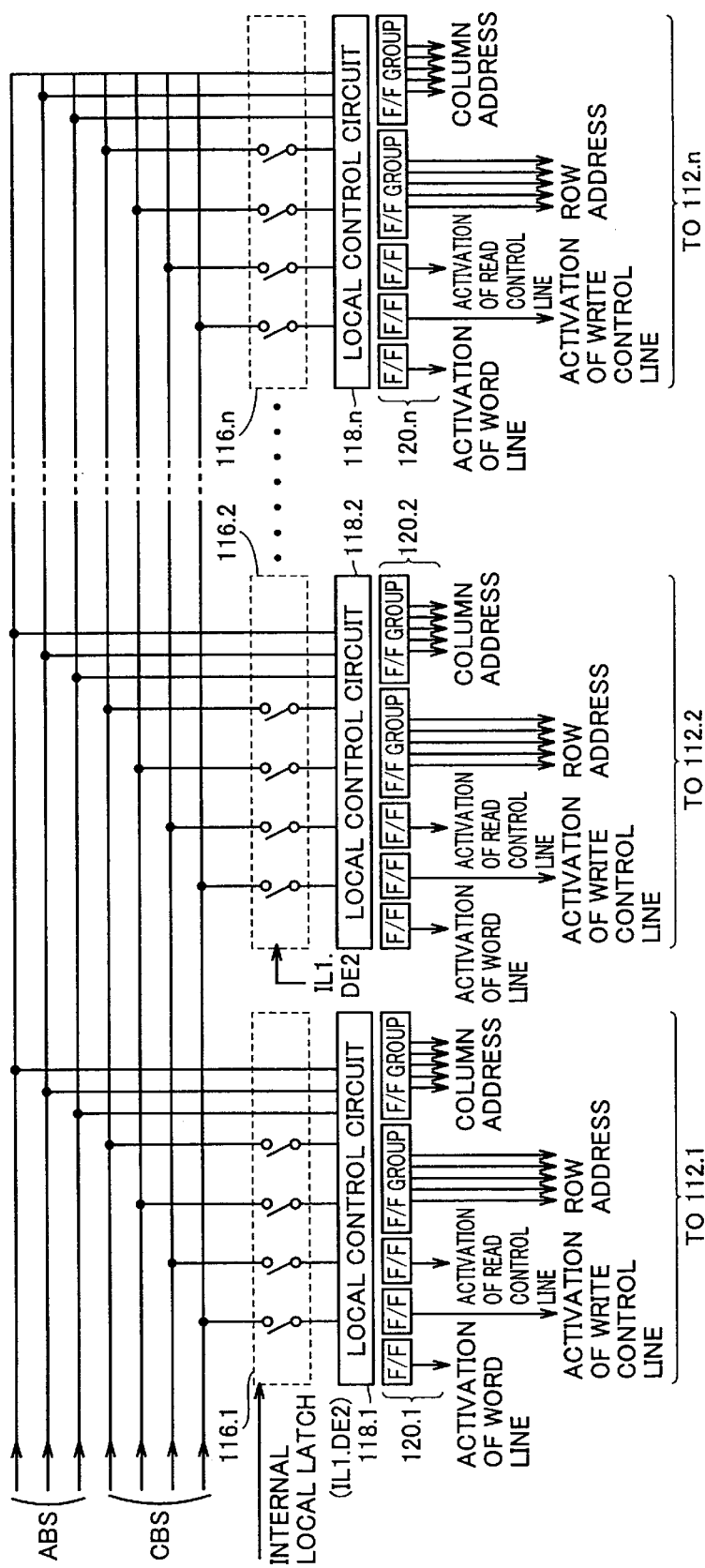
FIG. 28 is a schematic block diagram for describing a configuration of switch sections 116.1 to 116.n, local control circuits 118.1 to 118.n circuits 120.1 to 120.n combined.

FIG. 28 is a schematic block diagram for describing a configuration of switch sections 116.1 to 116.n, local control circuits 118.1 to 118.n, and flip-flop circuits 120.1 to 120.n combined in the configuration shown in FIG. 26.

A configuration is adopted in which commands such as activation/deactivation of a word line, activation of a write control line, activation of a read control line and so on, and a row address and a column address are selectively given by respective switch circuits 116.1 to 116.n to local control circuits 118.1 to 118.n in distributed arrangement corresponding to memory array sections 112.1 to 112.n.

Therefore, a signal transferred from interface section 114 is transferred to local control circuits 118.1 to 118.n through switch circuits 116.1 to 116.n according to select signals IL1 to ILn given from logic circuit 200 in the ordinary operation, or according to activation signals DE1 to DEn given from built-in self-test circuit 300 in the test operation.

Since signals generated in local control circuits 118.1 to 118.n are again latched in flip-flop circuits 120.1 to 120.n, therefore, an operation in an array is held so as to be in an instructed operation state even when a value of flip -flop circuit 1146 in interface section 114 is rewritten by a scan test.

Figure 29:
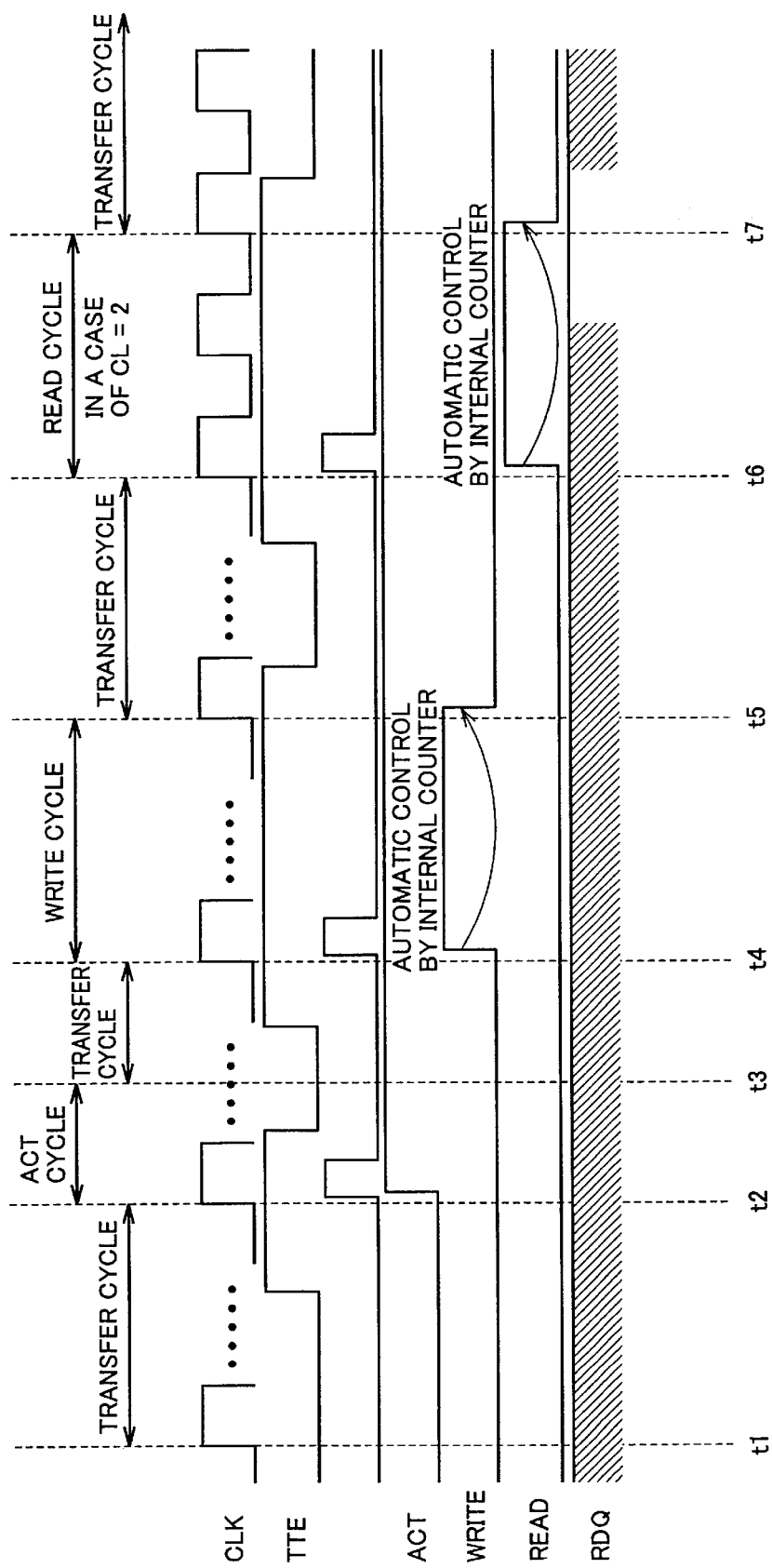
FIG. 29 is a timing chart when a test on DRAM core 100 is performed.

FIG. 29 is a timing chart when a test on DRAM core 100 is performed in semiconductor integrated circuit device 2000 described in FIGS. 26 to 28.

First of all, in a period between time points t1 and t2, a test vector is transferred to each of flip-flop circuits 1146 using the scan path. At this time, test enable signal TTE at "L" level.

Then, in a period between time points t2 and t3, a transfer operation is ceased, test enable signal TTE is activated to "H" level and an ACT operation is performed to activate a word line of a selected memory array i.

Again in a period between time points t3 to t4, transfer of a test vector for write is performed.

The transfer operation is ceased at a time point t4 and in a period between time points t4 and t5, test enable signal TTE is again activated to "H" level to perform a write operation.

At this time, an address and data in each of the second cycle and following cycles thereof are self-generated corresponding to each of memory array sections 112.1 to 112.n as described above if leading data is given to the test vector in the transfer. Herein, no address is given to interface section 114, but an address signal generated for each of the memory array sections and progress of write cycles can be estimated in built-in self-test section 300; therefore, test enable signal TTE is deactivated by predicting an end time point.

Alternatively, a configuration may be adopted in which completion of a write cycle in each of memory array section 112.1 to 112.n is notified to built-in self-test circuit 300 by a signal.

By including an address generation circuit for a test pattern on the side of DRAM core 100 in such a way, a write address can be automatically generated if a start address and an a progress pattern of address are set.

Furthermore, since data generation circuit 1160 for write data in the test operation is included corresponding to each of memory array sections 112.1 to 112.n, write data can also be automatically generated for each of memory array sections 112.1 to 112.n by selecting initial data and a progress pattern of data.

Selection of such a pattern can be separately performed with a combination of plural signals.

Since the number of cycles till write ends can be predicted in advance on the side of built-in self-test circuit 300 side, test enable signal TE can be deactivated when a proper number of cycles is reached by counting false cycles in order to end a write operation.

In succession, in a period between time points t5 to t6, transfer of a test vector for read is again performed.

At a time point t6, a transfer operation is ceased and in a period between time points t6 and t7, test enable signal TTE is again activated to "H" level to perform a read operation. At this time, if it takes two cycles for data to be taken out from DRAM core 100 due to the presence of a latency, test enable signal TTE is controlled such that data in the second cycle is latched to flip-flop circuit 1146.

Since in advance, it is understood on the side of built-in self-test circuit 300 whether a CAS latency of DRAM core 100 is of two cycles or other cycles, test enable signal TTE is deactivated in order to cease a read operation when a proper number of cycles is reached by counting false cycles corresponding to cycles of the latency.

Finally, starting at a time point t7, the clock signal is given to flip-flop circuit 1146 to perform a shift operation and thereby, data transfer in order to take out read data RDQ caught in the flip-flop through the scan path.

With the above described configuration and operation as well, an effect similar to that of the first embodiment can be obtained.

Third Embodiment

Figure 30:
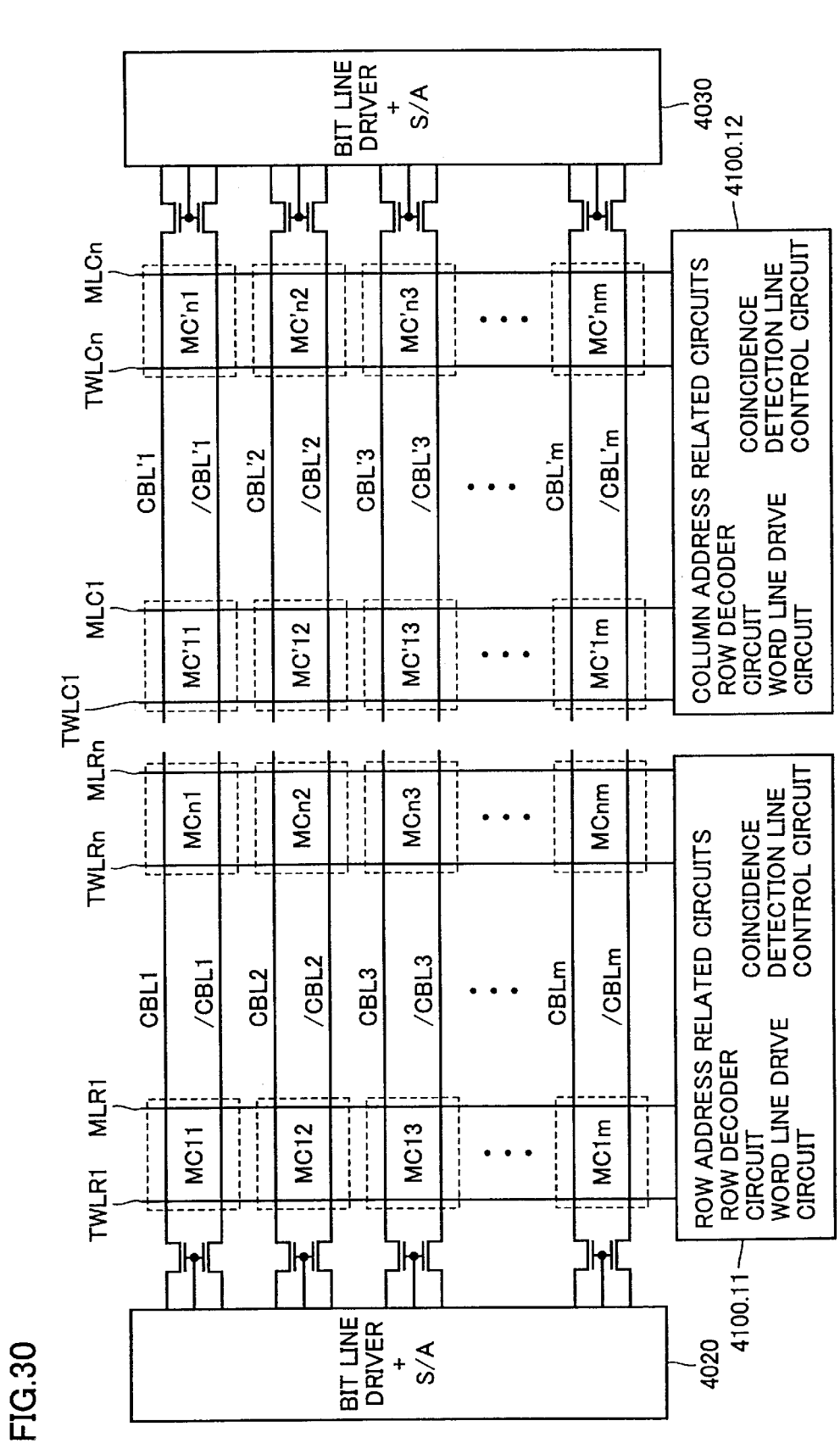
FIG. 30 is a schematic block diagram for describing another configuration of CAM cell array 4000 that can be included in built-in redundancy analysis circuit 400.

FIG. 30 is a schematic block diagram for describing another configuration of CAM cell array 4000 that can be included in built-in redundancy analysis circuit 400 in semiconductor integrated circuit device 1000 of the first embodiment or semiconductor integrated circuit device 2000 of the second embodiment.

In FIG. 30, arranged on right and left side surfaces are sets of bit line pairs CBL1 and /CBL1 to CBLm and /CBLm and bit line pairs CBL'1 and /CBL'1 to CBL'm and /CBL'm, being the same in number as each other, and the bit lines are divided into two groups: one for row address comparison and the other for column address comparison. A configuration is adopted in which arranged for the two groups are respective bit line control related circuits (bit line driver+ S/A) 4020 and 4030 and respective word line-coincidence detection line control related circuits 4100.11 and 4100.12. Therefore, word line-coincidence detection line control related circuits 4100.11 and 4100.12 of FIG. 30 are configured such that a portion corresponding to a row address and a portion corresponding to a column address of each of replacement determination sections 4100.1 to 4100.6 of the first or second embodiment are divided and separately arranged, and each of the divided portions corresponding to a row address and the divided portions are wired and connected so as to perform an operation similar to each section in the first or second embodiment.

A row address and a column address are each subjected to a mask operation on an unnecessary portion thereof according to a necessary number of bits and a necessary number of word lines as described in the first embodiment, whereby a necessary CAM cell array capacity is realized.

In the configuration shown in FIG. 30, a comparison-coincidence operation is performed by inputting a row address or a column address onto each of the bit lines from respective control related circuits 4020 and 4030 on the right and left sides.

With such a configuration, CAM cell array 400 can be constructed in one plane arrangement with near uniformity, and an occupancy area can be reduced by simplified array arrangement and further reduced by simplification of arrangement of accompanying peripheral circuits.

Figure 31:
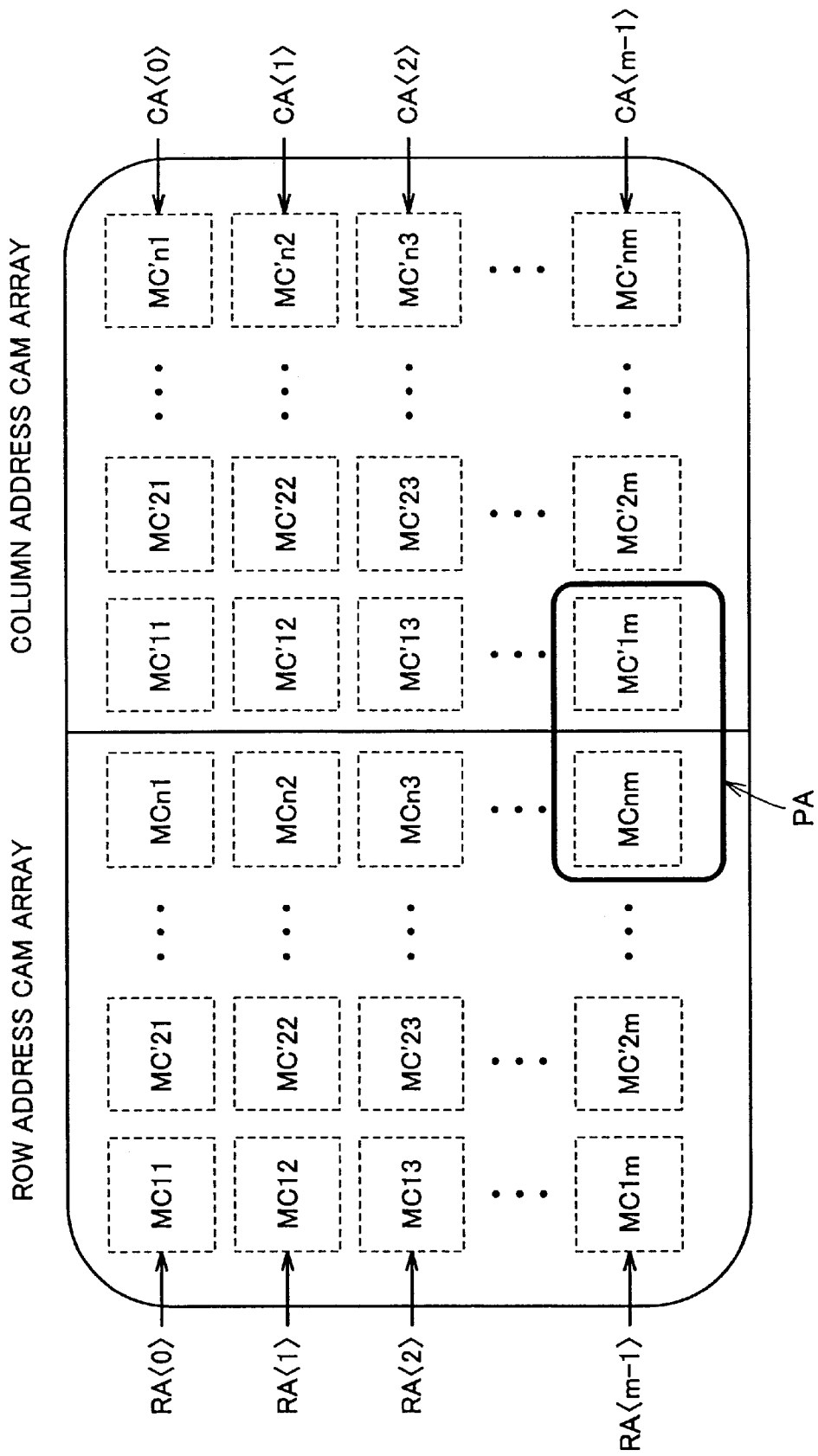
FIG. 31 is a diagram conceptually showing a configuration of the CAM cell array shown in FIG. 30.

FIG. 31 is a diagram conceptually showing a configuration of CAM cell array shown in FIG. 30. A CAM array for a row address are arranged on the left half surface and a CAM array for a column address is arranged on the right half surface.

Figure 32:
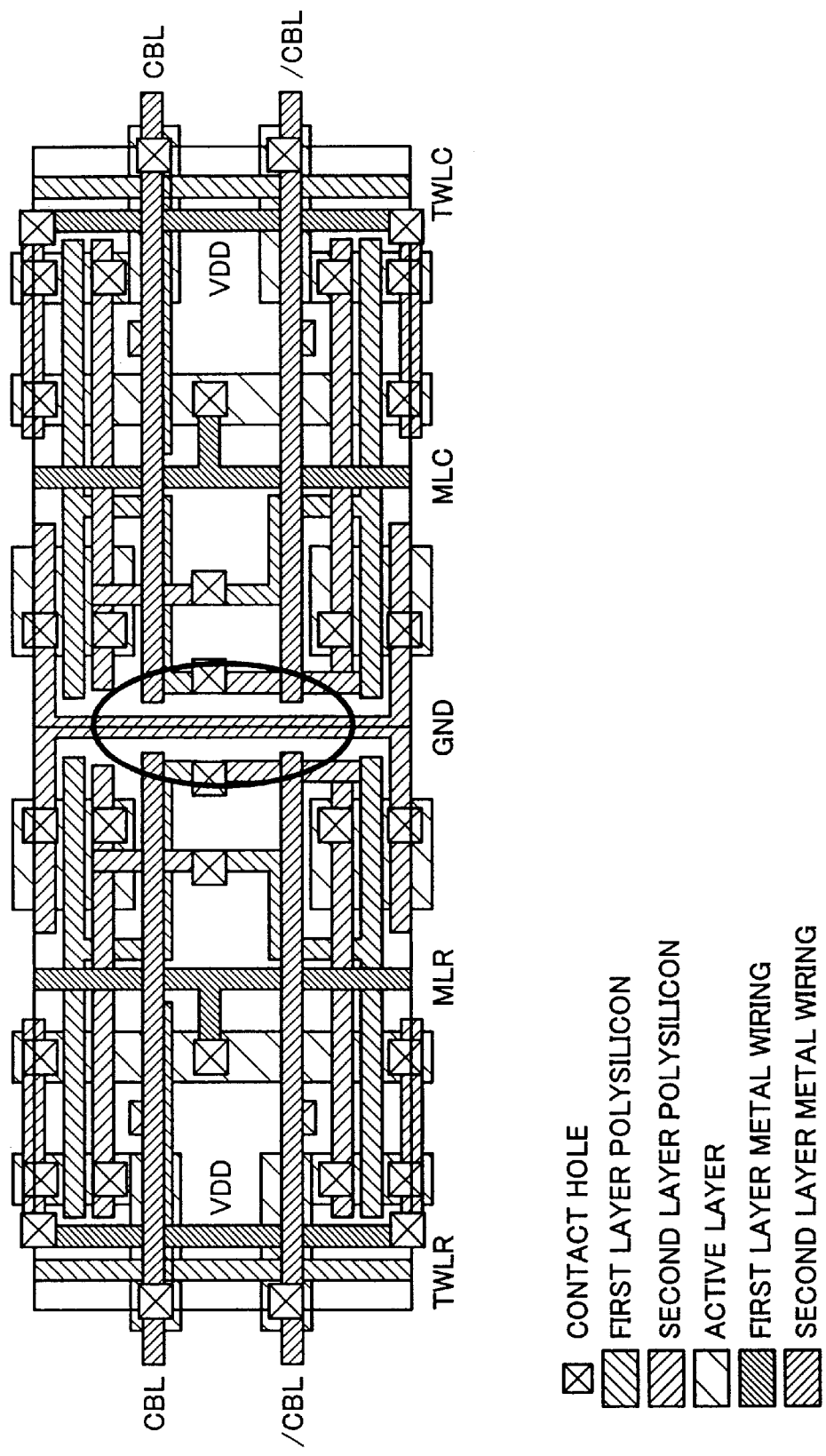
FIG. 32 is a wiring pattern diagram for describing a configuration of a part PA encircled with a black heavy line in the CAM array shown in FIG. 31 in a more detailed manner.

FIG. 32 is a wiring pattern diagram for describing a configuration of a part PA encircled with a black heavy line in the CAM array shown in FIG. 31 in a more detailed manner.

Transistors constructed of an active layer and a first polysilicon layer are connected therebetween by a second polysilicon layer, a first metal wiring layer and a second metal wiring layer, wherein bit lines CBL and /CBL formed from the second metal wiring layer are configured so as to be separated from each other in the boundary portion between the CAM array for a row address and the CAM array for a column address as shown in a portion enclosed with an ellipse.

Figure 33:
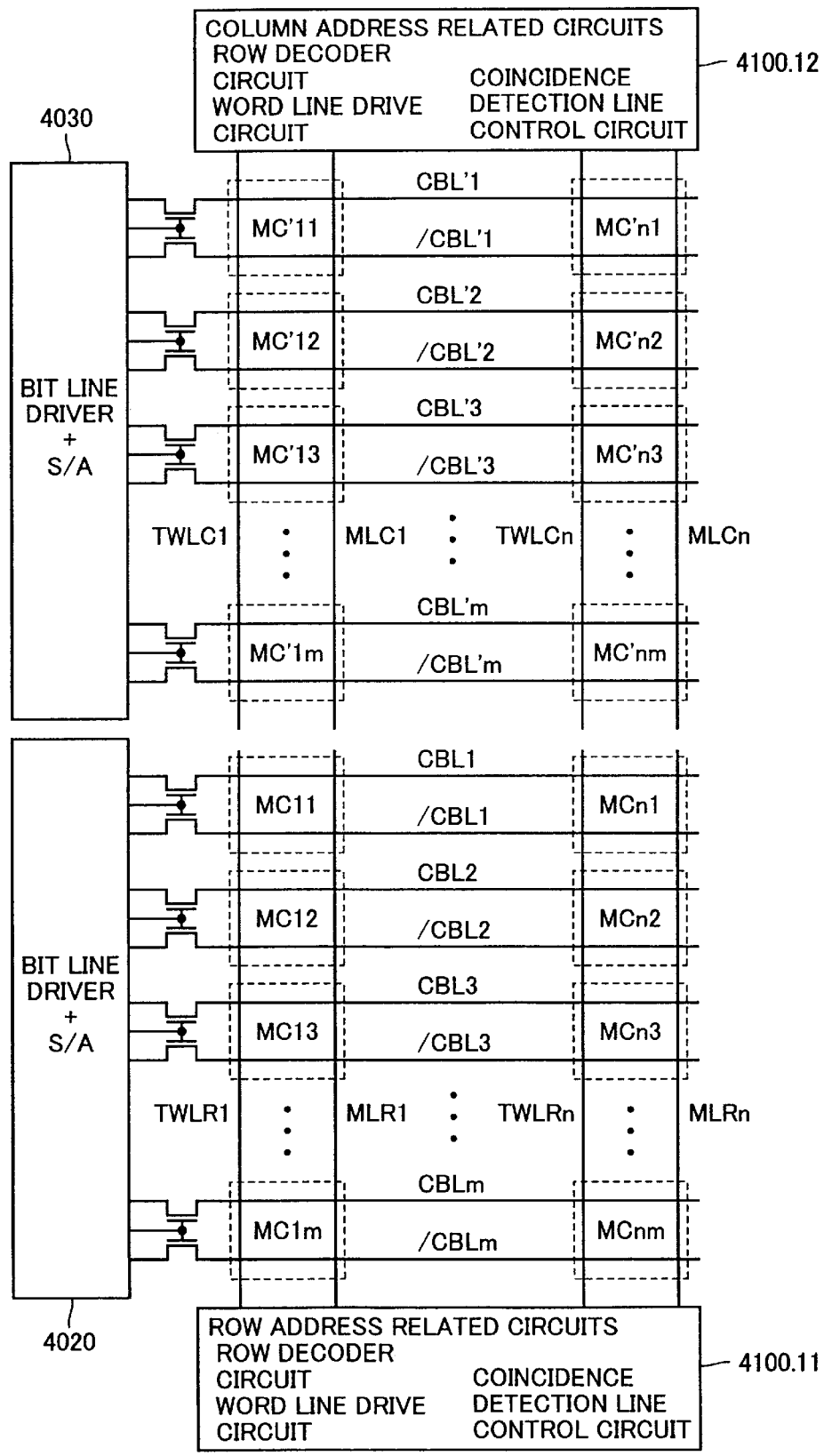
FIG. 33 is a schematic block diagram showing another configuration of CAM cell array 4000.

FIG. 33 is a schematic block diagram showing another configuration of CAM cell array 4000.

Referring to FIG. 33, a configuration of CAM cell array 4000 for performing a mask operation according to a configuration of a CAM cell and necessary numbers of bits of row addresses and column addresses is fundamentally the same as that of FIG. 30.

In FIG. 33, arranged on the top half surface and bottom half surface are respective sets of word lines TWLR1 to TWLRn and word lines TWLC1 to TWLCn being the same in number as each other and respective sets of coincidence detection lines MLR1 to MLRn coincidence detection lines MLC1 to MLCn being the same in number as each other.

Each of the word lines and each of the coincidence detection lines are divided into two parts: one for row address comparison and the other for column address comparison, and control related circuits for a word line and a coincidence detection line 4100.11 and 4100.12 and control related circuits for bit lines 4020 and 4030 are provided for respective both groups.

A row address and a column address constitute a necessary CAM array by performing a mask operation on an unnecessary part according to necessary numbers of bits and word lines.

A row address or a column address is inputted onto a corresponding bit line through one of the top and bottom control related circuits to perform a comparison-coincidence operation.

With such a configuration as well, a CAM cell array can be constructed in a single plane arrangement with near uniformity, and an occupancy area can be reduced by a simplified array arrangement and further reduced by simplification of arrangement of accompanying peripheral circuits.

Figure 34:
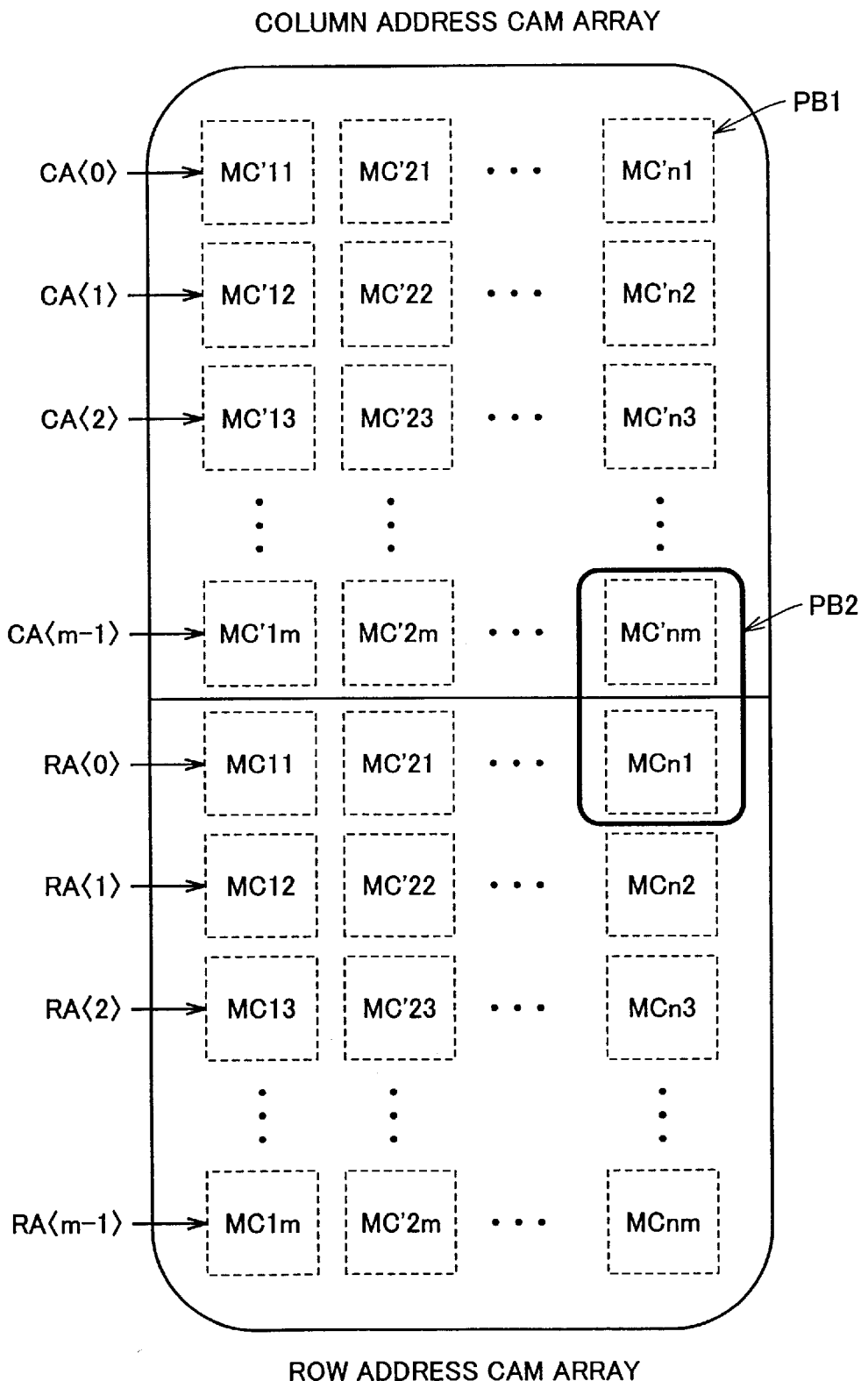
FIG. 34 is a diagram conceptually showing a configuration of the CAM array shown in FIG. 33.

FIG. 34 is a diagram conceptually showing a configuration of the CAM array shown in FIG. 33.

A CAM cell array corresponding to a row address is arranged on the top half surface and a CAM cell array corresponding to a column address is arranged on the bottom half surface.

Figure 35:
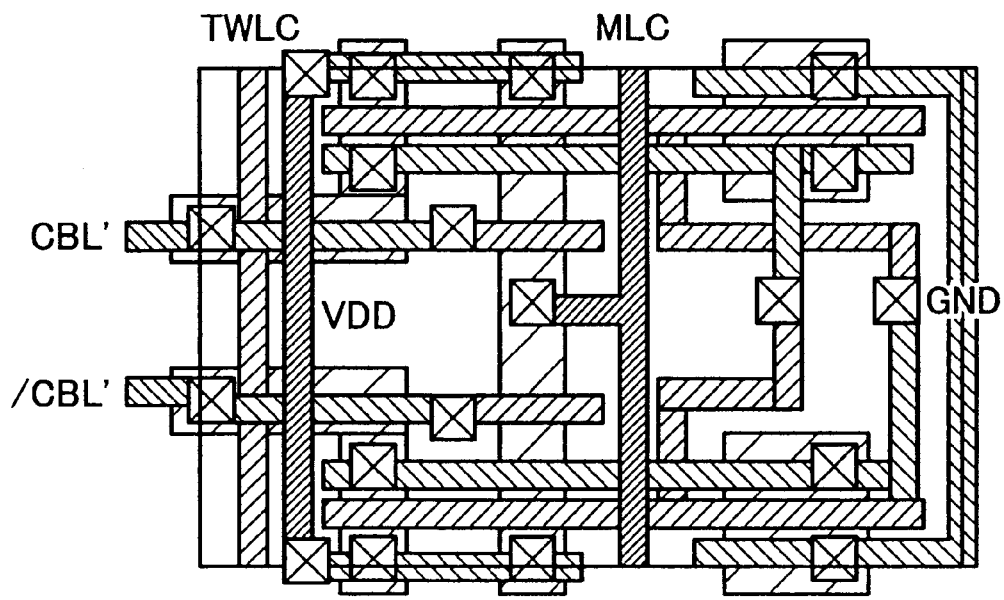
FIG. 35 is a wiring pattern diagram for describing a configuration of a CAM cell MC'n1 in a more detailed manner.

FIG. 35 is a wiring pattern diagram for describing a configuration of a CAM cell MC'n1 (PB1 of FIG. 34) corresponding to a column address on the top half surface of the CAM cell arrays shown in FIG. 34 in a more detailed manner.

A word line is formed from the first polysilicon layer, a coincidence detection line and a power source line are formed from the first metal wiring. A bit line is formed from the second metal wiring.

Moreover, a word line WL and a coincidence detection line ML extend to and over an adjacent memory cell.

Figure 36:
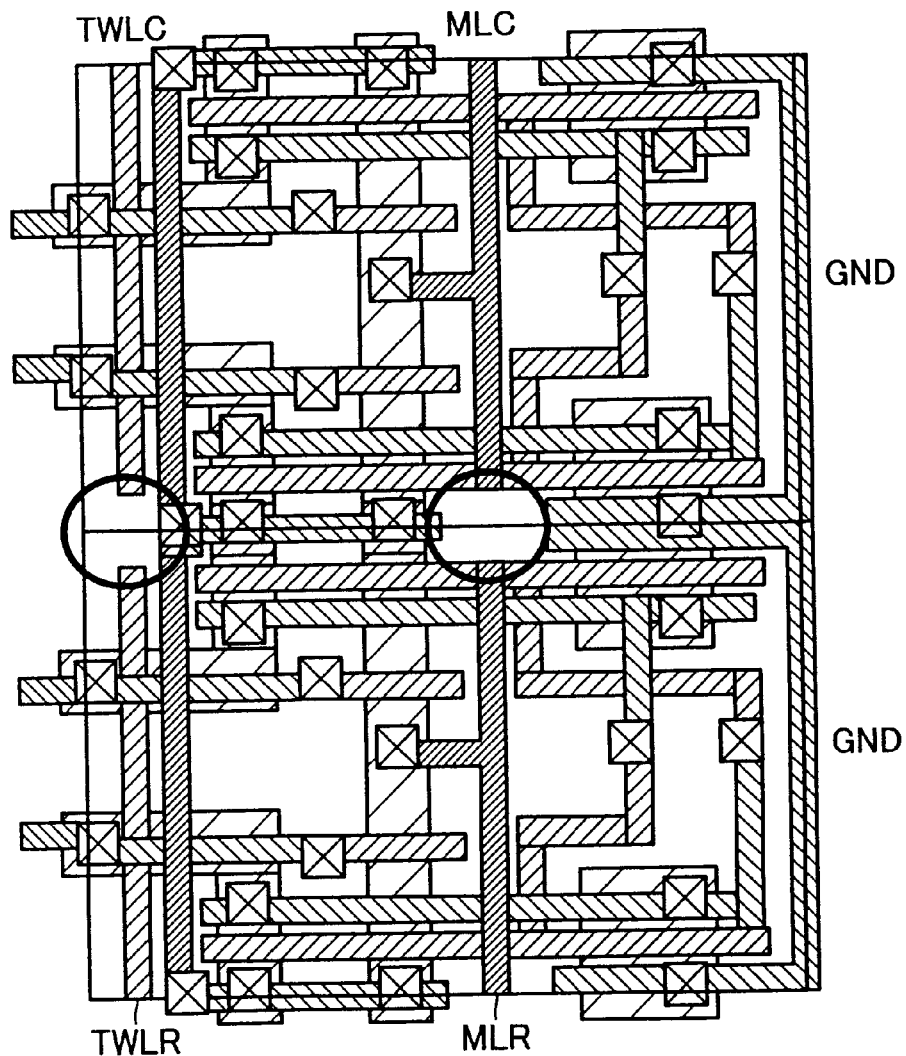
FIG. 36 is a wiring pattern diagram showing a configuration of a boundary section between a CAM array for a row address and a CAM array for a column address in the CAM arrays shown in FIG. 34.

FIG. 36 is a wiring pattern diagram showing a configuration of a boundary section between a CAM array for a row address and a CAM array for a column address in the CAM arrays shown in FIG. 34.

A configuration as shown by portions enclosed by circles in FIG. 36 is adopted in which dissimilar to FIG. 35, word lines and coincidence detection lines of a row address CAM cell array are disconnected from those of a column address CAM cell array adjacent thereto in the boundary section between both CAM cell arrays, while a power source line and a ground line extend to and over an adjacent CAM cell array.

Figure 37:
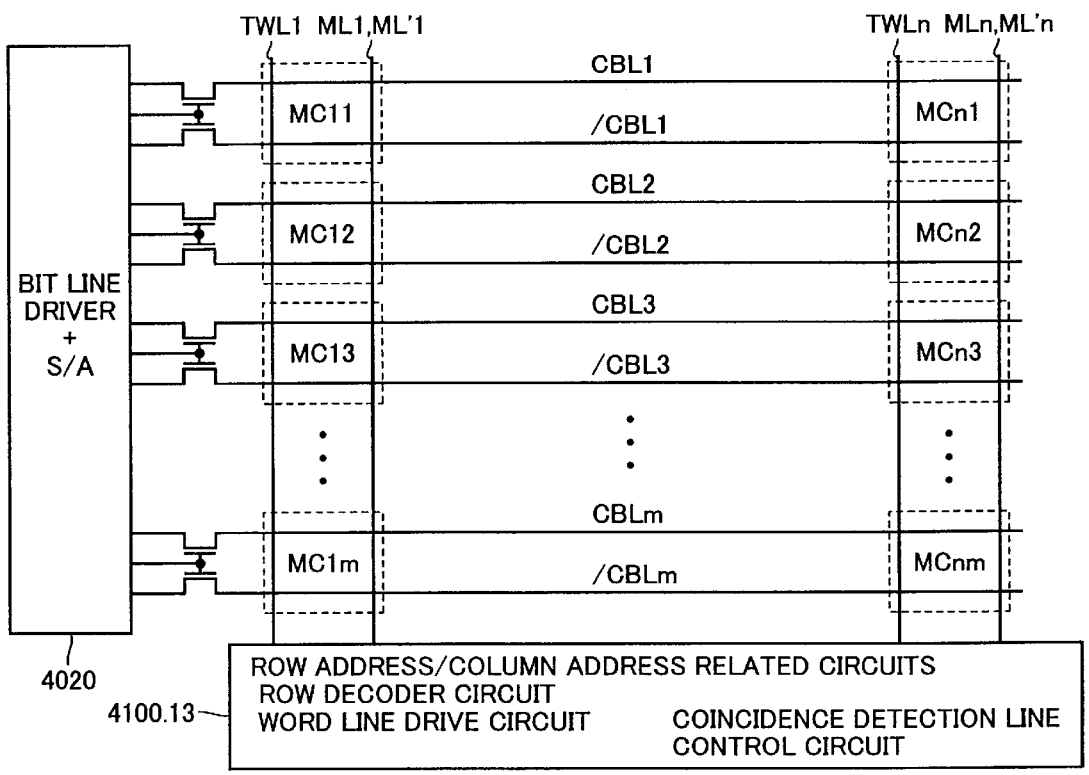
FIG. 37 is a schematic block diagram showing another configuration of a CAM array.

FIG. 37 is a schematic block diagram showing another configuration of a CAM array.

In the coincidence detection operation, a configuration of a CAM cell array is adopted in which a CAM cell corresponding to a row address and a CAM cell corresponding to a column address are controlled by separate coincidence detection lines.

That is, it is assumed that a word line-coincidence detection line control related circuit 4100.13 uses coincidence detection lines ML1 to MLn for, for example, a CAM cell corresponding to a row address in a CAM cell array on a single plane, while using coincidence detection lines ML1' to MLn' for a CAM cell used for a column address in the CAM cell array on a single plane.

Functions each for performing a mask operation are provided correspondingly to bit lines and word lines, respectively, according to the numbers of bits of storage row addresses and storage column addresses.

With such functions provided, bit lines, coincidence detection lines and word lines are not divided into groups as a pattern and one CAM cell array is functionally divided for a row address and a column address and can be utilized still as one array. For this reason, a CAM service area can be optimally utilized, thereby enabling a utilization efficiency of a CAM cell array to increase and in turn an occupancy area of CAM cell array 4000 to be reduced to a greater degree.

That is, for example, in the configuration shown in FIG. 30, a necessity arises for forming separate CAM arrays for a row address and a column address, respectively, capable of adapting to the maximum value of the numbers of bits of a row address and a column address; and further adapting to the maximum value of the numbers of redundant rows and redundant columns, in advance.

In contrast to this, in the configuration shown in FIG. 37, CAM cells can be provided without discriminating CAM cells used for a row address from those used for a column address, and vice versa; therefore, an occupancy area of a CAM cell array can be further reduced.

Figure 38:
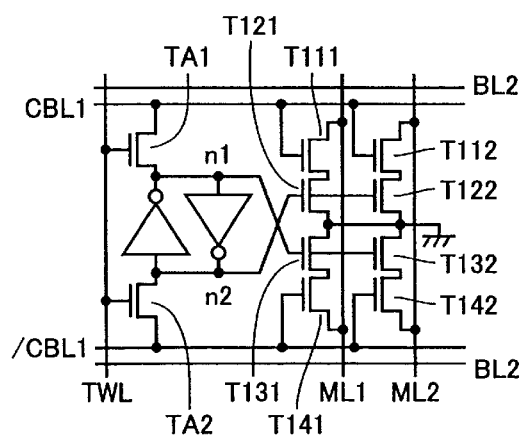
FIG. 38 is a circuit diagram showing a configuration of a CAM cell in the CAM array shown in FIG. 37.

FIG. 38 is a circuit diagram showing a configuration of a CAM cell in the CAM array shown in FIG. 37.

A CAM cell includes: an address bit line CBL1 for transmitting an internal address signal; a storage element BSE constituted of two inverters INV1 and INV2; an N channel access transistor TA1 for connecting a storage node n1 of storage element BSE and address bit line CBL1 therebetween according to a level of a signal line TWL; an address bit line /CBL1 for transmitting an internal address signal complementary to the internal address signal; an N channel access transistor TA2 for connecting a storage node n2 of storage element BSE and address bit line /CBL1 therebetween according to a level of signal line TWL; N channel transistors T111 and T121 connected in series between a first coincidence detection line ML1 and ground potential; and transistors T131 and T141 connected in series between first coincidence detection line ML1 and ground potential.

A CAM cell further includes: N channel transistors T112 and T122 connected in series between a second coincidence detection line ML2 and ground potential; and transistors T132 and T142 connected in series between second coincidence detection line ML2 and ground potential.

The gate of transistor T111 is connected to address bit line CBL1 and the gate of transistor T121 is connected to storage node n2 of storage element BSE. Furthermore, the gate of transistor T112 is connected to address bit line CBL1 and the gate of transistor T122 is connected to storage node n2 of storage element BSE.

The gate of transistor T131 is connected to storage node n1 of storage element BSE and the gate of transistor T141 is connected to address bit line /CBL1. Moreover, the gate of transistor T132 is connected to storage node n1 of storage element BSE and the gate of transistor T142 is connected to address bit line /CBL1.

With such a configuration adopted, a CAM cell array for flexibly storing defective addresses can be configured adapting to the numbers of bits of a row address and the numbers of bits of a column address; and the number of redundant rows and the number of redundant columns without dividing address bit lines, coincidence detection lines, word lines and so on within the CAM cell array. Therefore, a utilization efficiency of CAM cells increases and a occupancy area of a CAM cell array can be reduced as a whole.

Figure 39:
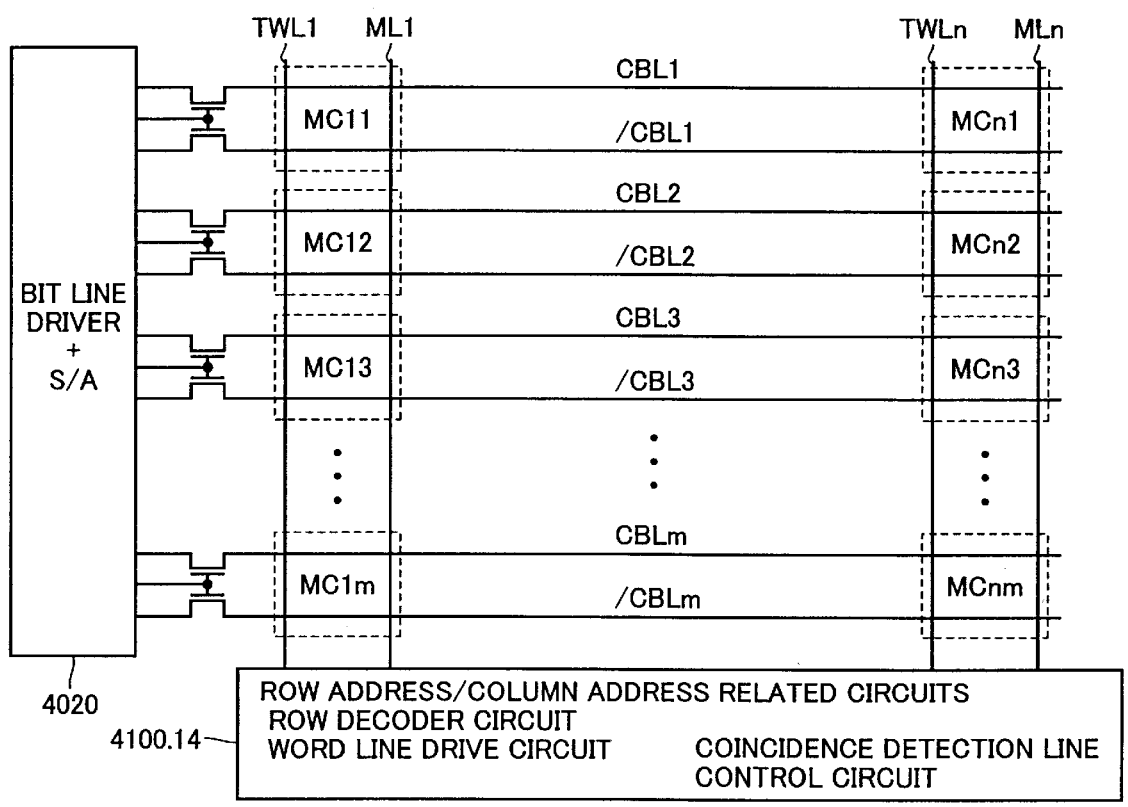
FIG. 39 is a conceptual diagram showing still another configuration of a CAM cell array.

FIG. 39 is a conceptual diagram showing still another configuration of a CAM cell array.

In the configuration shown in FIG. 39, a single CAM cell array is operated in two times: one for a row address comparison operation and the other for a column address comparison operation.

That is, bit line control related circuit 4020 and word line-coincidence detection line control related circuit 4100.14 perform defect detection and a storage operation only on a low address part in a first test cycle, and in such a way, read out a defective row address having detected and to be redundancy-replaced, to the outside.

Subsequent to this, in a second test cycle, a storage and comparison operation is performed only on a column address part in the CAM cell array.

A row address comparison operation and a column address comparison operation realize a CAM cell array configuration necessary for the comparison operations by masking unnecessary parts according to the number of bits and word lines necessary therefor.

With such a configuration adopted as well, a CAM cell array can be constructed on one plane with near uniformity, thereby enabling an occupancy area to decrease through simplification of an array configuration, and further since a CAM cell array can be used commonly for a row address and a column address; an array occupancy area can be reduced to a greater degree.

Fourth Embodiment

Figure 40:
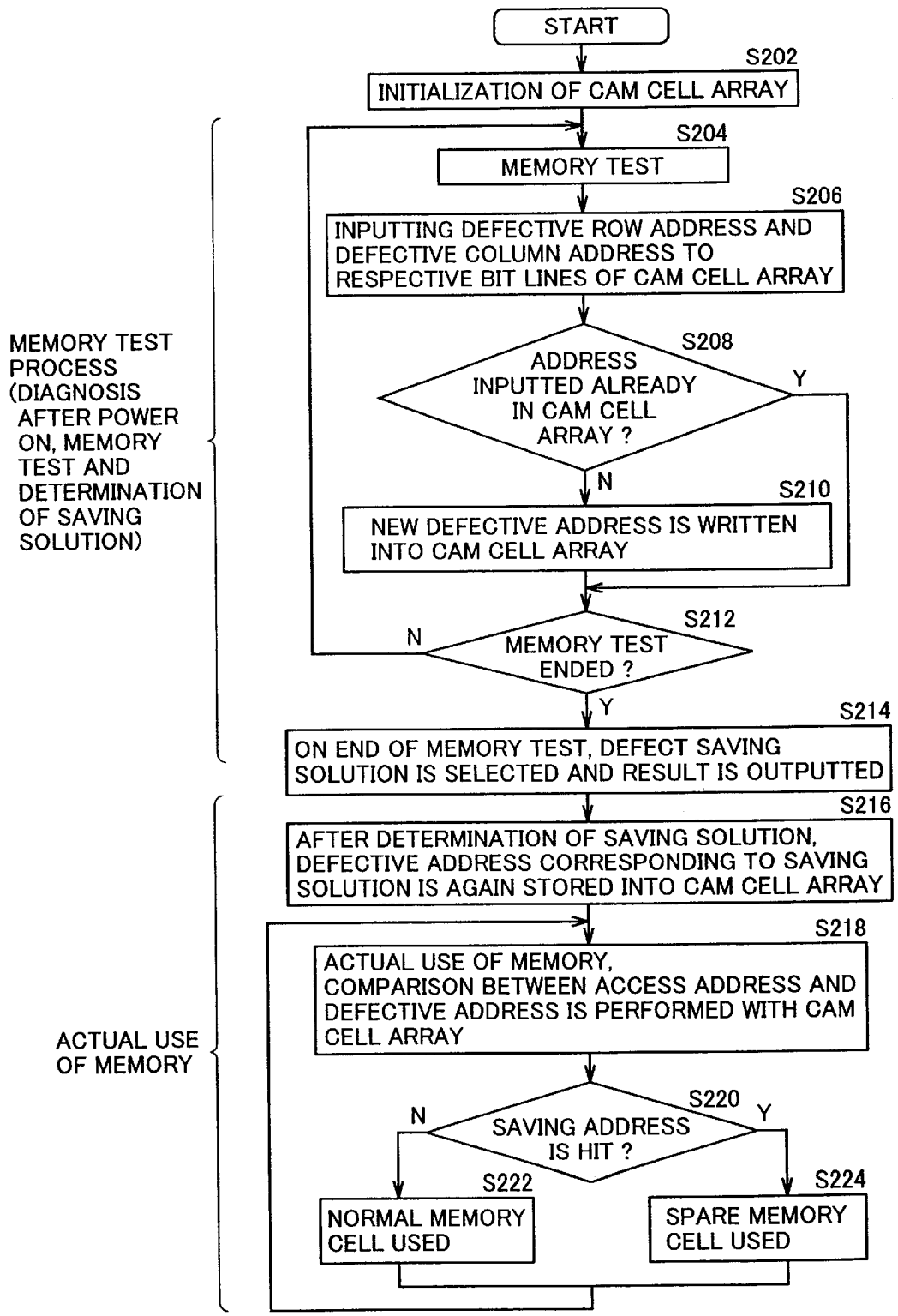
FIG. 40 is a flow chart showing another example test operation performing a built-in self-test.

FIG. 40 is a flow chart showing another example test operation performing a built-in self-test.

First of all, initialization of a CAM cell array is performed (step S202).

In parallel to execution of a memory test (step S204), a defective row address and a defective column address are inputted onto respective bit lines of the CAM cell array (step S206).

In a case of an address that has been stored in the CAM cell array (step S208), no processing is performed, while in a case of an address that has not been stored in the CAM cell array (step S208), a new defective address is written into the CAM cell array (step S210). Such a test is repeated till the memory test ends (step S212).

When the memory test ends, a defect saving solution is selected and a result is outputted (step S214).

Then, when a memory is put into actual use, a memory access is switched over to spare/normal cell according to information on a saving solution.

To be concrete, after a built-in redundancy analysis ends, a defective address corresponding to the saving solution is again stored into the CAM cell array (step S216).

In such a state, the process enters an actual use of a memory in the ordinary operation and comparison coincidence between an access address and a defective address is performed on a CAM cell array of built-in redundancy analysis circuit 400 (step S218). If a saving address is hit (step S220), then a corresponding spare memory cell is accessed (step S224). If a saving address is not hit (step S220), a memory access is performed at the access address without any change in procedure (step S222).

With such an operation performed, a CAM cell array provided for address comparison coincidence can be utilized as a program memory for performing redundancy saving; therefore, a chip area can be further reduced.

Fifth Embodiment

In the first to fourth embodiments described above, it is assumed that the circuit configuration shown in FIGS. 12 and 13 is used in order that a mask operation is performed on a determined address bit pair CBL1 and /CBL1 in a CAM cell array.

In the fifth embodiment, description will be given of another circuit configuration enabling such a mask operation.

Figure 41:
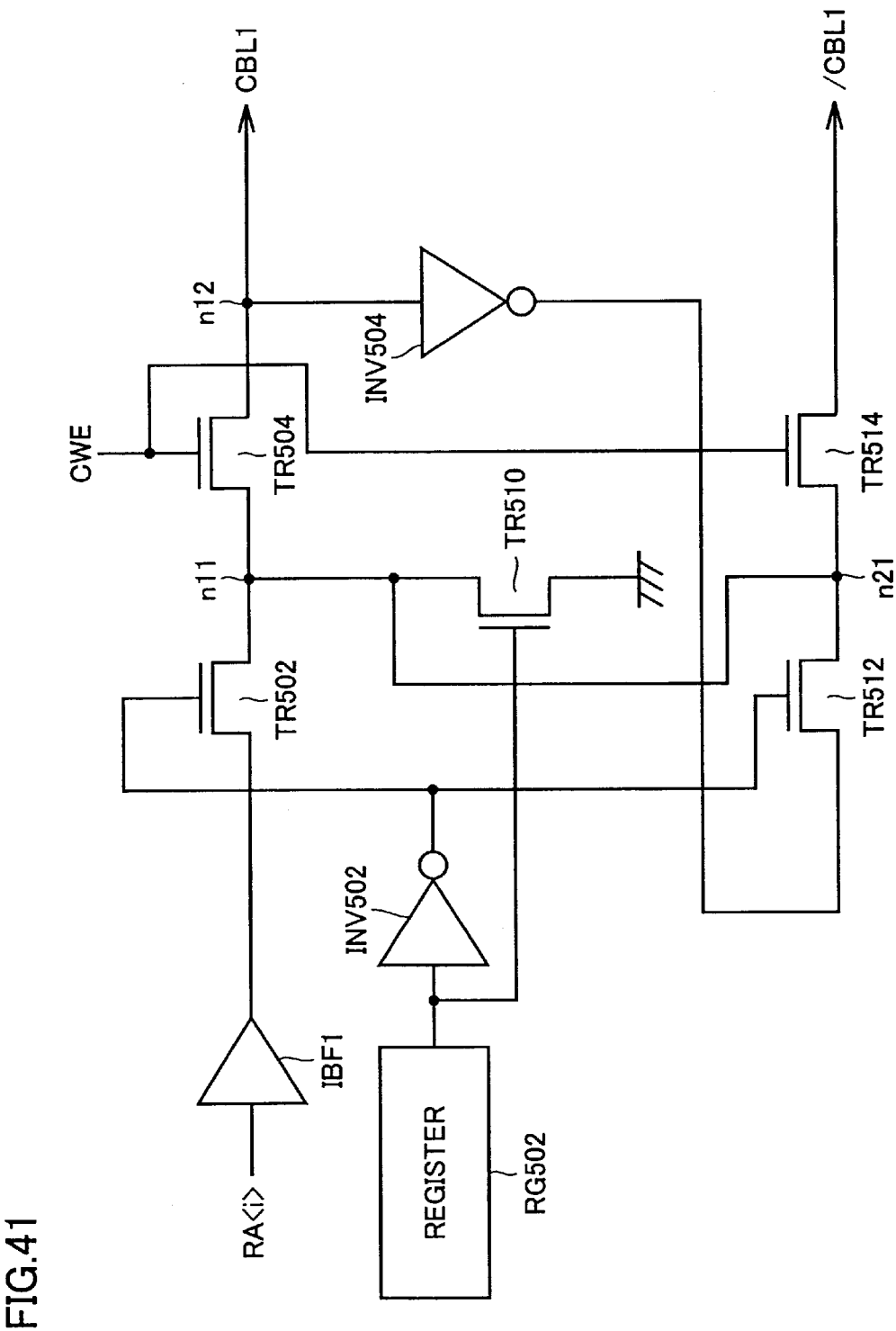
FIG. 41 is-circuit diagram for describing another configuration included in driver/sense amplifier section 4020V in bit line driver+S/A circuit 4020.

FIG. 41 is, for example, a circuit diagram for describing another circuit configuration included in a driver/sense amplifier section 4020V in bit line driver+S/A circuit 4020 of the first embodiment shown in FIG. 1 and amplifying data from CAM cell array 4000 read out onto corresponding bit line pair CBL1 and /CBL1 to output the data as a read address in an operation in which potential levels of a corresponding bit line pair CBL1 and /CBL1 in CAM cell array 4000 are driven. This circuit can be applied to a semiconductor integrated circuit device of another embodiment.

Referring to FIG. 41, input buffer IBF1 receives a column address signal RA <i> to output a result of buffering. An N channel MOS transistor TR502 is provided between input buffer IBF1 and an internal node n1. An N channel MOS transistor TR504 is provided between internal node n11 and a node N12. The gate of transistor T504 receives signal CWE for controlling write timing of data from command decoder 4010. Node n12 is coupled with address bit line CBL1.

On the other hand, an inverter INV504 receives a potential level of node n12 at the input thereof to invert and output the potential level. An N channel MOS transistor TR512 is provided between an output node of inverter INV504 and an internal node n21. An N channel MOS transistor TR514 is provided between internal node n21 and address bit line /CBL1. The gate of transistor TR514 also receives control signal CWE.

A register circuit RG502 is set so as to output "H" level when performing a mask operation for address bit lines CBL1 and /CBL1 according to an instruction from command decoder 4010, while being set so as to output "L" level when not performing the mask operation.

A transistor TR510 is provided between node n11 and ground potential and the gate of transistor TR510 receives an output of register RG502. Node n11 and node n21 are coupled with each other. Furthermore, the gates of transistors TR502 and TR512 both receive an output of inverter INV502.

Note that in FIG. 41, sense amplifier S/A, which is shown in FIG. 12, is not shown.

Similar configurations are provided to other bit line pairs in driver/sense amplifier section 4020V. Similar configurations are provided in driver/sense amplifier section 4030V as well.

In a case where a mask operation is instructed according to a setting value of register RG502, levels of address bit lines CBL1 and /CBL1 are fixed at "L" level. Hence, transistors T11 and T14 enter a cut-off state regardless of a value of data stored in the CAM cell shown in FIG. 8. Therefore, a level on coincidence detection line ML has no chance to fall from "H" level of a precharge level due to discharge according to a particular bit line pair on which a mask operation is instructed. Accordingly, there also arises an effect that power consumption is reduced by instruction of a mask operation on a particular bit line pair of a CAM cell.

Figure 42:
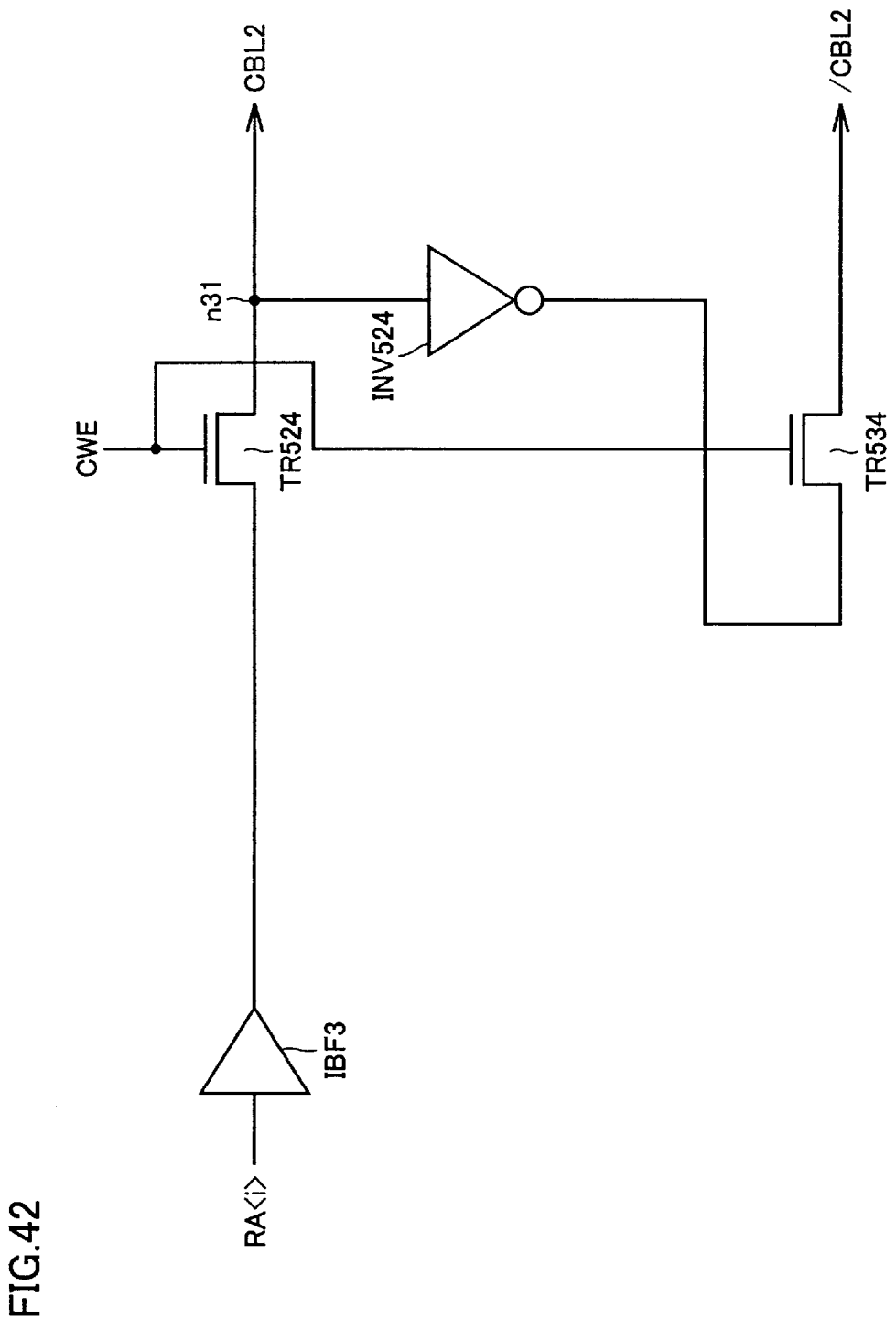
FIG. 42 is a circuit diagram for describing another circuit configuration included in driver/sense amplifier section 4020F in bit line driver+S/A circuit 4020.
Figure 43:
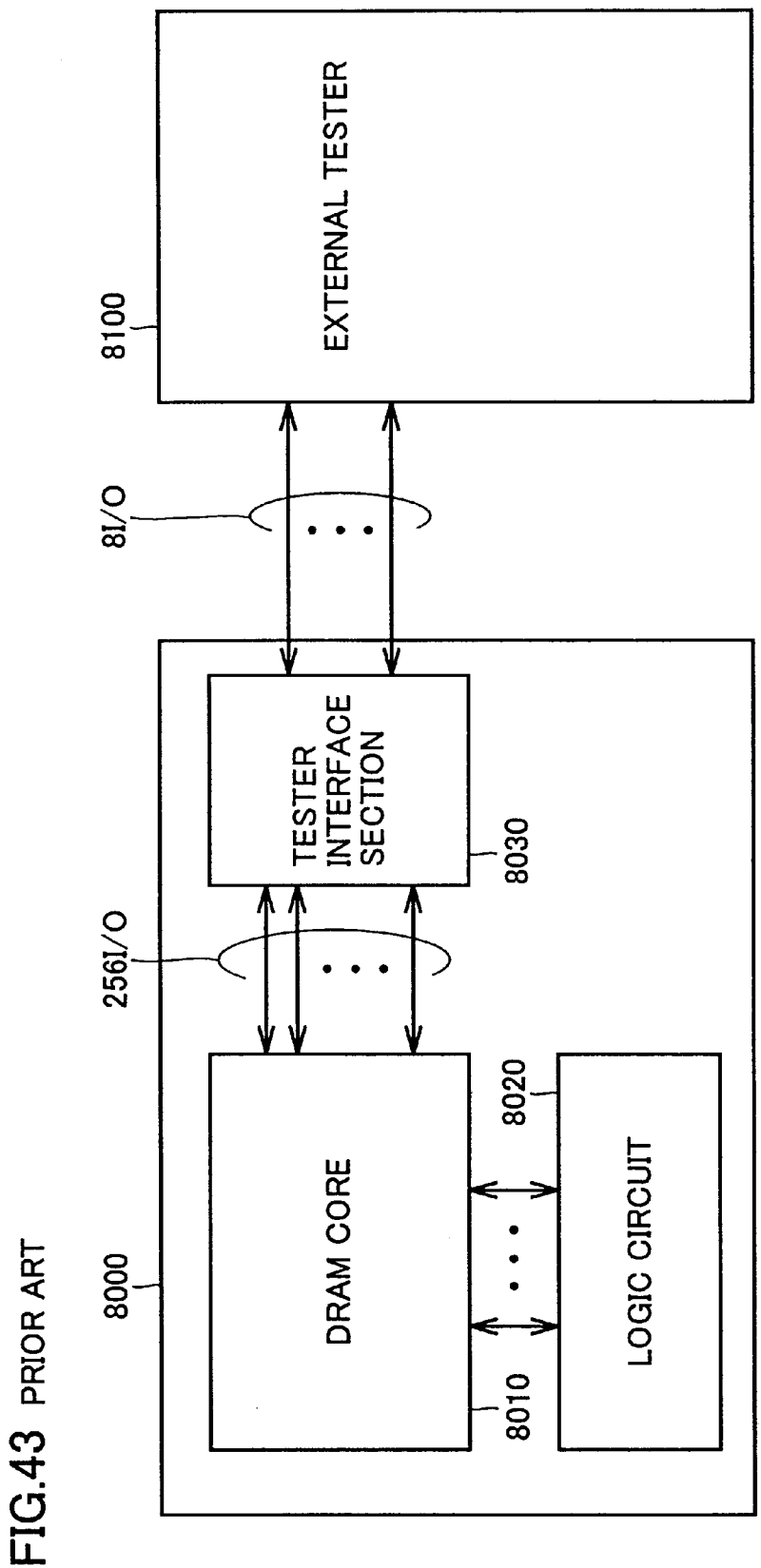
FIG. 43 is a schematic block diagram for describing a test operation on a semiconductor integrated circuit device 8000 integrated with a DRAM core 8010 and a logic circuit 8020.
Figure 44:
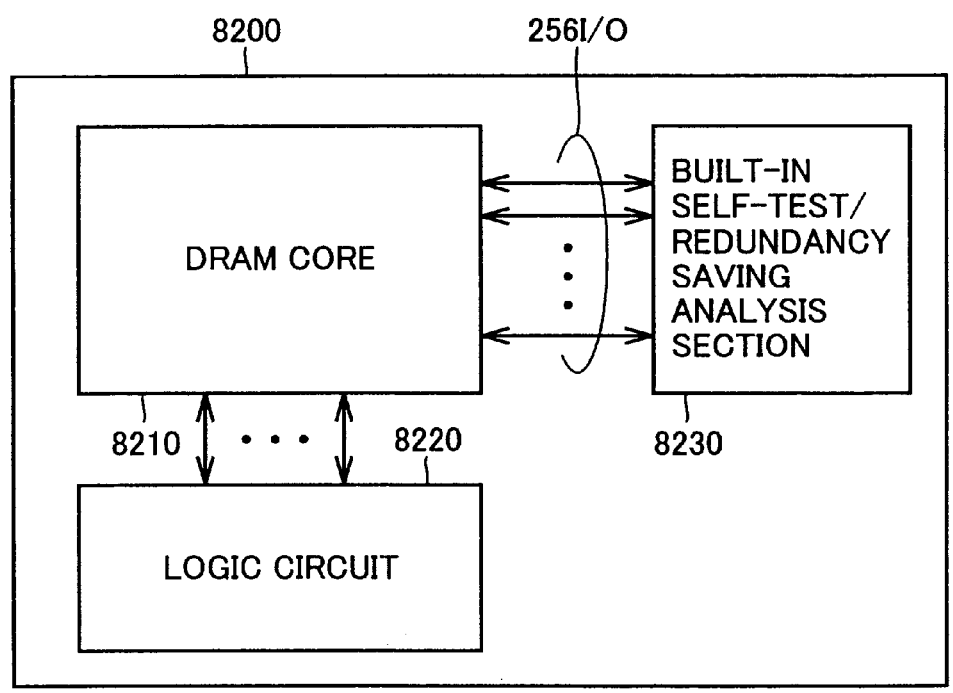
FIG. 44 is a schematic block diagram for describing a configuration of a semiconductor integrated circuit device 8200 integrated with a built-in self-test/redundancy saving analysis section 8230.
Figure 45:
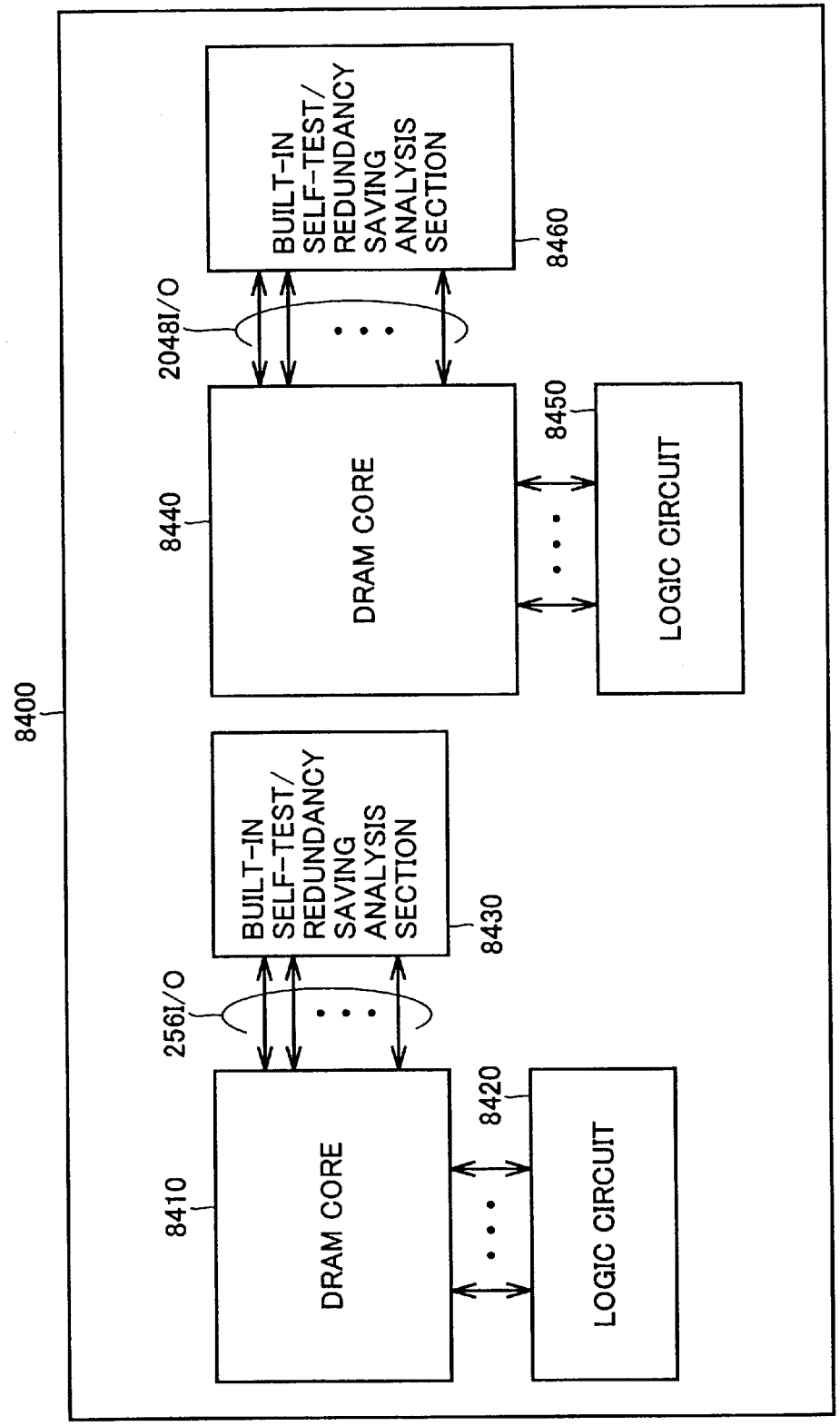
FIG. 45 is a schematic block diagram for describing a configuration of a semiconductor integrated circuit device 8400 integrated with plural DRAM cores on one chip.

FIG. 42 is a schematic block diagram for describing a circuit configuration provided corresponding to the circuit shown in FIG. 41, included in driver/sense amplifier section 4020F in the configuration shown in FIG. 11 and for driving potential levels of corresponding bit line pairs CBL2 and /CBL2 of CAM cell array 4000 to amplify and output read data from the corresponding bit line pair.

Referring to FIG. 42, an input buffer IBF3 receives a column address signal RA <i> to output a result of buffering. An N channel MOS transistor TR524 is provided between input buffer IBF1 and an internal node n31. The gate of transistor TR524 receives control signal CWE. Node n31 is coupled with address bit line CBL2.

On the other hand, an inverter INV524 receives a potential level on node n31 at the input thereof to invert and output the inverted potential level. An N channel MOS transistor TR534 is provided between an output node of inverter INV524 and address bit line /CBL2. The gate of transistor TR534 also receives control signal CWE.

With such a configuration as well, there can be exerted an effect similar to that of the circuit shown in FIGS. 12 and 13.

Note that while in the above description, it is plural DRAM cores that are mounted on the same chip, the present invention is not limited to this configuration, but can be adapted to a semiconductor integrated circuit device and the like in which in a more general sense, plural semiconductor memory circuits are mounted on the same chip, redundant memory cell rows and redundant memory cell columns are provided in each semiconductor memory circuit and saving of a defective bit can be performed by redundancy replacement.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device, comprising:

a plurality of memory circuits, each including a normal memory cell array having a plurality of normal memory cells, a spare memory cell array having a plurality of spare memory cell rows and a plurality of spare memory cell columns; and a redundancy replacement test circuit, provided commonly to said plurality of memory circuits in order to determine a defective address to be repaired by replacement, said redundancy replacement test circuit including a self-test circuit generating addresses signal for sequentially selecting memory cells to detect a defective memory cell based on results of comparison between data read out from said memory cells and expected value data, and a redundancy analysis circuit determining a defective address at which replacement is to be performed with one of said spare memory cell rows and said spare memory cell columns according to an address signal from said self-test circuit and a detection result on said defective memory cell, said redundancy analysis circuit having an address storage circuit for storing a defective address corresponding to said defective memory cell, said address storage circuit selectively storing a defective address different from any of already stored detective row addresses and defective column addresses among sequentially detected defective addresses, a drive circuit for limiting an effective memory space of said address storage circuit according to a capacity of a memory circuit to be tested among said plurality of memory circuits and performing data storage into said address storage circuit, and a determination circuit determining which of said spare memory cell rows and said spare memory columns the defective cell is replaced with according to said defective address stored in said address storage circuit.

2. The semiconductor integrated circuit device according to claim 1, wherein said address storage circuit comprises a plurality of CAM cells arranged in matrix.

3. The semiconductor integrated circuit device according to claim 2, wherein said determination circuit comprises a plurality of replacement determination sections provided correspondingly to respective sequences of replacement steps, each of said sequences of replacement steps corresponding to a sequence in which defective memory cell rows and defective memory cell columns are sequentially replaced with spare memory cell rows and spare memory cell columns in the memory circuit including the maximum number of spare memory cell rows and spare memory cell columns among said plurality of memory circuits, each of said plurality of replacement determination sections having a replacement sequence determination circuit for determining whether repair of defective memory cells is completed before reaching a final step among said sequence of replacement steps, and a determination step limit circuit for selectively setting one of said replacement steps as said final step according to the number of said spare memory cell rows and said spare memory cell columns belonging to the memory circuit to be tested among said plurality of memory circuits.

4. The semiconductor integrated circuit device according to claim 1; wherein the maximum number of spare memory rows in said plurality of memory circuits is m (m is a natural number), the maximum number of spare memory columns in said plurality of memory circuits is n (n is a natural number), said determination circuit includes a plurality of replacement determination sections provided correspondingly to respective sequences of replacement steps, each of said sequences of replacement steps corresponding to a sequence in which defective memory cell rows and defective memory cell columns are sequentially replaced with said m spare memory cell rows and said n spare memory cell columns, and said address storage circuit includes first storage cell columns, provided correspondingly to each of said replacement determination sections, capable of storing m defective row addresses of said defective addresses, and second storage cell columns, provided correspondingly to each of said replacement determination sections, capable of storing n defective column addresses of said defective addresses, and wherein each of said replacement determination sections selectively activates one of said first storage cell columns and said second storage cell columns according to a corresponding one of said sequences of replacement steps when both row address and column address of a newly detected defective memory cell is different from any of already stored defective row addresses and defective column addresses.

5. The semiconductor integrated circuit device according to claim 4, wherein each of said first storage cell columns and said second storage cell columns includes a plurality of CAM cells.

6. The semiconductor integrated circuit device according to claim 5, wherein said drive circuit comprises:
a plurality of first bit line pairs, provided commonly to said plurality of first storage cell columns, for transmitting said defective row address;
a first bit line drive circuit capable of selectively transmitting said defective row address to some of said first bit line pairs respectively corresponding to bits of said defective row address depending on a capacity of said memory circuit to be tested, while transmitting a fixed potential level to the rest of said first bit line pairs;
a plurality of second bit line pairs, provided commonly to said plurality of storage cell columns, for transmitting said defective column address; and
a second bit line drive circuit capable of selectively transmitting said defective column address to some of said second bit line pairs respectively corresponding to bits of said defective column address depending on the capacity of said memory circuit to be tested, while transmitting a fixed potential level to the rest of said second bit line pairs.

7. The semiconductor integrated circuit device according to claim 5, wherein each of said plurality of replacement determination sections includes
a plurality of logic gates, provided respectively to said replacement steps, and respectively outputting a plurality of activation signals for activating write operations onto said first storage cell columns and said second storage columns according to a corresponding one of said sequences of replacement steps when both row address and column address of the newly detected defective memory cell is different from any of already stored defective row addresses and defective column addresses; and
a determination step limit circuit for selectively setting one of said plurality of activation signals as a signal indicating a final step according to the number of said spare memory cell rows and said spare memory cell columns belonging to the memory circuit to be tested among said plurality of memory circuits.

8. The semiconductor integrated circuit device according to claim 1, further comprising a plurality of select circuits provided respectively to said plurality of memory circuits and connected in series to each other,
wherein write data is transmitted from said self-test circuit to the memory circuit to be tested among said plurality of memory circuits by a shifting operation sequentially passing through said plurality of select circuits.

9. The semiconductor integrated circuit device according to claim 1, further comprising a plurality of select circuits provided respectively to said plurality of memory circuits and connected in series to each other,
wherein read data is transmitted from the memory circuit to be tested among said plurality of memory circuits to said self-test circuit by a shifting operation sequentially passing through said plurality of select circuits.

10. The semiconductor integrated circuit device according to claim 1, further comprising a plurality of select circuits provided respectively to said plurality of memory circuits and connected in series to each other; and
a plurality of logic circuits provided respectively to said plurality of memory circuits,
wherein in a test operation, supplying/receiving of data between said self-test circuit and the memory circuit to be tested among said plurality of memory circuits is performed by a shift operation sequentially passing data through said plurality of select circuits, while in an ordinary operation, supplying/receiving of data between said plurality of logic circuits and said plurality of memory circuits is performed through each of said plurality of select circuits.

11. The semiconductor integrated circuit device according to claim 1, wherein said redundancy replacement test circuit further includes a first internal address generation circuit for generating an internal address for a test operation depending on a capacity of the memory cell array of the memory circuit to be tested among said plurality of memory circuits, and
wherein each of said memory circuits further includes a second internal address generation circuit generating an internal address for a test operation on said memory circuit in synchronism with said first internal address generation circuit based on an initial value given from said redundancy replacement test circuit.

12. The semiconductor integrated circuit device according to claim 1, wherein said address storage circuit has
a CAM cell array including a plurality of CAM cells arranged in a matrix, wherein
said CAM cell array further includes
a plurality of word lines provided correspondingly to respective rows of said CAM cell array and
a plurality of coincidence detection lines provided correspondingly to respective rows of said CAM cell array, and
said CAM cell array is divided into first and second CAM cell arrays obtained by dividing along a direction of said plurality of word lines,
said first CAM cell array including a plurality of first bit line pairs, provided correspondingly to respective columns of said first CAM cell array, and for transmitting said defective row address, and
said second CAM cell array including a plurality of second bit line pairs, provided correspondingly to respective columns of said second CAM cell array, and for transmitting said defective row address.

13. The semiconductor integrated circuit device according to claim 1, wherein said address storage circuit includes
a CAM cell array having a plurality of CAM cells arranged in a matrix, wherein
said CAM cell array is divided into first and second CAM cell arrays obtained by dividing along a column direction,
said first CAM cell array has
a plurality of first word lines provided correspondingly to respective rows of said first CAM cell array, a plurality of first coincidence detection lines provided correspondingly to respective rows of said first CAM cell array, and a plurality of first bit line pairs, provided correspondingly to respective columns of said first CAM cell array, and for transmitting said defective row address; and said second CAM cell array has a plurality of second word lines provided correspondingly to respective rows of said second CAM cell array, a plurality of second coincidence detection lines provided correspondingly to respective rows of said second CAM cell array, and a plurality of second bit line pairs, provided correspondingly to respective columns of said second CAM cell array, and for transmitting said defective row address.

14. The semiconductor integrated circuit device according to claim 1, wherein said address storage circuit includes a CAM cell array including a plurality of CAM cells arranged in a matrix, wherein said CAM cell array further includes a plurality of word lines provided correspondingly to respective rows of said CAM cell array, a plurality of first coincidence detection lines provided correspondingly to respective rows of said CAM cell array a plurality of second coincidence detection lines provided correspondingly to respective rows of said CAM cell array, a plurality of bit line pairs, provided correspondingly to respective columns of said CAM cell array, and for transmitting said defective row address and said defective column address, and coincidence detection means controlling such that one of said plurality of first coincidence lines is used in a case where said defective row address stored already in said plurality of CAM cells and a newly detected defective row address are compared with each other, while one of said plurality of second coincidence lines is used in a case where said defective column address stored already in said plurality of CAM cells and a newly detected defective column address are compared with each other.

15. The semiconductor integrated circuit device according to claim 1, wherein said address storage circuit comprises:

a CAM cell array including a plurality of CAM cells arranged in a matrix, wherein said CAM cell array further includes a plurality of word lines provided correspondingly to respective rows of said CAM cell array, a plurality of coincidence detection lines provided correspondingly to respective rows of said CAM cell array, a plurality of bit line pairs, provided correspondingly to respective columns of said CAM cell array, and for transmitting said defective row address and said defective column address, and coincidence detection means controlling such that a process is performed in which said defective row address stored already in said plurality of CAM cells and a newly detected defective row address are compared with each other in a first cycle of a test operation, while a process is performed in which said defective column address stored already in said plurality of CAM cells and a newly detected defective column address are compared with each other in a second cycle of said test operation.

16. The semiconductor integrated circuit device according to claim 2, wherein said plurality of CAM cells store defective row addresses and defective column addresses to be repaired by replacement, and is used for comparison between an address accessed in said memory circuit and defective addresses stored in said plurality of CAM cells during an ordinary operation mode.

\* \* \* \* \*